United States Patent
Nishi

Patent Number: 6,151,102
Date of Patent: Nov. 21, 2000

[54] PROJECTION EXPOSURE APPARATUS

[75] Inventor: Kenji Nishi, Yokohama, Japan

[73] Assignee: Nikon Corporation, Tokyo, Japan

[21] Appl. No.: 09/425,938

[22] Filed: Oct. 25, 1999

Related U.S. Application Data

[63] Continuation of application No. 08/831,794, Apr. 9, 1997, abandoned.

[30] Foreign Application Priority Data

| Apr. 9, 1996 | [JP] | Japan | 8-111991 |
| Apr. 10, 1996 | [JP] | Japan | 8-113114 |
| Nov. 14, 1996 | [JP] | Japan | 8-302737 |

[51] Int. Cl.[7] .................................. G03B 27/52
[52] U.S. Cl. .................. 355/53; 355/55; 250/248; 356/401
[58] Field of Search .................. 355/53, 55; 250/548; 356/399, 400, 401

[56] References Cited

U.S. PATENT DOCUMENTS

| 4,650,983 | 3/1987 | Suwa | 250/204 |
| 4,711,567 | 12/1987 | Tanimoto | 355/53 |
| 5,241,188 | 8/1993 | Mizutani | 250/548 |
| 5,243,195 | 9/1993 | Nishi | 250/548 |
| 5,424,552 | 6/1995 | Tsuji et al. | 250/548 |
| 5,448,332 | 9/1995 | Sakakibara et al. | 355/53 |
| 5,646,413 | 7/1997 | Nishi | 250/548 |
| 5,646,840 | 7/1997 | Taniguchi | 355/55 |
| 6,078,380 | 6/2000 | Taniguchi et al. | 355/53 |

FOREIGN PATENT DOCUMENTS

| 60-168112 | 8/1985 | Japan . |
| 4-225357 | 8/1992 | Japan . |
| 5-021314 | 1/1993 | Japan . |
| 5-175100 | 7/1993 | Japan . |
| 6-283403 | 10/1994 | Japan . |
| 7-176468 | 7/1995 | Japan . |
| 8-083753 | 3/1996 | Japan . |
| 5-160003 | 6/1993 | WIPO . |

*Primary Examiner*—Alan A. Mathews
*Attorney, Agent, or Firm*—Morgan, Lewis & Bockius LLP

[57] ABSTRACT

Provided is a position detector for use in a projection exposure apparatus to detect a position of a focused image plane at which a focused image of a mask pattern is formed by a radiation flux through a projection optical system having an optical axis. The position detector includes a plurality of reference marks disposed in a first direction with predetermined spacings at a position at which the mask pattern is to be placed, the radiation flux illuminating the plurality of reference marks, and thereafter entering the projection optical system to form images of the plurality of reference marks in the focused image plane, the images being arranged in a second direction substantially perpendicular to the optical axis of the projection optical system, and spacings of the images being determined by the predetermined spacings of reference marks; a radiation receiver having a receiving area movable relative to the images of the reference marks to scan the plurality of images successively, the radiation receiver outputting a reception signal indicating the amount of the radiation flux received at the receiving area, the receiving area being smaller than the spacings separating the images of reference marks adjacent in the first direction; a position detector outputting a position signal indicating the position of the receiving area; and a calculation unit processing the reception signal and the position signal to derive the positions of the images of the reference marks.

34 Claims, 35 Drawing Sheets

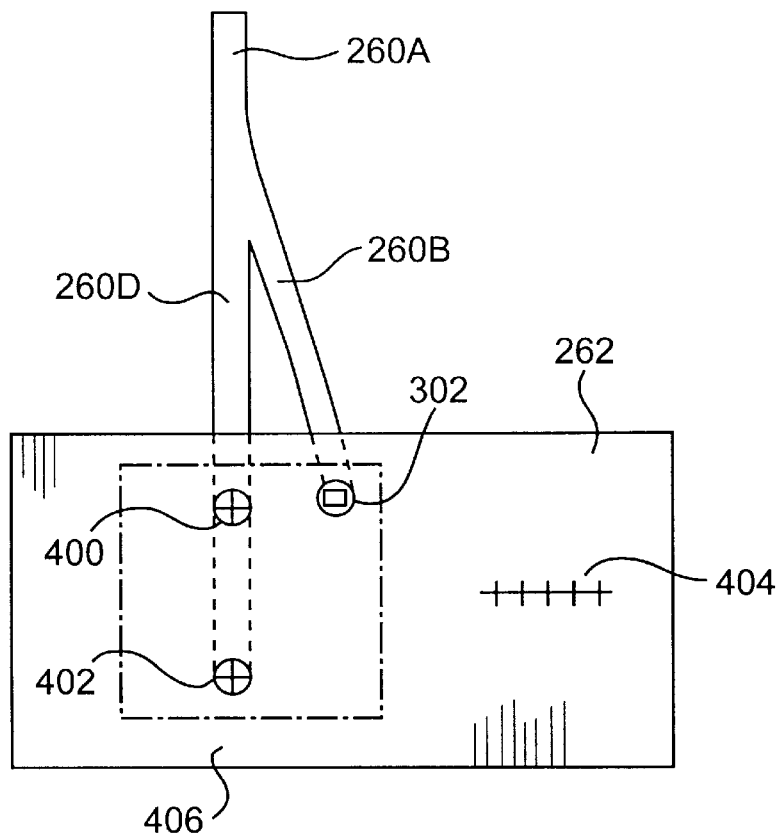
FIG. 16
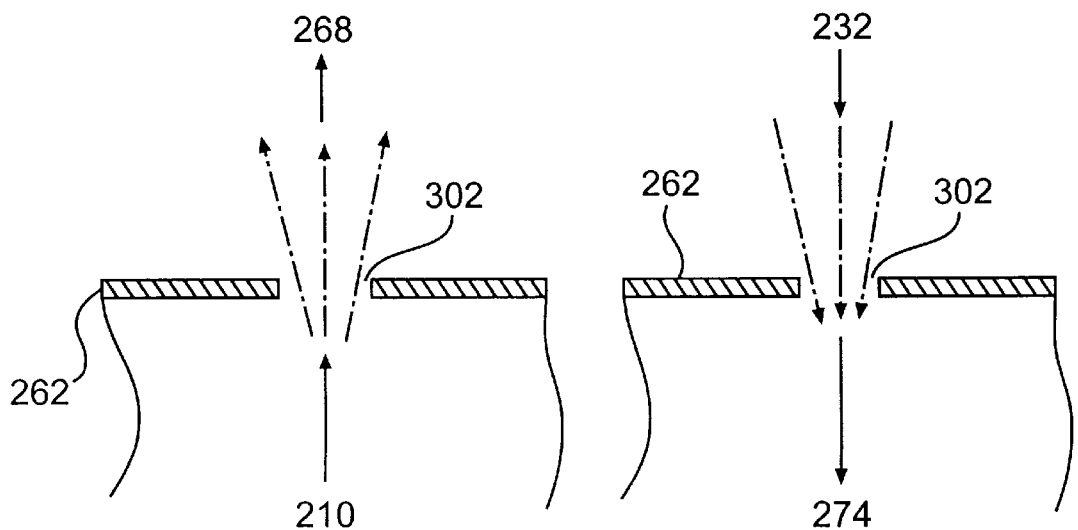
FIG. 17A  FIG. 17B

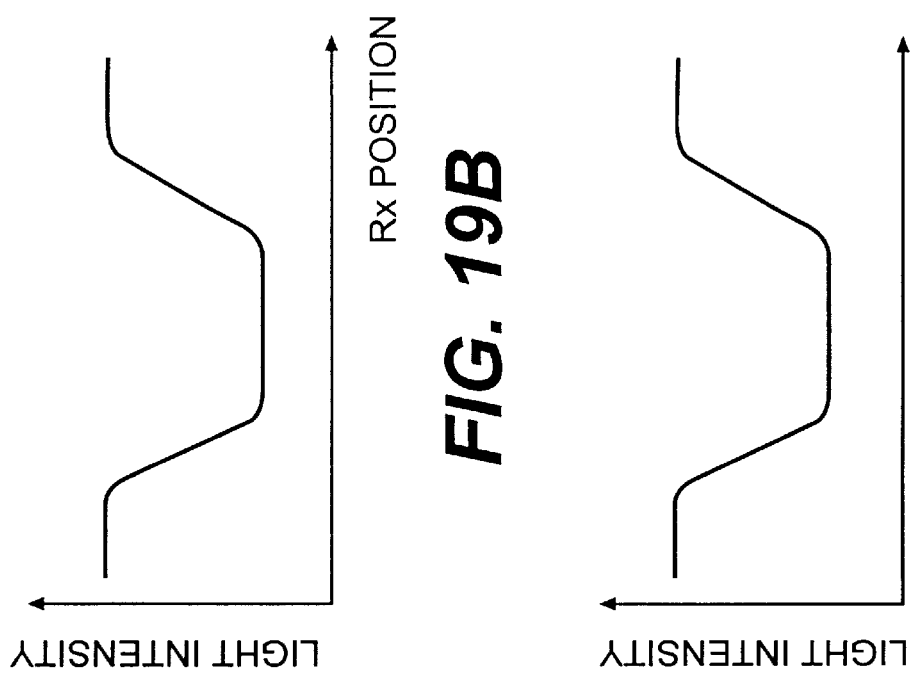
FIG. 19B
FIG. 19C
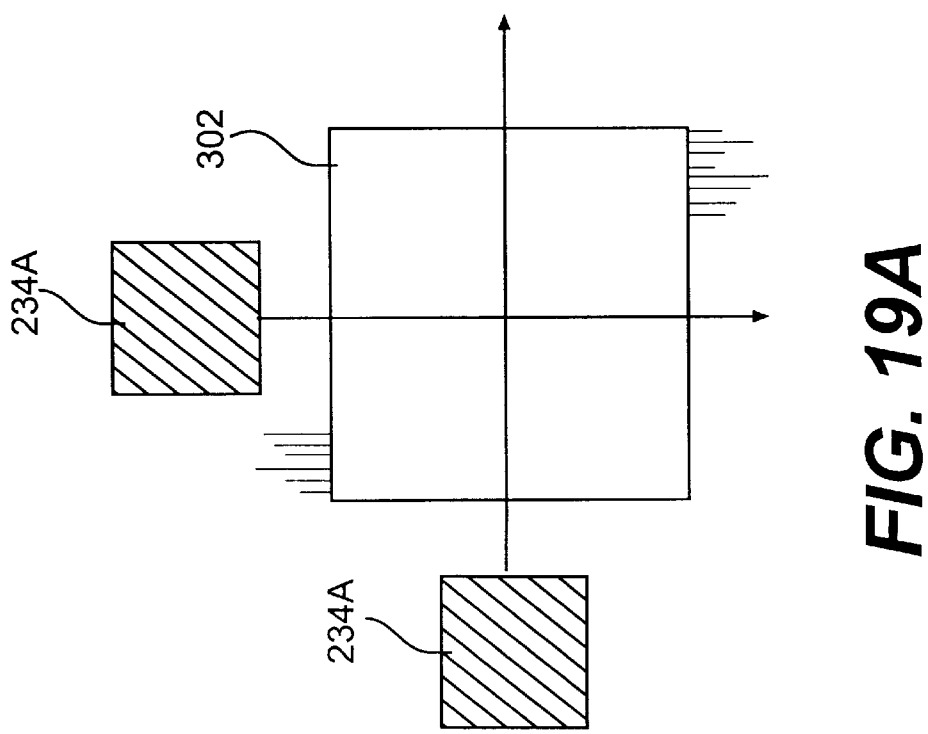
FIG. 19A

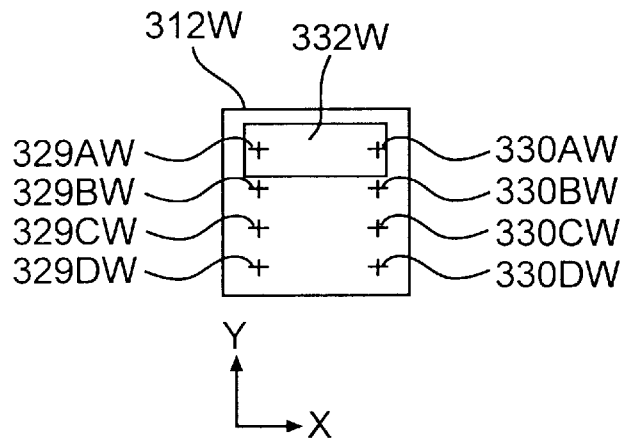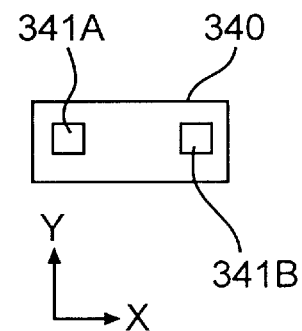
*FIG. 31A*   *FIG. 31B*
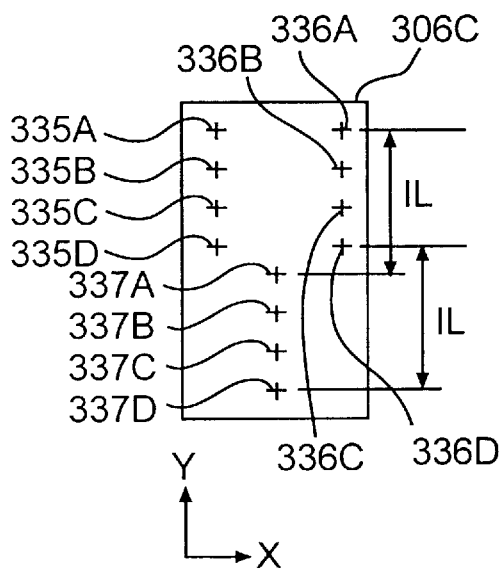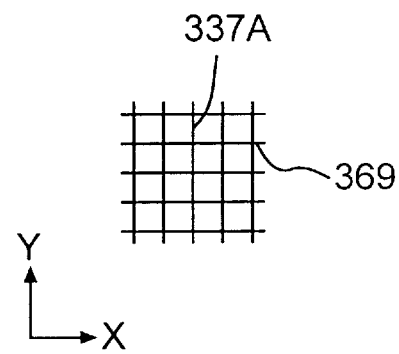
*FIG. 31C*
*FIG. 31D*

| 401 | RELATIVELY MOVE THE APERTURE PATTERN 341A, 341B AND THE IMAGE 329AW, 330AW OF THE ALIGNMENT MARK. SAMPLE THE OUTPUT DATA FROM THE SPATIAL IMAGE SENSOR. CALCULATE THE RELATIVE COORDINATES (xli,yli) AND STORE THE RESULT. |

| 402 | MOVE THE RETICLE ALIGNMENT SYSTEM 319,320 TO THE ALIGNMENT MARKS 329A, 330A. (MOVE THE GUIDE MIRRORS 315, 316.) WHILE DOWNWARD ILLUMINATION IS PERFORMED BY THE RETICLE ALIGNMENT SYSTEM 319, 320, MOVE THE STAGE SUCH THAT THE IMAGES OF THE APERTURES 341A, 341B ARE SUPERIMPOSED OVER THE ALIGNMENT MARKS 329A, 330A. SAMPLE THE OUTPUT DATA FROM THE IMAGE PROCESSING SYSTEM ON THE RETICLE ALIGNMENT SYSTEM 319, 320. CALCULATE THE RELATIVE COORDINATES (x2i, y2i) AND STORE THE RESULT. |

| 403 | CALCULATE THE RELATIVE COORDINATE DIFFERENCES S(=(x2i-xli,y2i-yli) WHERE (i=1,2) AND STORE THE RESULT. |

| 404 | MOVE THE FIDUCIAL MARKS 335A, 335B ON THE FIDUCIAL MARK PLATE INTO THE OBSERVATION FIELD OF VIEW 319W, 320W RESPECTIVELY. |

| 405 | THE RETICLE ALIGNMENT SYSTEM 319, 320 DETECT THE POSITIONAL DEVIATION OF THE TWO MARKS AND SUPPLY THE RESULTS TO THE MAIN CONTROLLER 22A. THE ALIGNMENT SENSOR 334 DETECTS THE COORDINATE OF THE FIDUCIAL MARK 337A AND SUPPLY THE RESULTS TO THE MAIN CONTROLLER 322A. |

| 406 | AS IS THE CASE IN THE SCANNING EXPOSURE OPERATION, MOVE THE Z-0 AXIAL DRIVING STAGE 304 AND THE RETICLE MICRO-DRIVING STAGE 311. THE RETICLE ALIGNMENT SYSTEM 319, 320 AND THE ALIGNMENT SENSOR 334 DETECTS THE CORRESPONDING MARKS SEQUENTIALLY. |

| 407 | CORRECT THE POSITIONAL DISPLACEMENT DETECTED BY THE RETICLE ALIGNMENT SYSTEM 319, 320 USING THE RELATIVE COORDINATE DIFFERENCE S. |

| 408 | OBTAIN THE SCALING Rx, Ry, THE ROTATION θ, THE ORTHOGANOALITY ERROR ω, AND OFFSET S, Ox, Oy, OF THE RETICLE STAGE COORDINATE SYSTEM (XR, YR) WITH RESPECT TO THE FIDUCIAL MARK PLATE COORDINATE SYSTEM (XS, YS), USING THE LEAST SQUARE TECHNIQUE. |

| 409 | CORRECT THE RETICLE STAGE COORDINATE SYSTEM (XR, YR) USING THE GIVEN ROTATION 0 AND THE SCALING RX, RY. |

| 410 | CALCULATE THE BASELINE LENGTH OF THE ALIGNMENT SENSOR 334 BY AVERAGING THE MEASUREMENT RESULTS. |

*FIG. 36*

PROJECTION EXPOSURE APPARATUS

This is a continuation of application(s) Ser. No. 08/831,794 filed on Apr. 9, 1997, now abandoned.

This application claims the benefit of Japanese Applications No. 08-111991, filed on Apr. 9, 1996, Ser. No. 08-113114, filed on Apr. 10, 1996, and Ser. No. 08-302737, filed on Nov. 14, 1996, all of which are hereby incorporated by reference.

BACKGROUND OF THE INVENTION

Field of the Invention

The present invention relates to an exposure apparatus, and more particularly, to a projection exposure apparatus used in manufacture of semiconductor devices (integrated circuit (IC), large-scale integration (LSI) circuits, or the like), image pick-up devices (CCD or the like), liquid crystal display devices, thin layer magnetic heads, or the like.

Discussion of the Related Art

In recent years, following advances in higher integration of semiconductor devices, finer mask patterning is increasingly becoming a necessity in a projection exposure apparatus. To cope with such high resolution, focusing accuracy in the image of the mask pattern formed via the projection optical system needs to be improved. In other words, it is necessary to position the exposure surface of the photosensitive circuit board within the depth of focus for the image formation surface of the projection optical system. Variety of methods have been proposed to meet this requirement. For example, by installing a sensor that measures the vertical position of a substrate stage (photosensitive substance) relative to the projection optical system, the exposure surface of the photosensitive substrate is matched with the focused image plane using the origin of the signal from the detection sensor as a reference. In this case, the focal point of the mask pattern image using a fiducial plate surface placed on the substrate stage is measured, and the origin of the signal from the sensor is set to this focusing point.

In the method described above, the origin in the sensor may deviate from the actual focal point of the projection optical system due to fluctuation in environment of the exposure unit, type of mask used, or fluctuation in the imaging characteristics of the projection optical system over time. Therefore, it is necessary to reset the origin of the sensor to calibrate the sensor every once in a while at regular intervals. An example of such calibration of the sensor is disclosed in Japanese Laid-Open Publication No. 05-160003. In this reference, light emitted from a mark on a fiducial plate on the substrate stage passes through a projection optical system, and is reflected at the mask surface. The reflected light returns to the fiducial plate, and is measured when it is received at the light-emitting portion. Then, the focusing condition of the fiducial plate substrate is derived based on the received light quantity.

In the method described above, the illumination system for alignment focal position measurement is different from that for exposure, i.e, focus measurement is carried out under different conditions from that for exposure, which may lead to measurement errors. Also, there is a limit in reducing manufacturing tolerance to the width of the mark on the fiducial plate. Therefore, it is almost impossible to perform the focus measurement using the minimum line width for the mask. (This is because the projection optical system for exposure is typically a reduction type. Thus, the manufacturing tolerance of the mask pattern is much larger than that of the fiducial mask pattern.) Therefore, when an L/S (line and space mark) formed on the fiducial plate is used as the mark, focusing errors may occur due to the difference between the minimum line width of an L/S mark on the mask and the minimum line width of the L/S mark on the fiducial board.

Referring to FIG. 25, the operation of a conventional exposure apparatus is explained. FIG. 25 is a schematic diagram of the conventional projection exposure apparatus.

When shutter 904 is opened by a shutter drive unit 902, light emitted from an illumination light source 900 progresses in the direction A in the figure and impinges on a mirror 906. The light deflected from the mirror 906 enters an illumination optical system 908 and is tuned to yield a uniform illumination field suitable for exposure. Then, the tuned light illuminates a reticle 910. The light, which passes through reticle 910, enters a projection lens 912 and is incident on a predetermined area of a wafer 916 on a wafer stage 914. This way, the image of the pattern formed on reticle 910 is projected and transferred onto the wafer 916.

In general, the above-mentioned projection exposure of the reticle pattern onto the wafer is repeatedly performed for multiple patterns. After processes of etching and film deposition, etc., ICs, LSIs, etc. are formed on the wafer. During such processes, the pattern that was projected onto the wafer in the previous process needs to be superimposed (aligned) with a reticle pattern for the next layer.

To perform such alignment, it is necessary to obtain a relationship between a coordinate system fixed on the reticle and a coordinates system fixed on the wafer. In this example above, the correspondence is obtained using a fiducial plate 918 placed on the wafer stage 914. A wafer alignment mark 920 formed on the fiducial plate 918 and a reticle mark 922 formed on the reticle 910 are observed at the same time to determine the positional relationship.

In more detail, when the shutter drive unit 902 closes the shutter 904, light reflected from a metal surface of the shutter 904 progresses in the direction B in the figure and enters a split mirror 926 of an alignment optical system 924. Then, the light reflected by the split mirror 926 illuminates the reticle mark 922, passes through the projection lens 912, and illuminates the fiducial mark 920 as shown in the figure. This light, carrying information of the alignment marks, is reflected by the fiducial plate 918 and goes back along its incoming path, and enters the split mirror 926, again. Then, the light that passes through the split mirror 926 reaches a two-dimensional image sensor 928 to image the marks 920 and 922 on the image sensor 928. The image of each alignment mark captured by the image sensor 928 is input into an image-processor 930, and are analyzed to derive the relative positional difference between the reticle 910 and the wafer stage 914. Such positional difference need be taken into account when moving the wafer stage 914 to align the existing pattern on the wafer 916 with the pattern of the reticle 910 being projected is conducted.

As mentioned above, in the exposure apparatus, the illumination condition of the exposure optical system and that of the alignment optical system are not necessarily consistent with each other. To exposure finer patterns (finer line width), which is becoming popular in recent years, various improvement have been introduced in an exposure apparatus: reducing the wavelength $\lambda$ of illumination light, increasing the numerical aperture NA of the projection lens, using a modified illumination technique, etc. With respect to the illumination wavelength $\lambda$, the illumination condition of the exposure optical system and that of the alignment optical system can be made equivalent by relaying light from a single light source by a separate optical system. However, to achieve other methods such as increasing numerical aperture, it is necessary to build a large, complicated alignment illumination system, which is, however, not practical. Therefore, it is difficult to obtain the same illumination conditions between exposure and alignment.

To overcome such difficulties, a method of receiving the actual exposure light in a slit sensor located on the wafer stage has been developed. Although it is possible to match the illumination conditions between exposure and alignment with this technique, this method has a disadvantage in that it is not applicable to a high speed alignment operation using an RA (reticle alignment) image processing system, which is disclosed in Japanese Laid-Open publication No. 05-21314. Furthermore, when signals are obtained by integrating the amount of light passing through a light using slit measurement, this method is not suitable for measuring the width of the L/S (line and space) mark near maximum resolution.

Some of the problems discussed above and additional problems in the conventional art will be described in more detail below. Manufacture of semiconductor devices and the like employs a projection exposure apparatus (e.g. a stepper) in which a reticle (mask) pattern is transferred via a projection optical system onto each shot region on a wafer (or a glass plate and the like) coated with photoresist. For example, semiconductor devices are fabricated by overlaying a plurality of circuit patterns on a wafer in a predetermined positional relationship. When superimposing a circuit pattern on the existing pattern on the wafer, highly accurate alignment between the reticle pattern to be exposed and the existing circuit pattern in each shot region is required.

Such an alignment is disclosed for example in Japanese Laid-Open Publication No. 07-176468. In this alignment method, first, the positional deviation of an alignment mark on the wafer from a fiducial mark on a fiducial mark plate fixed to a wafer stage is detected through an alignment sensor on the reticle side. Then, the reticle is aligned with the wafer stage. In this method, a so-called stage emitting technique is used. In this technique, the fiducial mark for reticle alignment is illuminated by an illumination light having the same wavelength as that of the exposing light from the bottom of the fiducial mark plate to transmit the light from the fiducial mark. The alignment system at the reticle side then detects this illumination light that passes through the alignment mark on the reticle to derive the position of the reticle relative to the wafer stage.

Next, calibration of an off-axis wafer alignment sensor is conducted. The off-axis wafer alignment sensor is installed in the exposure apparatus for detecting a wafer alignment mark (wafer mark) on the wafer to align the wafer with the reticle. First, the position of another fiducial mark on the fiducial mark plate is detected by the off-axis wafer alignment sensor. Then a positional relationship between the detection center of the off-axis wafer alignment sensor (the center of the measurement field of the sensor) and the center of the projected image of the reticle pattern (exposure center) is derived. This step is called a baseline check, and a length between the detection center and the exposure center is called a baseline length. The thus detected baseline length is stored in the exposure apparatus and used in aligning the center of each shot region with the exposure center with high accuracy.

In general, the wafer stage coordinate system in a projection exposure apparatus is measured by mobile mirrors fixed to the wafer stage and external laser interferometers. Any changes in the positional relationship between the mobile mirror and the fiducial mark plate affect the baseline length, generating alignment errors. These changes may occur due to thermal deformation or the like caused by heat from exposing light during exposure,. For this reason, the fiducial mark plate and the mobile mirror were arranged close to each other on the wafer stage and it was believed that the change in this positional relationship was negligible. Based on this belief, during wafer replacement operation, for example, the reticle alignment and the baseline check have been performed quickly and almost simultaneously using the fiducial marks on the fiducial mark plate without drastically moving the wafer stage.

As described above, in a conventional projection exposure apparatus, the reticle alignment, etc., is performed based on the assumption that the positional relationship between the fiducial mark plate and the mobile mirrors does not change. However, because of the recent miniaturization of the device pattern, a higher accuracy is required for alignment. If the positional relationship between the fiducial mark plate and the mobile mirror changes due to a small change in temperature of the wafer stage caused by radiation heat, etc., for the exposing light, alignment error exceeding the tolerance may occur.

Suppose that the mobile mirror and the fiducial mark plate are supported by a ceramic member of low expansion coefficient and the fiducial mark plate is made of quartz, The linear expansion coefficient of ceramic and quartz is about 0.5–1.0 ppm /° C. Then, if the baseline length for the alignment sensor is about 60 mm and the change in temperature of the wafer stage is about 0.2° C., the distance between the mobile mirror and the fiducial mark plate changes by about 6 to 12 nm, and at the same time, the angle between the mobile mirror and the fiducial mark plate may change. Recently, even this much deviation in length and angle may impose a serious hindrance for the alignment accuracy required. For this reason, it is critical that the reticle alignment and the baseline check be conducted with even higher accuracy.

In the above mentioned stage emitting technique, that is, a technique in which a fiducial mark is illuminated from the bottom surface of the fiducial mark plate on the wafer stage, the wafer stage mechanism required for the technique is complex and large sized. The illumination light having the same wavelength as that of the exposing light can be used in the stage emitting technique. However, in the stage emitting technique, the illumination condition such as a numerical aperture and the like is fixed and cannot be changed easily.

Recently, the following techniques are used to improve the resolution of exposure: changing the numerical aperture of the projection optical system; changing the σ value, the coherent factor of the illumination optical system; or using so-called an annular illumination technique, modified illumination technique, or the like. In general, the distortion of the projection image depends on aberration and the telecentric condition of the illumination optical system for exposure. When the techniques described above are used, the image distortion may vary depending on which technique is used. Therefore, the position of the projected image of the reticle pattern (and the reticle alignment mark) on the wafer may change in accordance with the technique used for exposure. This in turn affects the accuracy of the above-mentioned stage emitting technique, degrading the alignment accuracy when these technique are used. Also, the illumination condition in the stage emitting technique cannot easily be matched with the illumination condition for exposure, because it requires a complex, large mechanism.

SUMMARY OF THE INVENTION

Accordingly, the present invention is directed to an exposure apparatus that substantially obviates the problems due to limitations and disadvantages of the related art.

An object of the present invention is to provide a projection exposure apparatus capable of performing highly accurate focused image position measurement.

Another object of the present invention is to provide a projection exposure apparatus capable of performing highly accurate alignment between a mask and a photosensitive substrate.

Another object of the present invention is to provide a projection exposure apparatus capable of performing high speed, highly accurate baseline measurement.

Another object of the present invention is to provide a projection exposure apparatus capable of performing highly accurate alignment between a mask and a photosensitive substrate for various exposure conditions.

A further object of the present invention is to provide a projection exposure apparatus capable of performing high speed, highly accurate baseline measurement for various exposure conditions.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a position detector for use in a projection exposure apparatus to detect a position of a focused image plane at which a focused image of a mask pattern is formed by a radiation flux through a projection optical system having an optical axis, the position detector including a plurality of reference marks disposed in a first direction with predetermined spacings at a position at which the mask pattern is to be placed, the radiation flux illuminating the plurality of reference marks, and thereafter entering the projection optical system to form images of the plurality of reference marks in the focused image plane, the images being arranged in a second direction substantially perpendicular to the optical axis of the projection optical system, and spacings of the images being determined by the predetermined spacings of reference marks; a radiation receiver having a receiving area movable relative to the images of the reference marks to scan the plurality of images successively, the radiation receiver outputting a reception signal indicating the amount of the radiation flux received at the receiving area, the receiving area being smaller than the spacings separating the images of reference marks adjacent in the first direction; a position detector outputting a position signal indicating the position of the receiving area; and a calculation unit processing the reception signal and the position signal to derive the positions of the images of the reference marks.

In another aspect, the present invention provides a projection exposure apparatus for exposing a pattern on a mask onto a substrate, the projection exposure apparatus including a movable mask stage for holding the mask; an illumination optical system directing an exposing radiation flux toward the mask on the movable mask stage to illuminate a plurality of reference marks formed on the mask, the plurality of reference marks being disposed in a first direction with predetermined spacings; an projection optical system receiving the radiation flux that passes through the reference marks to form images of the plurality of reference marks in a focused image plane of the projection optical system, the images being arranged in a second direction substantially perpendicular to an optical axis of the projection optical system, and spacings of the images being determined by the predetermined spacings of the reference marks; a movable substrate stage adjacent the focused image plane, the movable substrate stage being movable in a plane substantially perpendicular to the optical axis and in a direction substantially parallel to the optical axis; a plate fixed to the movable substrate, the plate having an aperture smaller than the spacings separating the images of reference marks adjacent in the first direction; a driving unit moving the movable mask stage and the movable substrate stage relative to each other so that the images of the reference marks are scanned by the aperture; a photo detector outputting a reception signal indicating the amount of the radiation flux that passes through the aperture; a position detector outputting a position signal indicating a position of the plate; and a calculation unit processing the reception signal and the position signal to derive the positions of the focused image plane of the projection optical system.

In another aspect, the present invention provides a projection exposure apparatus for transferring a pattern on a mask to a surface of a substrate by an exposing radiation flux, the projection exposure apparatus including a mask stage for holding the mask, the mask including an alignment mark; a substrate stage for holding the substrate; a first fiducial mark on the substrate stage; an illumination optical system directing the exposing radiation flux toward the mask on the mask stage to illuminate the alignment mark on the mask; a projection optical system receiving the radiation flux that passes through the alignment mark to form an image of the alignment mark; a radiation receiver on the substrate stage, the radiation receiver outputting a reception signal indicating the amount of the radiation flux received at the radiation receiver; a position detector outputting a position signal indicating the position of the radiation reaceiver; an optical system; a mask alignment sensor for receiving from the optical system an image of the first fiducial mark and the image of the alignment mark and in response thereto outputting a mask alignment signal indicating the position of the mask relative to the wafer stage, the optical system being different from the illumination optical system; and a calculation unit processing the reception signal and the position signal and deriving the position of the image of the reference mark relative to the wafer stage, the calculation unit processing the mask alignment signal in accordance with the derived position of the image to calibrate the mask alignment sensor so that the position of the image of the reference mark relative to the wafer stage can be derived from the mask alignment signal generated at the mask alignment sensor.

In another aspect, the present invention provides a position detector for determining a position of a mask relative to a wafer stage in an exposure apparatus for exposing a pattern on the mask onto a wafer on the wafer stage by an exposing radiation flux, the position detector including a first detector optically measuring the position of the mask relative to the wafer stage using a first optical path that is substantially the same as an exposure optical path to be used in exposing the pattern on the mask onto the wafer, the first detector outputting a first position signal indicating the thus measured position of the mask relative to the wafer stage; a second detector optically measuring the position of the mask relative to the wafer stage using a second optical path that is different from the exposure optical path, the second detector outputting a second position signal indicating the thus measured position of the mask relative to the wafer stage; and a controller processing the first position signal and the second position signal to calibrate the second detector so that the position of the mask determined by the first position signal is derived by the second position signal from the second detector.

In another aspect, the present invention provides a method for detecting the position of a focused image plane at which a focused image of a mask pattern on a mask is formed by a radiation flux through a projection optical system in an exposure apparatus, the method including the steps of directing the radiation flux toward the mask to illuminate a plurality of reference marks formed on the mask, the plurality of reference marks being disposed on the mask in a first direction with predetermined spacings; guiding the radiation flux that passes through the reference marks to the projection optical system to form images of the plurality of reference marks in the focused image plane, the images being arranged in a second direction substantially perpendicular to an optical axis of the projection optical system, and spacings of the images being determined by the predetermined spacings of the reference marks; moving a radiation receiving area adjacent the focused image plane relative to the mask to scan the images of the reference marks, the radiation receiving area being smaller than the spacings separating the images of reference marks adjacent in the first direction; outputting a reception signal indicating the amount of the radiation flux received at the radiation receiving area; outputting a position signal indicating a position of the radiation receiving area; and processing the reception signal and the position signal to derive the positions of the images of the reference marks.

In another aspect, the present invention provides a method for calibrating a mask alignment sensor detecting a position of a mask relative to a wafer stage in a projection exposure apparatus for transferring a pattern on the mask onto a wafer on the wafer stage by an exposing radiation flux through a projection optical system, the method including the steps of directing the exposing radiation flux toward the mask to illuminate an alignment mark formed on the mask; guiding the radiation flux passing through the alignment mark to the projection exposure apparatus to form an image of the alignment mark; moving an aperture on the wafer stage adjacent the image of the alignment mark relative to the mask to scan the image of the alignment mark; outputting a reception signal indicating the amount of the radiation flux that passes through the aperture; outputting a position signal indicating a position of the aperture; processing the reception signal and the position signal to derive a position of the image of the alignment mark relative to the wafer stage; transmitting a light beam from the aperture on the wafer stage; guiding the light beam to the projection optical system to form an image of the aperture adjacent the alignment mark; receiving the light beam passing through the mask to output an alignment signal indicating a position of the mask relative to the wafer stage; and processing the alignment signal in accordance with the derived position of the image of the alignment mark in the step of processing the reception signal to derive a relationship between the alignment signal and the position of the image of the alignment mark relative to the wafer stage.

In another aspect, the present invention provides a position detector for use in a projection exposure apparatus to detect a position of a focused image plane at which a focused image of a mask pattern is formed by a radiation flux through a projection optical system having an optical axis, the position detector including a reference mark including a plurality of line-shaped marks disposed in a first direction at a position at which the mask pattern is to be placed, the radiation flux illuminating the reference marks, and thereafter entering the projection optical system to form an image of the reference mark including images of the line-shaped marks in the focused image plane, the images of the line-shaped marks being disposed in a second direction; a radiation receiver having a receiving area movable relative to the images of the line-shaped marks in a plane substantially perpendicular to the optical axis to scan the images of the line-shaped marks successively, the radiation receiver outputting a reception signal indicating the amount of the radiation flux received at the receiving area, the receiving area being larger than the image of the reference mark in the second direction; a position detector outputting a position signal indicating the position of the receiving area; and a calculation unit processing the reception signal and the position signal to derive the positions of the images of the line-shaped marks.

In another aspect, the present invention provides a method for detecting the position of a focused image plane at which a focused image of a mask pattern on a mask is formed by a radiation flux through a projection optical system having an optical axis in an exposure apparatus, the method including the steps of directing the radiation flux toward the mask to illuminate a reference mark formed on a mask, the reference mark including a plurality of line-shaped marks disposed on the mask in a first direction; guiding the radiation flux that passes through the reference mark to the projection optical system to form an image of the reference mark including images of the line-shaped marks in the focused image plane, the images of the line-shaped marks being arranged in a second direction; moving a radiation receiving area relative to the images of the line-shaped marks in the focused image plane to scan the images of the line-shaped marks, the radiation receiving area being larger than the image of the reference mark in the second direction; outputting a reception signal indicating the amount of the radiation flux received at the radiation receiving area; outputting a position signal indicating a position of the radiation receiving area; and processing the reception signal and the position signal to derive the positions of the images of the line-shaped marks.

In another aspect, the present invention provides a method for calibrating a sensor detecting an image of an alignment mark formed on a mask, the method including the steps of directing a first radiation flux toward the mask; outputting a first signal indicating the first radiation flux that passes through the alignment mark; guiding a second radiation flux passing through a projection optical system to the mask, the projection optical system transforming a pattern on the mask to a substrate; outputting a second signal indicating the second radiation flux that passes through the alignment mark; and obtaining an alignment offset based on said first signal and said second signal.

In another aspect, the projection exposure apparatus of the present invention includes an illumination optical system which illuminates a mask printed with alignment marks and a pattern to be transferred; a projection optical system, which projects the pattern image of the mask to be transferred onto the photosensitive substrate; and a wafer stage, which shifts the photosensitive substrate; wherein the wafer stage is formed with first fiducial marks, and second transparent fiducial marks; alignment sensors on the mask side are arranged above the mask (12) to detect the positional deviation of the first or the second fiducial mark on the wafer stage from the alignment marks on the mask via the projection optical system under illumination light having the same wavelength as that of exposing light; and spatial sensors are formed to detect the projected image of the alignment mark on the mask via a projection optical condition via the second fiducial marks under illumination light of the same wavelength and illumination conditions of those of exposure light.

According to the present invention, when aligning the mask, the alignment sensors on the mask side detect the positional deviation of the alignment marks on the mask from the corresponding first fiducial marks using illumination light of the same wavelength as that of exposing light in the downward illumination technique. However, this may cause alignment errors when the illumination condition changes. Therefore, under the same illumination condition as the real exposing light which is actually used, the relative positions of the alignment marks on the mask and the second fiducial mark are detected in advance by both the spatial image sensor and the alignment sensors on the mask side to store the data on the positional deviation between the two relative positions as an offset. By correcting the positional deviation, which is detected by the alignment sensors during the mask alignment, a highly accurate mask alignment (reticle alignment) is performed.

In another aspect, the projection exposure apparatus of the present invention is provided with a calculation unit, which calculates the first relative positional deviation of the mask from the wafer stage, based on the detected signal data obtained by the spatial image sensor during relative-scanning of the projected images of the alignment marks on the mask and the second fiducial mark, and also calculates the second positional deviation of the mask from the wafer stage based on the positional deviation of the alignment marks form the projected image of the second fiducial marks. In addition, the calculation unit provides the offset between the second and the first relative positional deviations; the positional deviation of the alignment mark on the mask, which is detected by the alignment sensors on the mask side, from the projected image of the first fiducial marks is corrected using the offset obtained by the calculation unit.

In the present invention, a photoelectric sensor of the light intensity detection type or the like may be used for the spatial image sensor; the second fiducial marks are used for an apparatus; and image processing is used for the alignment sensor for the mask. In this configuration, by performing a relative scanning for the spatial image sensor and by performing a image sampling in the still state mode of the alignment sensors, the second fiducial marks can be used by other sensors at the same time.

In a further aspect, in the projection exposure apparatus of the present invention, the first or second projection apparatus is provided with an alignment sensor on the substrate side to detect the alignment mark positions on the photosensitive substrate, wherein third fiducial marks are formed in advance in a predetermined positional relationship with respect to the first fiducial marks; wherein the positional deviation of the alignment marks on the mask from the projected images of the first fiducial marks is detected by the alignment sensors on the mask side, and at the same time, the positions of the third fiducial marks are detected by the alignment sensor on the substrate side to measure the relative distance (base line length) between the detection center of the alignment sensor on the substrate side and the center of the image projected onto the wafer stage.

In this case, by correcting the pitch between the first fiducial marks and the pitch between the third fiducial marks, which are measured in advance, using the positional deviation detected by the alignment sensors on the mask side and the positional deviation detected by the alignment sensor on the substrate side, the base line length of the alignment sensor can be obtained. Moreover, in the present invention, by correcting the detection results of the alignment sensors on the mask side via the second fiducial marks, a highly accurate base line length can be obtained even when the illumination condition for exposing light is changed. Moreover, when measuring the positions for the wafer stage using a laser interferometer, a mobile mirror is attached onto the wafer stage. In this case, it is preferable that the member, on which the first and the second fiducial mark are provided, is made of a material having a small thermal expansion coefficient, is formed integral with the mobile mirror. By doing so, the unfavorable effects of thermal deformation from the irradiation heat of exposing light and the like can be reduced.

Also, in the present invention described above, exposing light can be used as illumination light for the alignment sensors and its spatial image sensor; and move-away apparatus can be attached such that the alignment sensors on the mask side are moved away from the optical path of exposing light. In this case, by moving the alignment sensors away from the optical path of the exposing light via the move-away apparatus when using the spatial image sensor, and by moving the alignment sensors back to the optical path of the exposing light, the illumination optical system for exposing light can be commonly used.

Also, according to the coefficient of reflection of the mask, the first and second fiducial mark positions may be adjusted when detecting the positional deviation of the first or the second fiducial mark on the mask from the alignment mark on the wafer stage using the alignment sensors via the projection optical system. For example, when the image processing technique is used for the alignment sensors the position of the first or second fiducial mark can be adjusted to have the image having the maximum contrast which corresponds to the coefficient of reflection of the mask. This provides highly accurate mask alignment and the like even if a low reflective reticle, for example, is used.

It is preferable that the second transparent fiducial marks are formed of a plurality of transparent marks (apertures). This, in turn, means to multiply the second fiducial marks; the positional deviation obtained for each of the transparent marks may be averaged. This provides a highly accurate detection of positional deviation which results in highly accurate mask alignment, etc.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 16 is a schematic view of a fiducial plate according to the second preferred embodiment;

FIGS. 17A and 17B are cross-sectional views of a fiducial plate according to the second preferred embodiment;

FIGS. 19A, 19B, and 19C are drawings showing operation of light receiving type alignment method according to the second preferred embodiment;

FIG. 31A is a plan view showing a projected image of the reticle on the wafer stage according to the fourth preferred embodiment;

FIG. 31B is a plan view showing a transparent substrate 340 on the wafer stage according to the fourth preferred embodiment;

FIG. 31C is a plan view showing the arrangement of the fiducial marks on the fiducial mark plate 306c according to the fourth preferred embodiment;

FIG. 31D shows a shape of the fiducial mark for an off-axis alignment sensor according to the fourth preferred embodiment;

FIG. 36 is a flow chart showing one example of the operation of calculating the offsets of the measurement value of the reticle alignment systems according to the fourth preferred embodiment;

DETAILED DESCRIPTION OF THE PREFERRED EMBODIMENT

Reference will now be made in detail to the preferred embodiments of the present invention, examples of which are illustrated in the accompanying drawings. These embodiments are applications of this invention to a projection exposure apparatus for manufacturing semiconductor integrated circuit or the like.

First Preferred Embodiment

Figure 1:
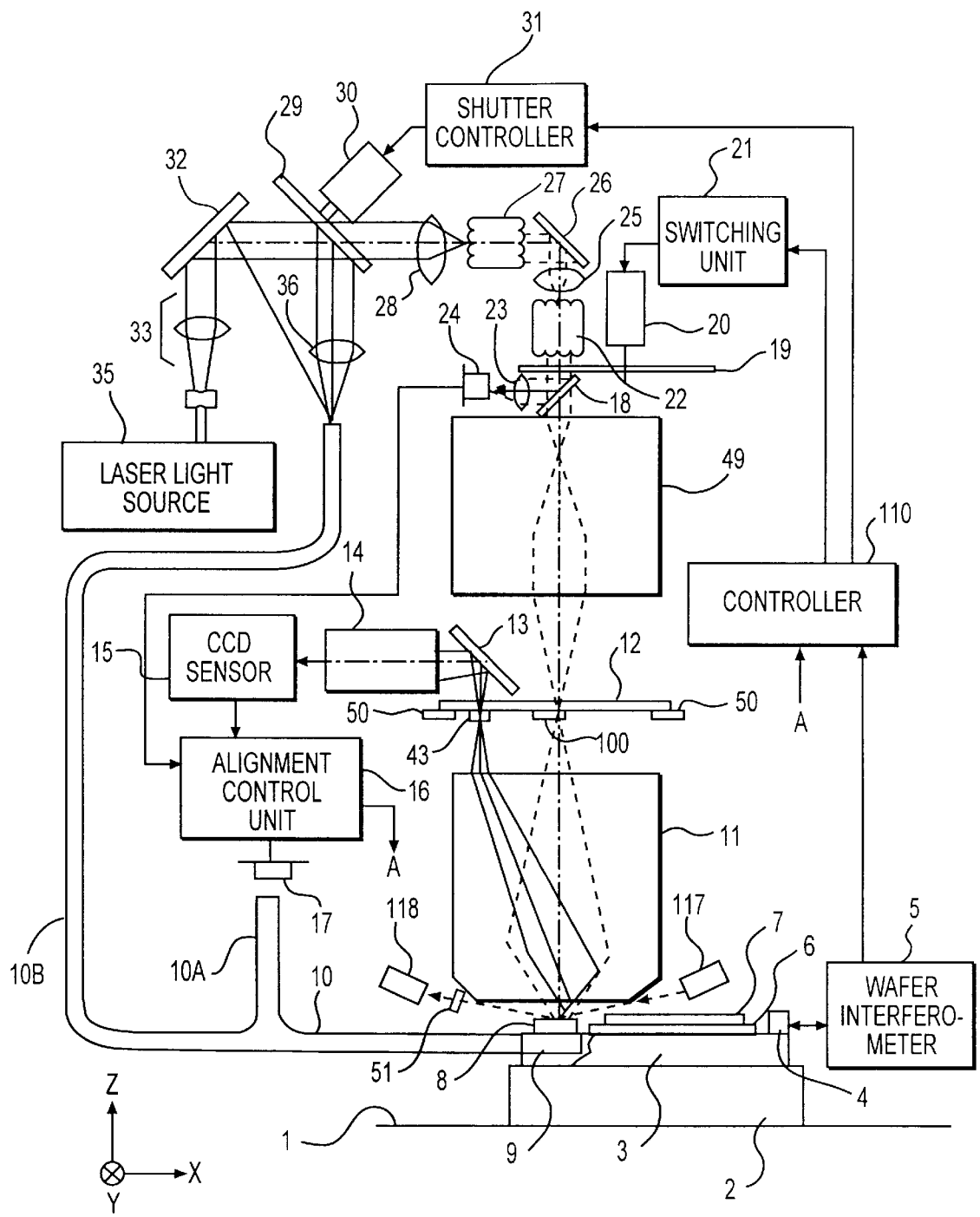
FIG. 1 is a schematic view of a projection apparatus according to a first embodiment of the present invention.

FIG. 1 schematically shows an overall construction of a projection exposure apparatus to which embodiments of the present invention is applied. In FIG. 1, a light beam emitted from a laser light source 35, such as an KrF excimer laser or an ArF excimer laser, is shaped into a light flux with a certain diameter through a beam expander system 33, and reflected by a mirror 32 and reaches a shutter 29. Here, other type of light sources, such as a mercury lamp, can be used instead of the laser light source. The light that passes through the shutter 29 converges onto the incident surface of a first fly-eye lens 27 through a lens 28. The light from the lens 28 enters the first fly-eye lens 27, a vibration mirror 26 for speckle removal, a lens 25, and a second fly-eye lens 22 in this order and becomes a uniform illumination light having a similar shape to that of the illumination field. The light transmitted through the second fly-eye lens 22 passes through a pupil illumination aperture 19 (turret board) and half mirror 18, and illuminates a reticle 12 through an illumination optical system 49 which consists of optical elements, such as a relay lens, an imaging blind, and a condenser lens. The pupil illumination aperture 19 is located at a position conjugate to the pupil surface of a projection optical system 11 and has the following components: aperture diaphragms with various aperture diameters, an annular diaphragm having an annular aperture, and an aperture diaphragm for slanted (or inclined) illumination having aperture at a position eccentric from the optical axis of the illumination optical system (Japanese Laid-Open Publication 04-225357). A desired aperture diaphragm can be positioned at the optical path of illumination light by rotating the pupil illumination aperture 19 by a motor 20 under control of illumination condition switching unit 21. The illumination switching unit 21 is controlled by a controller 110.

In addition to a circuit pattern, an alignment mark 43 for reticle alignment and a pattern mark 100 for focus detection are formed on the reticle 12 on a reticle stage 50, which is movable in a two-dimensional plane. The pattern mark 100 includes a plurality of L/S (line and space) marks, and is designed to be transferred onto a wafer 7 along with the circuit pattern via a projection lens 11 (projection optical system). The wafer 7 is held by a wafer holder 6 located on a Z-tilt stage 3, which can be tilted and is movable in the optical axis direction (Z-direction). The Z-tilt stage 3 is mounted on an XY stage 2 by an air guide and a linear motor. The XY stage is freely movable in the X and Y direction (in a two-dimensional plan) on a mounting plate 1. The mobile mirror 4 is located on the Z-tilt stage 3, and monitors the position of wafer 7 in the XY plane when engaged with a wafer interferometer 5. This way, the wafer 7 can be moved to any position by driving the XY stage 2 in the two-dimensional plane. The XY stage 2 is controlled by the controller 110, and the pattern on reticle 12 is successively and/or repeatedly exposed when employing a stepping exposure scheme, such as a step-and-repeat exposure scheme or step-and-scan exposure scheme.

Figure 2:
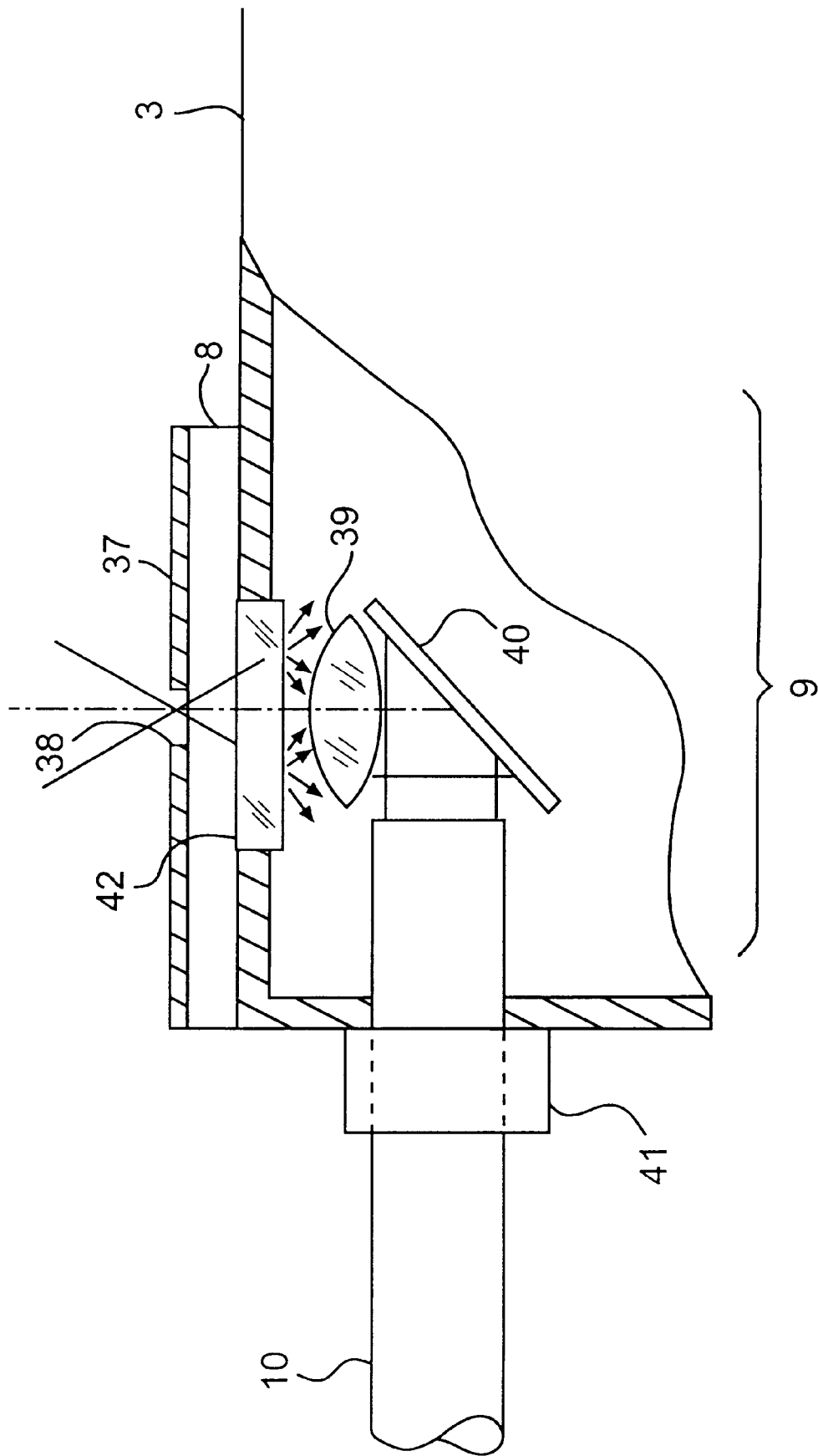
FIG. 2 is a cross-sectional view indicating the structure near a fiducial plate according to the first embodiment.

Alignment mechanism of reticle 12 will be explained below. The shutter 29 described above serves as a selector for selecting the illumination system depending on exposure or alignment. By so controlling a shutter control unit 31 and a shutter motor unit 30, the illumination light from the laser light source 35 can be reflected and incident on an optical fiber 10 through a lens 36. The light injected in the optical fiber 10 lightens an aperture 38 (FIG. 2) of a fiducial plate 8 by illuminating the plate from the side (underside) through a mirror 40, a lens 39, and a diffusion plate 42 (FIG. 2). Light transmitted through the aperture 38 from below passes through the projection lens 11 and illuminates the alignment mark 43 on the reticle 12. The light that illuminates the alignment mark 43 passes through reticle 12, impinges on a mirror 13, and is incident on a CCD sensor through an alignment light receiving system 14. Then, the image of alignment mark 43 along with the image of aperture 38 is formed at the CCD array sensor 15. The image obtained at the CCD array sensor 15 is supplied to an alignment control unit 16. After A/D transformation, the image is processed to derive the position of aperture 38 of the fiducial plate 8 and the position of reticle alignment mark 43. The coordinate position of reticle 12 relative to wafer stage is measured in this manner.

When a pattern on reticle 12 is projected onto the exposure surface of wafer 7 by exposure, the focused image of the pattern on reticle 12 formed through projection lens 11 need be matched with the exposure surface of wafer 7. A method of detecting such a focused image according to the present embodiment is described below. In this focused image detection method, the focal position of projection optical system 11 is measured using the same illumination system as that for exposure, as follows. Light coming from illumination optical system 49 illuminates the pattern mark 100 on reticle 12 and projects the pattern mark 100 onto fiducial plate 8 on wafer stage 3 through projection lens 11. The projected image is relatively scanned by the aperture 38 on fiducial plate 8.

The light transmitted through the aperture 38 is received by a sensor 17 via a light reception system 9 and optical fibers 10, 10A. Then, the amount of light that reaches the sensor 17 is sampled synchronously with the scan performed by aperture 38 (scanning measurement). Such relative-scan between the pattern mark 100 of reticle 12 and the aperture 38 can be performed by moving either the wafer stage 3 or reticle stage 50.

When a pulse emission-type light source, such as a KrF excimer laser or ArF excimer laser, is used as the light source 35, there is a need to match the timing of the emission with the sampling timing of the transmitted light. Also, in order to cope with fluctuation of individual pulses, a small amount of light (less than 10%) is reflected at the half mirror 18 located in front of illumination optical system 49. The reflected light is collected by a lens 23, and is received by an integrator sensor 24 to output a signal to the alignment control unit 16. This signal is used to normalize light received at sensor 17. In this embodiment, the change of the wave-like signal obtained by the sensor 17 with the position of the surface of the fiducial plate 8 is examined to detect the focal position of the projection illumination system 11.

In FIG. 1, a light source 117 (light-emitting system) emits detection light in the oblique direction from the optical axis of projection optical system 11. The detection light from this light source 117 is focused on the center portion of the image field of projection optical system 11 through an oblique incident optical system (not shown). At the configuration illustration in FIG. 1, the fiducial plate 8 is placed within the image field and the detection light is focused on the surface of the fiducial plate 8. The light reflected from the fiducial plate 8 is incident on the reception surface of a photoelectric sensor 118 through a parallel glass plate 51 and a light-receiving optical system (not shown). The photoelectric sensor 118 is composed of a position sensor type receptor elements (PSD), for example. When the fiducial plate 8 moves in the vertical direction parallel to the optical axis of projection optical system 11, the center of the light flux received at the reception surface of the photoelectric sensor 118 changes, Thus, the position of the fiducial plate 8 in the optical axis direction can be measured by detecting this center position. For a fixed position of the fiducial plate surface, the center position of light flux can be adjusted by tilting parallel plate 51. For example, the parallel plate 51 can be tilted such that the surface of the fiducial plate 8 is at the best focal position of projection lens 11 when the output of photoelectric sensor 118 is zero. Then, at exposure, the height of wafer 7 is adjusted so that the output of photoelectric sensor 118 yields zero. Details of this focal position detection system (surface detector) of oblique incident type are described in Japanese Laid-Open Publication No. 60-168112, for example.

Next, the aperture 38 formed on the fiducial plate 8 is described in detail. FIG. 2 shows an enlarged cross-sectional view of the fiducial plate 8. The surface of the fiducial plate 8 has a low reflective chrome portion 37 and aperture 38 (transmission section). Of the light coming from the illumination optical system 49, only the light transmitted through the aperture 38 is guided to light reception system 9, which includes diffusion plate 42, a lens 39, and a mirror 40. The light reflected by mirror 40 of light reception system 9 is guided to optical fiber 10 fixed to Z tilt stage 3 by a support 41. The diffusion plate 42 is installed on the Z tilt stage 3 to guide the incident light to the lens 39 as much as possible. This is preferable because the NA (Numerical Aperture) of the optical system normally has a relatively large value of 0.6 during wafer exposure. The diffusion plate 42 is also effective to receive all the light scattered at aperture 38. If the lens 39 under aperture 38 has curvature and/or diameter large enough to receive all the scattered light and the diameter of the optical fiber can be accordingly increased, there is no need to employ the diffusion plate 42. However, in consideration of the compactness of the apparatus, it is advantageous to employ the diffusion plate 42. Moreover, instead of using the optical fiber 10, the light transmitted through aperture 38 can be guided to the outside of the stage 3 by relaying through optical lenses. As described above, the light transmitted through aperture 38 is almost completely received by the sensor 17 through the optical fiber 10.

Figure 3A:
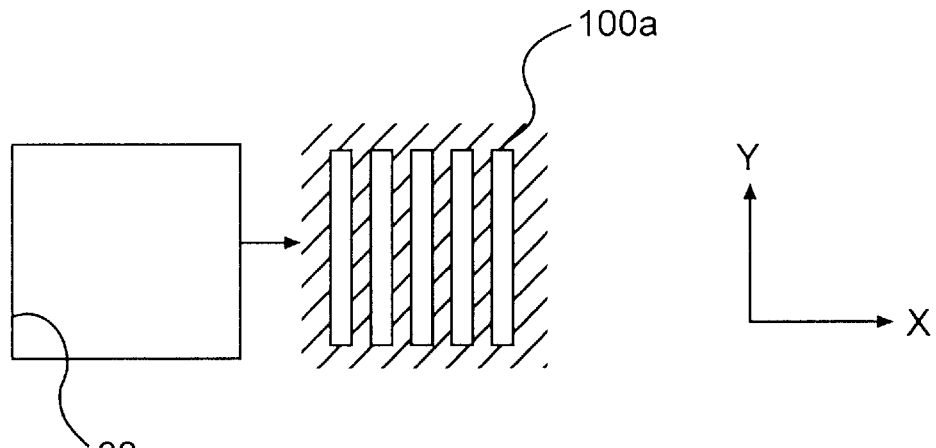
FIGS. 3A, 3B, and 3C are schematic views showing basic operation of the first preferred embodiment.
Figure 3B:
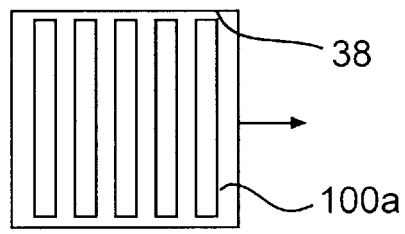
Figure 3C:
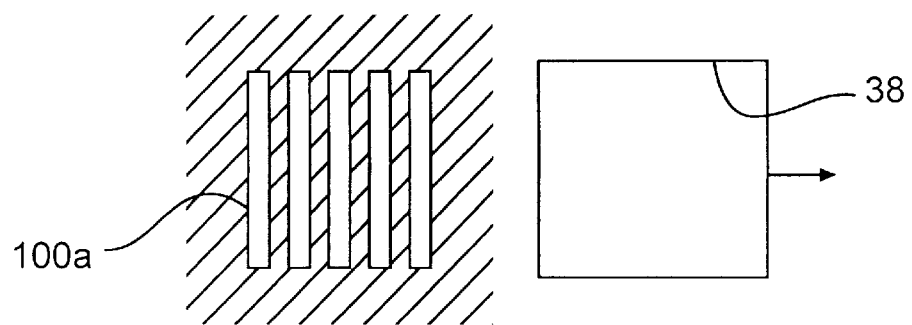

Next, the basic principle for focal point measurement of this embodiment will be described referring to FIGS. 3A to 3C. FIGS. 3A to 3C show the spatial relationships between aperture 38 and an image 100a (one of the images of the multiple L/S marks) corresponding to the pattern mark 100 on reticle 12. An L/S mark illuminated by illumination optical system 49 is imaged as the projected image 100a on the fiducial plate 8 via projection lens 11. This projected image 100a is an L/S (line and space) mark of 0.15–0.25 μm pitch (the minimum pattern for this particular exposure apparatus, for example), and the aperture 38 is designed to be wider than the projected image 100a in the scanning direction (X-direction in FIG. 3A). The aperture 38 does not need to be larger than the projected image 100a in the non-scanning direction (Y-direction in FIG. 3A).

Figure 4A:
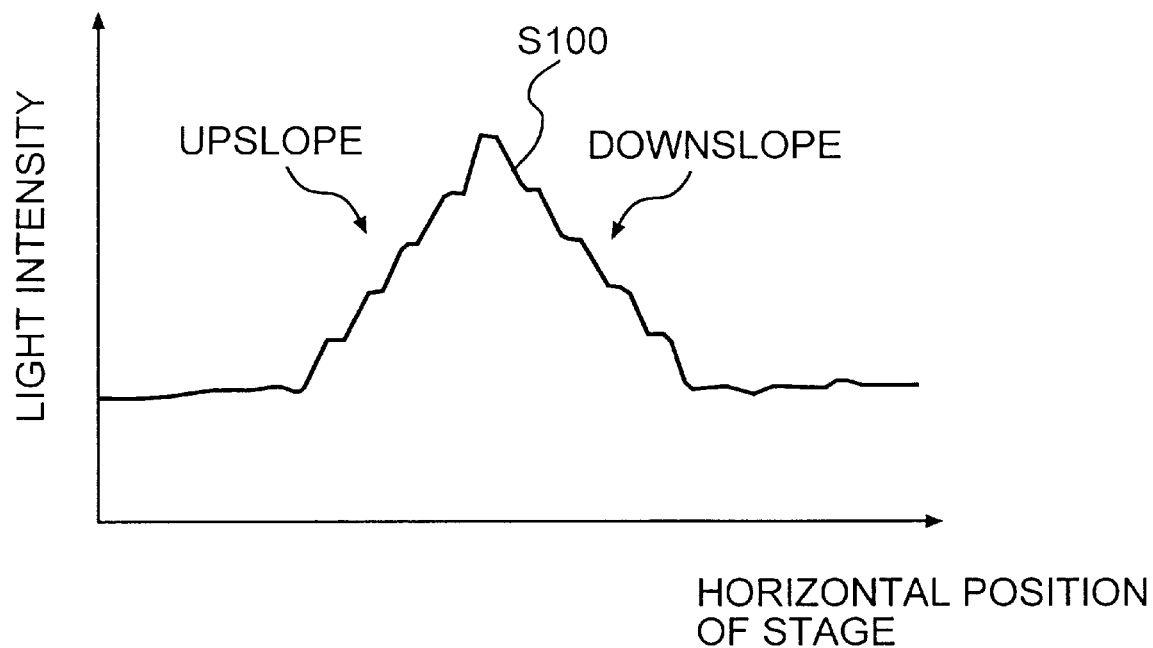
FIGS. 4A and 4B are graphs showing signals detected at a photo detector and a processed signal, respectively, according to the first preferred embodiment.
Figure 4B:
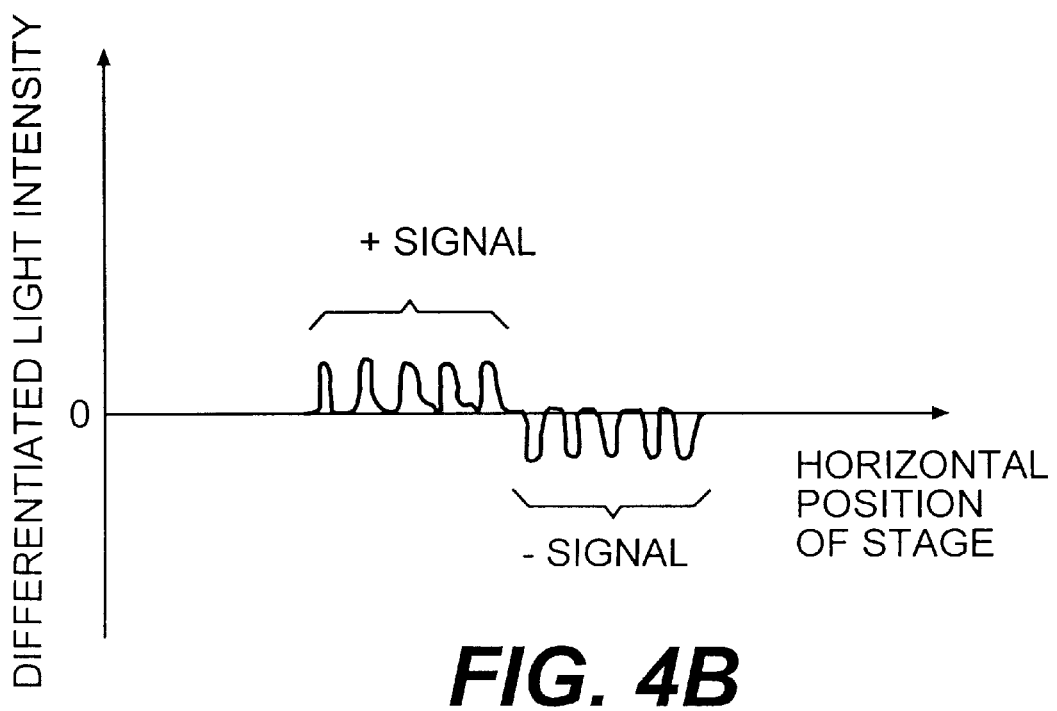

In this embodiment, the aperture 38 relatively scans the L/S pattern image 100a in the X-direction as shown in FIGS. 3A to 3C. As the scan proceeds, the amount of light received by sensor 17 increases gradually, reaching the maximum at the condition shown in FIG. 3(B) (where aperture 38 and pattern image 100a match) and then gradually decreases. The output of sensor 17 is normalized by the output of integrator sensor 24, and A/D conversion is performed. As a result, a wave-like signal S100, which changes stepwise and has leading edge section and trailing edge section, is obtained (FIG. 4A). Furthermore, if the wave-like signal S100 of FIG. 4A is differentiated, a differentiated signal as shown in FIG. 4B is obtained. This operation is repeated many times at various vertical positions of the Z-tilt stage 3, and the differentiated signals as in FIB. 4B are obtained. The vertical position is changed from the position that is likely to be lower than the estimated best focal position of projection optical system 11 to higher positions. Then, the focal position (best focal position) of projection optical system 11 is determined from the position of Z-tilt stage 3 that gives the maximum differentiated signal.

In general, a down slope and an up slope are obtained for the respective edges of aperture 38 as shown in FIG. 4A. However, since the image aberration may differ for each edge, improvement in accuracy of the focus position measurement is possible by using both data (and averaging the heights of the peaks) in the differentiated signal from the up slope+signal in FIG. 4B and that from the down slope−signal in FIG. 4D, or obtaining the L/S width (average of the widths of the+signal peaks and−signal peaks). However, when aberration itself need be obtained by examining the difference of+signal and−signal, these signals are separately handled and processed.

Figure 5A:
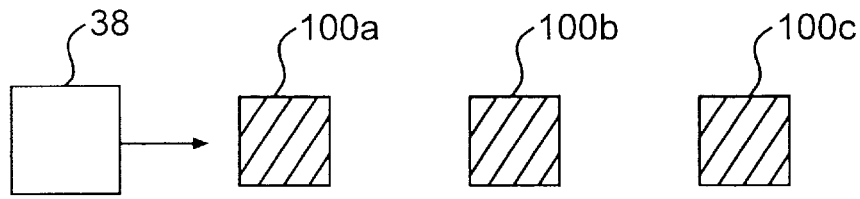
FIGS. 5A, 5B, 5C, and 5D are schematic views showing operation of the first preferred embodiment.
Figure 5B:
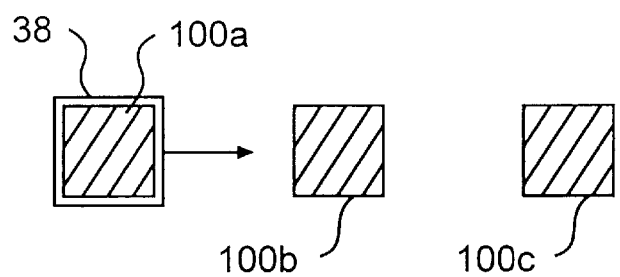
Figure 5C:
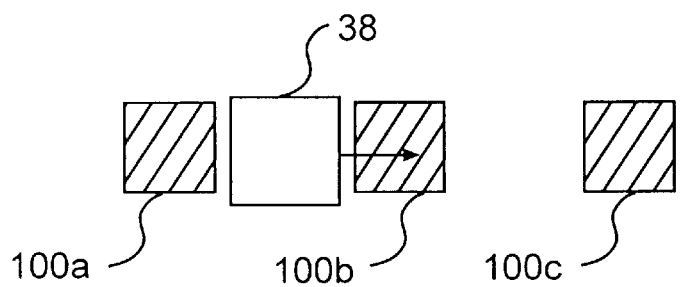
Figure 5D:
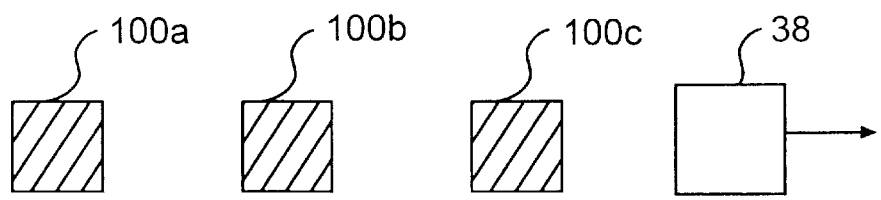
Figure 6A:
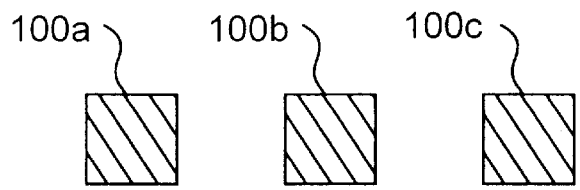
FIGS. 6A and 6B are graphs showing signals detected at a photo detector and a processed signal, respectively, according to the first preferred embodiment.

FIGS. 5A to 5D show the spatial relationships between aperture 38 and the multiple images 100a, 100b, 100c of multiple L/S marks corresponding to the pattern mark 100. In this configuration, a plurality of L/S marks are disposed on reticle 12 along a predetermined direction. The image 100a, 100b, 100c are relatively scanned by the aperture 38 of fiducial plate 8 and wave-like signals S100a, S100b, S100c are obtained, each of which has a trailing edge and leading edge sections (FIG. 6A). In FIGS. 5A to 5C, spacings of the images in the scanning direction (horizontal direction) are set wider than the aperture 38 (refer to FIG. 5C).

Figure 6B:
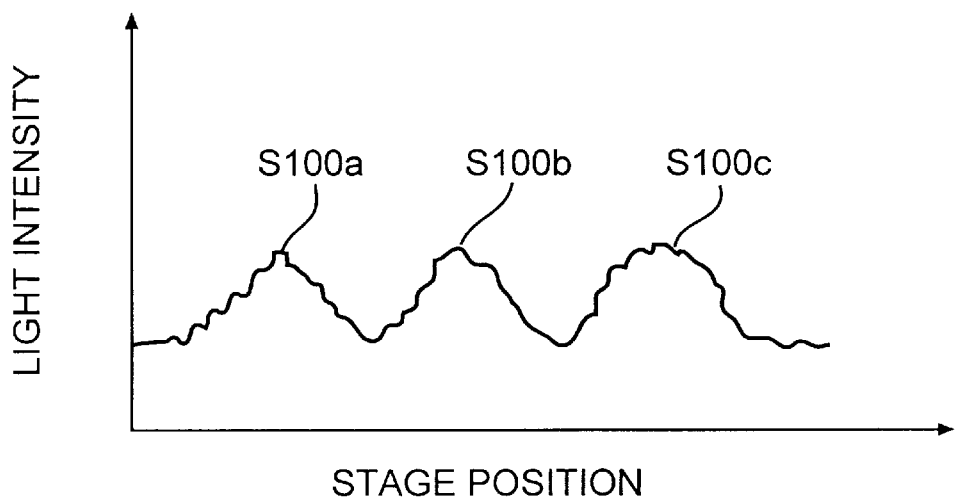
Figure 6C:
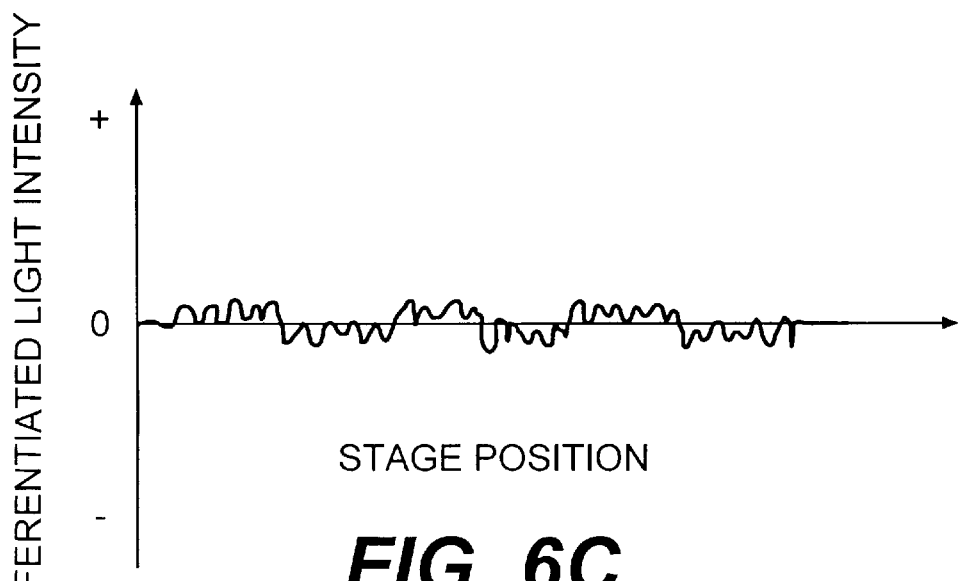

The wave-like signals S100a, S100b, S100c are obtained for the images 100a, 100b, 100c, respectively (FIG. 6A) through scanning the images 100a, 100b, 100c by aperture 38, in a manner shown in FIGS. 5A to 5D. FIG. 6B indicates the derivative of the waveforms in FIG. 6A.

Figure 7A:
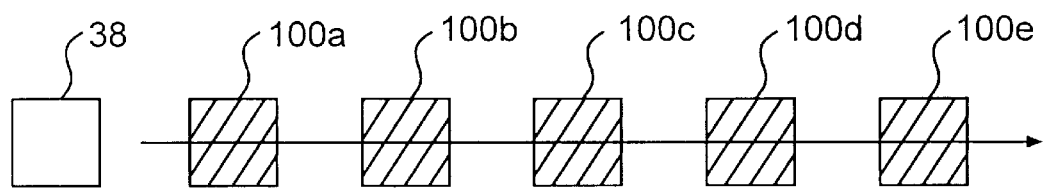
FIGS. 7A, 7B, and 7C are drawings showing operation of the first preferred embodiment.

As described above, since the spaces between the image 100a, 100b, 100c in the scanning direction are wider than aperture 38, the separate wave-like signals are obtained for each of the images 100a, 100b, 100c when the aperture 38 scans the images in a manner shown in FIGS. 5A to 5D. This scanning operation is performed in a horizontal direction and in the Z-direction at the same time. In general, when a photo multiplier that can only receive a very small amount of light is used as sensor 17, the dynamic range in the measurement becomes small, resulting in an insufficient S/N (signal to noise) ratio. This problem does not occur in the present embodiment since a plurality of L/S marks are employed. In addition, throughput can be improved as compared with the case where a single L/S mark is repeatedly measured by changing the focus position. This also helps to minimize errors due to fluctuation in the focal position over time. As described above, it becomes possible to conduct a high speed focal position detection by scanning the images 100a, 100b, 100c of the corresponding L/S marks by aperture 38 in a horizontal direction and at the same time, moving Z-tilt stage 3 (aperture 38) in the Z-direction. An even better result can be obtained by further optimizing the spacing of multiple L/S marks and the size of aperture 38. Next, a sequence of the focal position detection method according to the present embodiment will be described in more detail with reference to FIGS. 7A to 7C. FIG. 7A shows a case that the pattern mark 100 is composed of five of the L/S marks each forming images 100a, 100b, 100c, 100d, and 100e on the fiducial plate 8. In this figure, while aperture 38 scans the images of L/S marks 100a, 100b, 100c, 100d, and 100e in this order, the focus condition of the pattern mark 100 by projection lens 11 is also changed at a constant rate. This change in focus condition of the pattern mark 100 is carried out by gradually raising or lowering the Z-tilt stage 3 from a predetermined position. Here, step-wise driving can also be used instead of such linear driving. Also, the scan operation above can be performed under the condition of fixing the position of the Z-tilt stage 3 and tilting the fiducial plate 8 by a predetermined angle. A wave-like signal detected by sensor 17 during the scan of FIG. 7A is shown in FIG. 7B.

Figure 7B:
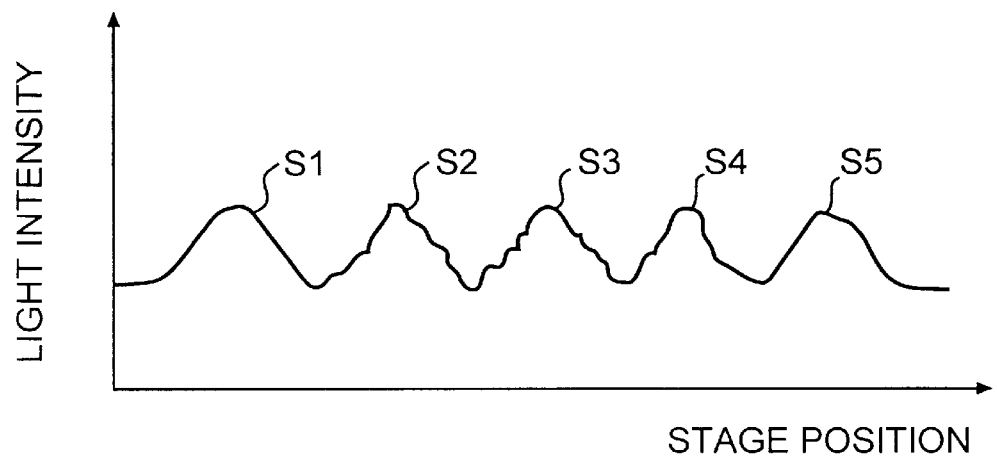
Figure 7C:
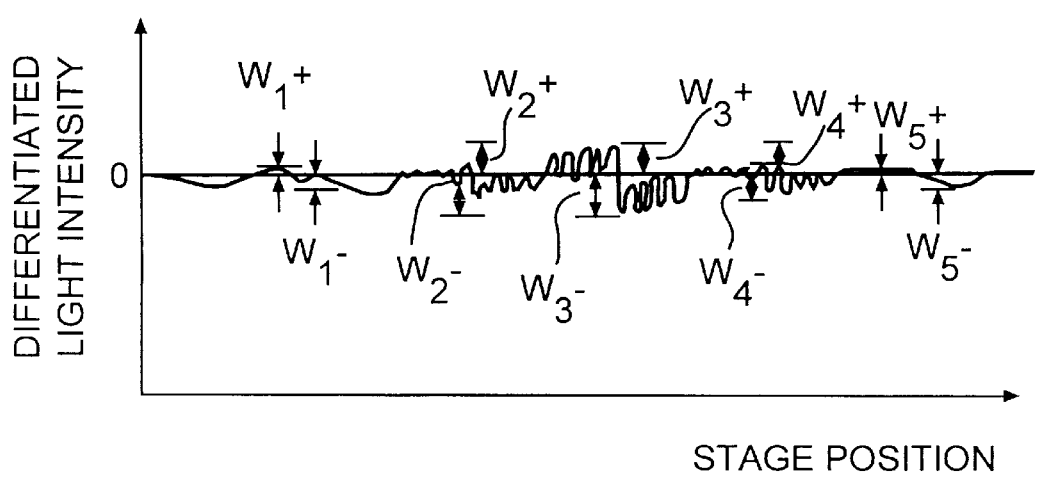
Figure 8:
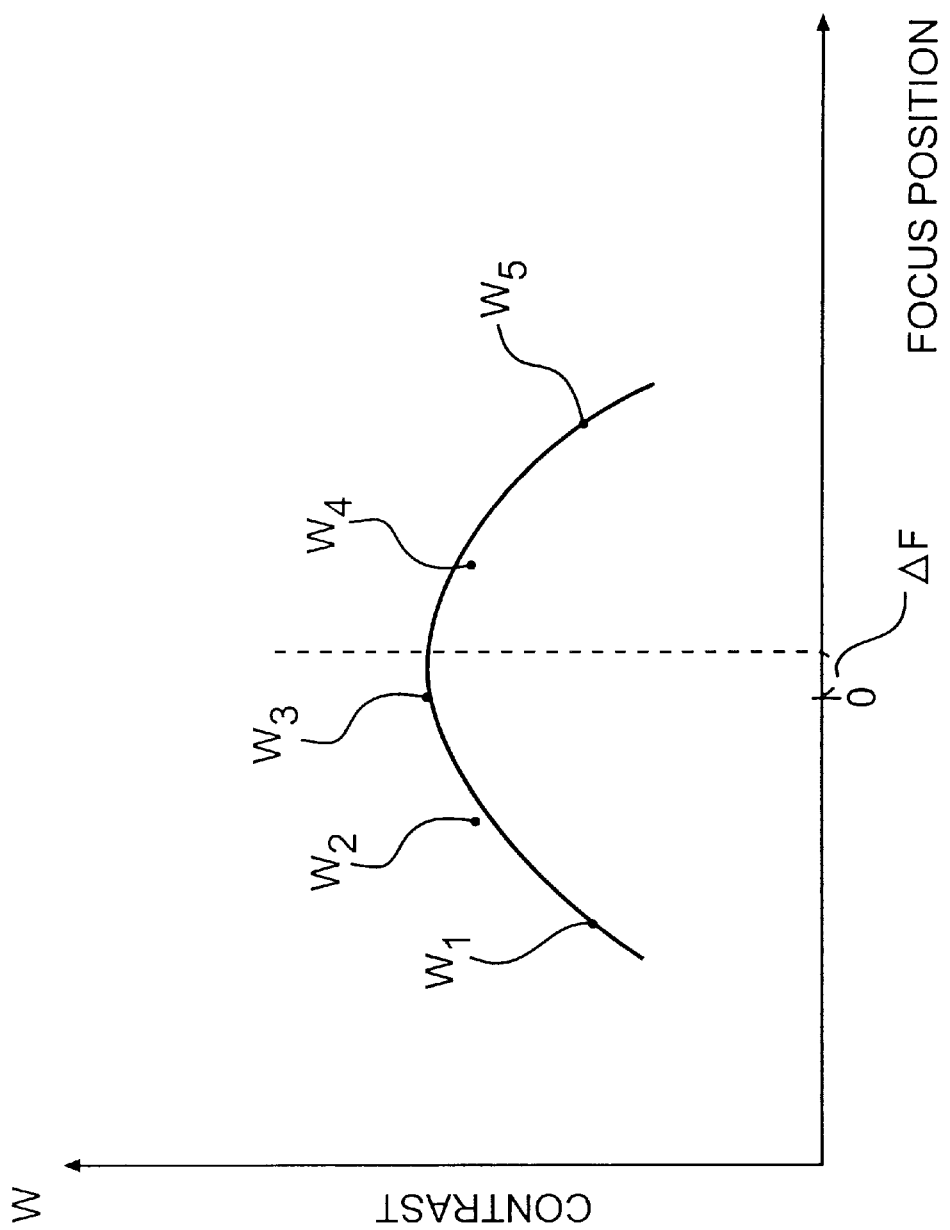
FIG. 8 is a graph indicating a contrast signal of the first preferred embodiment.

FIG. 7C shows a wave form obtained by differentiating the wave form of FIG. 7B. In this example, the contrasts $W_1 \sim W_5$ of slope signals $S1 \sim S5$ are calculated from the wave form of FIG. 7C as follows. Let the maximum and minimum peak heights at each slope signal Sn to be $W_n+$ and $W_n-$, respectively (100a: $W_1+$ and $W_1-$, 100b: $W_2+$ and $W_2-$, 100c: $W_3+$ and $W_3-$, 100d: $W_4+$ and $W_4-$, 100e: $W_5+$ and $W_5-$), then the contrasts $W_n$ is determined by $W_n=(W_n+ W_n-)/2$ (n=1~5). The resultant contrasts $W_n$ are plotted and fitted with a quadratic curve to determine the position of a peak $\Delta F$ in the quadratic curve (FIG. 8). As described above, the zero point of outputs from the oblique incident focus system 117 (and 118) (the origin of horizontal axis in the figure) can be used as a reference point corresponding to the best focal position of projection lens 11. FIG. 8, however, shows that the actual focused image of the reticle deviates from that zero point of the focus system by an amount $\Delta F$. By offsetting this $\Delta F$ through moving the zero point, the oblique incident focus system (surface detector) can be calibrated. Through carrying out this operation for the entire surface of reticle 12, it becomes possible to calibrate both the oblique incident focusing mechanism above and a leveling mechanism described in Japanese Laid-Open Publication No. 06-283403. The following are examples of schemes for offsetting $\Delta F$: (1) making fine adjustment in the position of light source 117; (2) elevating the chrome section 37 of fiducial plate 18 at a height where the output of focus system 117 and 118 becomes $\Delta F$ and then shifting the position of detection light relative to photoelectric sensor 18 by tilting the parallel glass plate 51 so that the output signal becomes zero; (3) offsetting $\Delta F$ electrically.

Figure 9A:
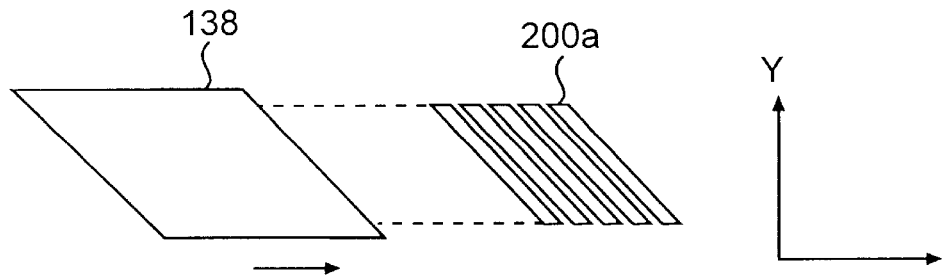
FIGS. 9A and 9B are schematic drawings showing examples of aperture and the image of alignment marks according to the first preferred embodiment.
Figure 9B:
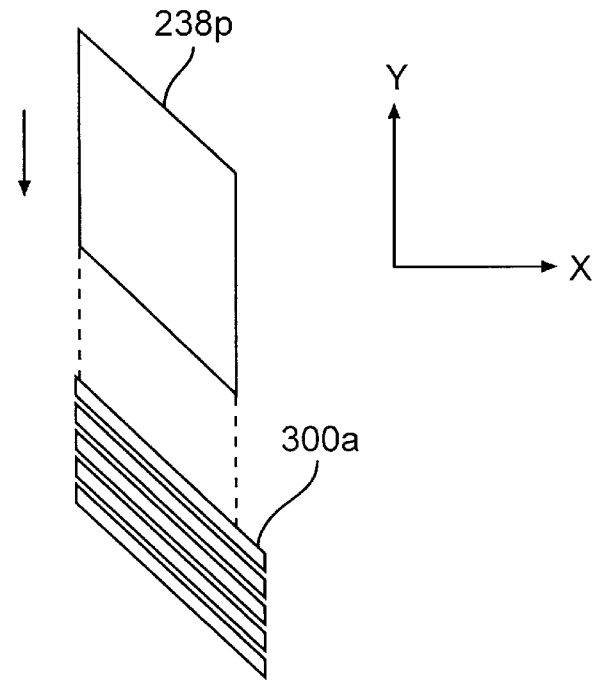

FIGS. 9A and 9B show a modification of the first embodiment of the present invention. The figures show the positional relationship of an aperture 138 (238p) on the fiducial plate 8 relative to the image of an L/S mark 200a (300a) on the reticle 12. FIG. 9A shows the X-direction scanning type aperture 138, which scans the L/S mark 200a in the X-direction (left-right direction on the sheet), and FIG. 9B shows the Y-direction scanning type aperture 238p, which scans the L/S mark 300a in the Y-direction (up-down direction on the sheet). In this modified embodiment, the aperture 138 (238p) has a pair of oblique edges, each of which is inclined at 45 degrees with respect to the X axis and accordingly has a parallelogram-like shape, as shown in FIGS. 9A and 9B. L/S marks on the reticle are formed in a similar manner so that the images 200a (300a) of the L/S marks on the reticle 12 are also inclined at 45 degrees in the XY plane. Here, the angle of inclination for the aperture and the L/S marks is not limited to ±45 degrees, and can take any predetermined value: ±30 degrees or ±60 degrees, for example.

According to this modified embodiment, information regarding an image averaged over the X-direction edge and the Y-direction edge can be determined by a single scan. In other words, for both FIGS. 9A and 9B, the operation is equivalent to scanning a rectangular images (like 100a ) in both the X and Y directions and averaging the resulting two focus signals.

In this embodiment, the image 200a of the L/S mark is formed to be shorter than the aperture 138 in the inclined direction (FIG. 9A), while the image 300a of the L/S mark is formed to be longer than the aperture 238p in the inclined direction (FIG. 9B). Also, since there are cases in the device manufacture process that fine line/space patterning is required at ±20 or ±30 degrees, apertures and L/S marks having such inclination (other than 0, ±45, ±90 degrees) can be formed on fiducial plate 8.

As described above, the present invention provides a highly accurate, high speed focus calibration method, which can correct problems caused by modified illumination or a difference in resolution between a reticle and a fiducial plate, while maintaining high reproducibility and high speed processing capability described in Japanese Laid-Open Publication No. 05-160003. Also, as a result of optimizing the aperture geometry and the reticle mark placement, it becomes possible to perform leveling calibration (described in Japanese Laid-Open Publication No. 06-283403) at high speed and with high accuracy. Furthermore, the imaging characteristics of the projection lens (in particular, the focus depth and astigmatism) can be measured by examining the shapes of the contrast signal shown in FIG. 8. For example, the deformation and the inclination of the image are measured to determine the focus depth and the astigmatism.

Figure 10:
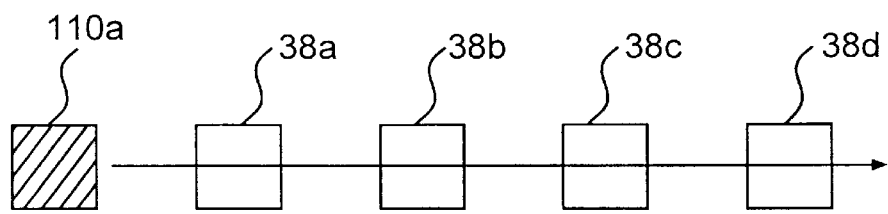
FIG. 10 is a schematic view showing an arrangement of aperture according to the first preferred embodiment.

In the embodiments above, the sensor 17 shown in FIG. 1 may be embedded into the stage 3, eliminating optical fibers. Also, multiple apertures 38a–38d may be formed on the fiducial plate 8 to scan the image of a single L/S mark 110a (FIG. 10) instead of having a single aperture 38 scan the multiple L/S marks as in the embodiments above.

As described above, according to the present invention, measurement errors due to difference in illumination system can be reduced or eliminated, since the focus position of the projection optical system is detected on the same illumination system as that for actual exposure. Also, since the mark used as a reference is formed on the mask, the image of the mark formed on the fiducial plate has the same resolution as that of the circuit pattern for exposure. In other words, since focus condition can be set for L/S mark designed at minimum line width on the mask (about 0.15 µm for an ArF excimer laser, and about 0.2 µm for a KrF excimer laser), errors in the detected focus position due to the difference in resolution between an L/S mark on a mask and an L/S mark on a fiducial plate does not occur.

Furthermore, since a plurality of L/S marks are placed on the mask such that the projected images of the L/S marks do not interfere with each other when an aperture on the fiducial plate scans the images, the fiducial mark can be elevated while scanning the images of the L/S marks. This considerably improves throughput.

Second Preferred Embodiment

Figure 11:
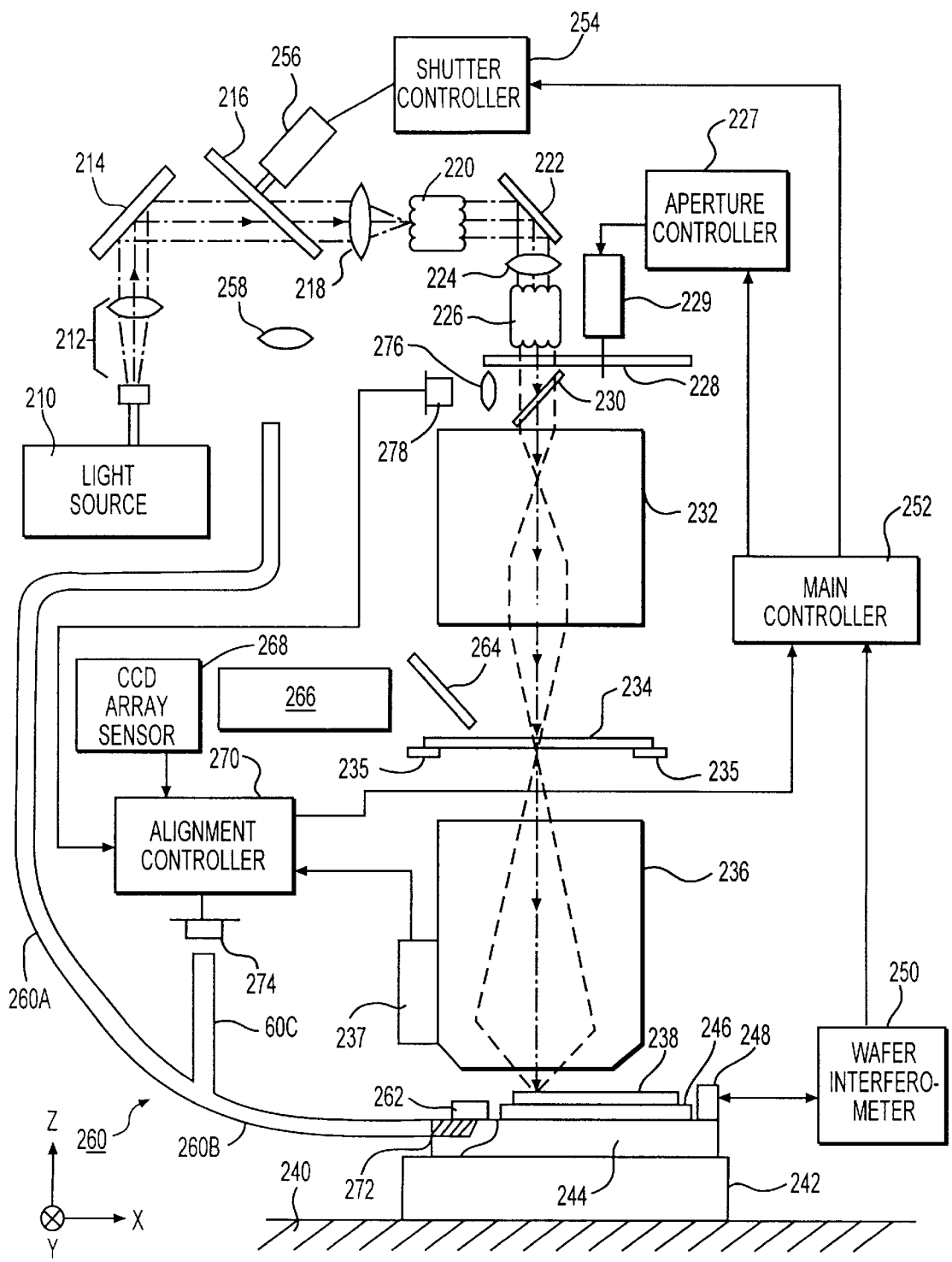
FIG. 11 is a schematic view of a projection exposure apparatus according to a second preferred embodiment of the present invention.

Referring to FIG. 11, the second preferred embodiment of the present invention is described. First, the structure of an exposure apparatus is explained. The exposure apparatus of the present embodiment has a similar construction to that of the first embodiment. Light emitted from a light source 210, such as a laser unit (KrF excimer laser, ArF excimer laser, or the like), a mercury lamp, or the like, is shaped into a light flux with a constant cross-section by a beam expander 212 and impinges on a mirror 214. The light reflected by the mirror 214 passes through a shutter 216 at the time of exposure and enters a lens 218. In lens 218, the light is condensed to have about the same size as the entrance face of a first fly-eye lens 220 and enters the lens 220.

The light coming out from the first fly-eye lens 220 is reflected at a speckle removal mirror 222, passes through a lens 224, a second fly-eye lens 226, a reticle blind (not shown), and a pupil illumination aperture 228, and reaches a half mirror 230. The light passing through the half mirror 230 enters an illumination optical system 232 and illuminates a reticle 234. The illumination optical system 232 is equipped with a relay lens, an imaging blind, a condenser lens etc. The reticle blind is installed in a position that is substantially conjugate with a pattern on the reticle 234 and shapes the light so that the illuminated region on the reticle has a predetermined shape (square, rectangular, or the like).

Through a projection lens 236 (projection optical system), a pattern on the reticle 234 is projected (transcribed) onto a wafer 238. Here, FIG. 11 shows the wafer position at the time of exposure. The wafer 238 is held on a wafer holder 246 installed on a Z-tilt stage 244. The Z-tilt stage 244 can be tilted and moved in the vertical direction and is mounted on an XY stage 242. The XY stage 242 is freely movable on a level block 240 by an air guide and a linear motor or the like (not shown). Further, the reticle 234 is mounted on a reticle stage 235, which is movable in a two dimensional plane (in the X and Y directions). A mobile mirror 248 fixed on the top of the Z-tilt stage 244 is engaged with a wafer interferometer 250 to monitor the position of the wafer 238 in the X direction (also in the Y direction). A controller 252 controls the position of the wafer 238 so that the pattern on the reticle 234 is repeatedly exposed onto the wafer 238 by so-called a step and repeat exposure scheme or step and scan exposure scheme.

To perform such exposure, it is necessary to align a pattern being exposed with the existing pattern on the wafer (alignment). Among others, the following two systems (alignment systems) are known: (1) an off-axis alignment optical system 237 which uses a sensor arranged outside the projection lens field and (2) a TTL alignment optical system which extracts the alignment light from between the projection lens and the reticle by a mirror and performs alignment. The off-axis alignment optical system 237 detects the position of a wafer mark on the wafer by comparing the image of the wafer mark with a predetermined index mark fixed to the optical system 237 through a CCD camera, as disclosed in Japanese Laid-Open Publication 05-21314.

In either case, it is necessary to coordinate a coordinate system fixed on the wafer stage (wafer coordinate system) and a coordinate system fixed on the reticle stage (reticle coordinate system). This operation will be referred to as coordinate system alignment.

It is also necessary to determine a base-line, i.e., a positional relationship between an alignment position (a reference point, for example) at which the alignment optical system performs alignment operation and the position of an exposure area (the center of exposure area, for example). This operation will be referred to as baseline check.

Highly accurate, high speed base line detection methods are described in- Japanese Laid-Open Publications No. 05-21314 and No. 07-176468. These methods utilize an absolute coordinate system fixed to a fiducial plate on the wafer stage. Also, an absolute coordinate system fixed to the wafer stage has been used in stage moving type baseline detection method.

I. Coordinate system alignment

First of all, two coordinate system alignment methods are described below. One method is performed under a condition different from that for exposure and another under the same condition as that for exposure are described below.

A. Coordinate system alignment method performed under a condition different from that for exposure (image processing system)

Figure 12A:
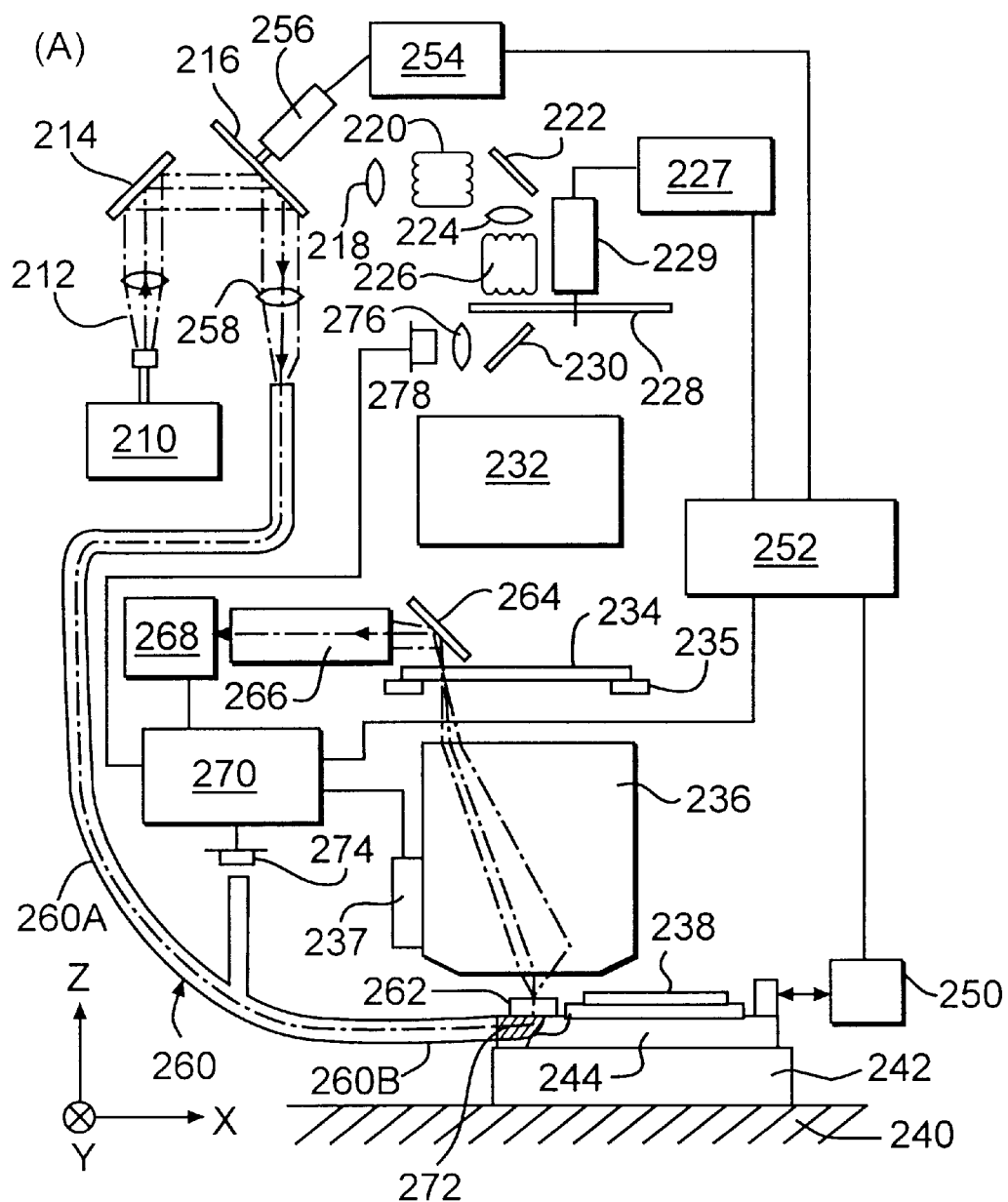
FIGS. 12A and 12B are a schematic views showing optical paths according to the second preferred embodiment.

First, an alignment method under a condition different from that for exposure using a CCD (Charge Coupled Device) is explained with reference to FIG. 12A. FIG. 12A shows a light path used for this alignment method. The overall construction of the exposure apparatus is the same as that in FIG. 11. Since this technique is explained in detail in the above mentioned Japanese Laid-Open Publications No. 05-21314 and No. 07-176468, only a concise explanation is given below. The above mentioned shutter 216 is driven by a shutter driver 256 through a shutter controller 254 to reflect the incoming light. The light reflected by the shutter 216 is guided to the fiducial plate 262 on Z tilt-stage 244 through a lens 258 and an optical fibers 260A, 260B, and illuminate the surface of the fiducial plate 262 from the bottom. Accordingly, a transparent portion of the fiducial plate 262 (fiducial plate marks 400,402 of FIG. 16B) emits light toward the reticle 234.

This light, which passed through the transparent portion, enters projection lens 236, illuminates an alignment mark on the reticle 234 (reticle mark 234A in FIG. 14), and is guided by mirror 264 to a CCD array sensor 268 through an alignment light receptor 266. In this way, the pattern of the transparent portion of fiducial plate 262 and the reticle mark are both imaged on the CCD array sensor 268. The image signals created at the CCD array sensor 268 are supplied to an alignment controller 270, and go through image processing after A/D conversion. Based on the processed result, the positional relationship between the reticle marks and the transparent portion of the fiducial mark is calculated, and the relative positional relationship between the reticle coordinates and the wafer stage coordinates is determined.

B. Coordinate system alignment under the same condition as that for exposure (scanning method)

Figure 12B:
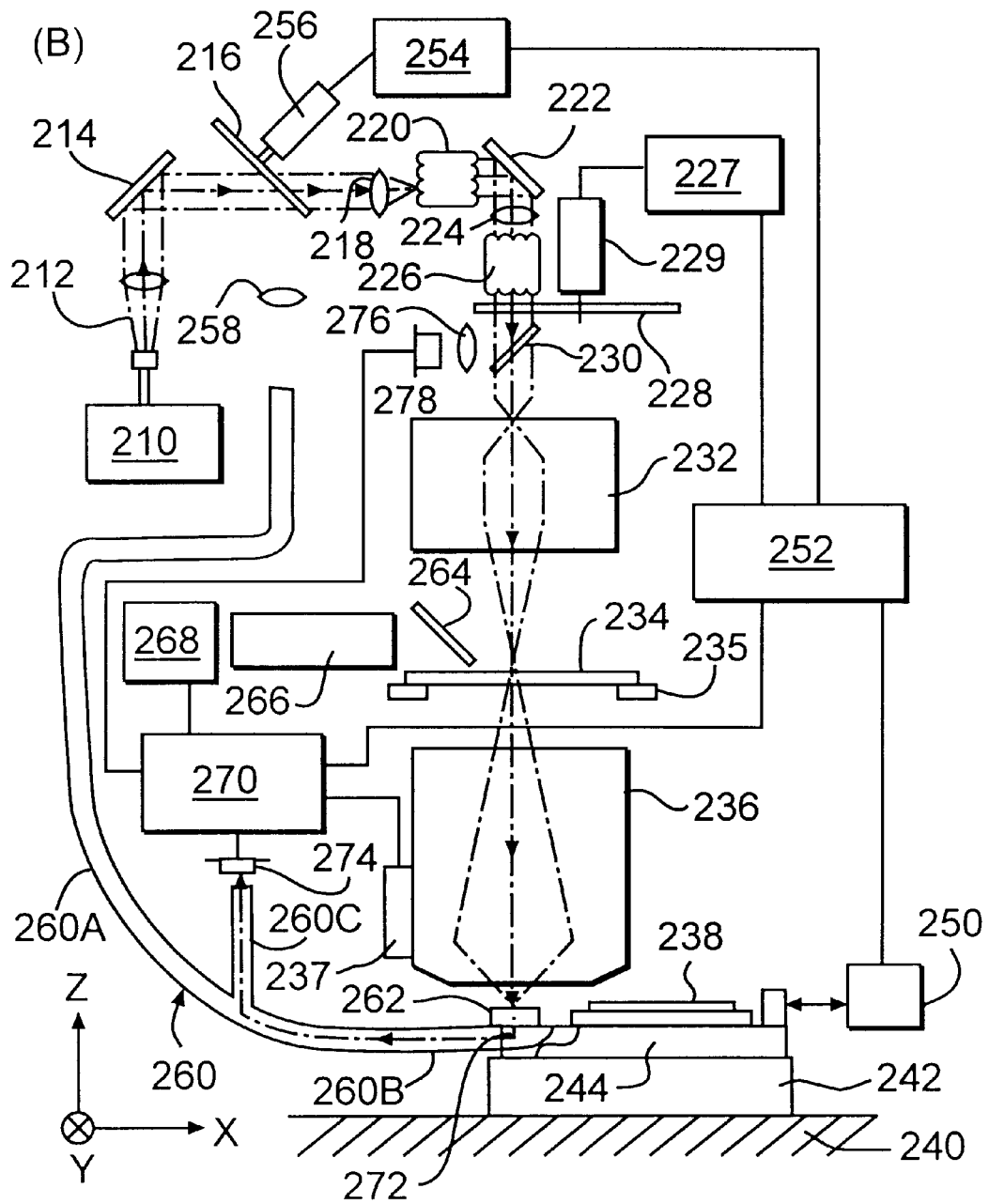

Next, an alignment method conducted under the same condition as that for exposure is explained. FIG. 12B shows a light path used for this alignment method. Using light emitted from illumination optical system 232, the alignment mark pattern on the reticle is projected onto the wafer. Then the projected image of the alignment mark pattern is scanned by an aperture formed on the wafer stage (or the aperture is scanned by the image), and the light that passes through the aperture is directed by a light receiving system 272 and optical fibers 260B, 260C to a photo sensor 274. The light received at the photo sensor 274 goes through the photoelectric conversion, and the output of the photo sensor 274 is supplied to the alignment controller 270.

A portion of the light coming through the pupil illumination aperture 228 is reflected at a half mirror 230 located in front of the illumination optical system 232 and is guided into an integrator sensor 278 through a lens 276. The amount of the light thus obtained is supplied to the alignment controller 270 to normalize the outputs of photo sensor 274 to eliminate fluctuation in light strength received at the photo sensor 274. In FIG. 12B, the light path in this alignment method is indicated with the arrows.

Figure 13:
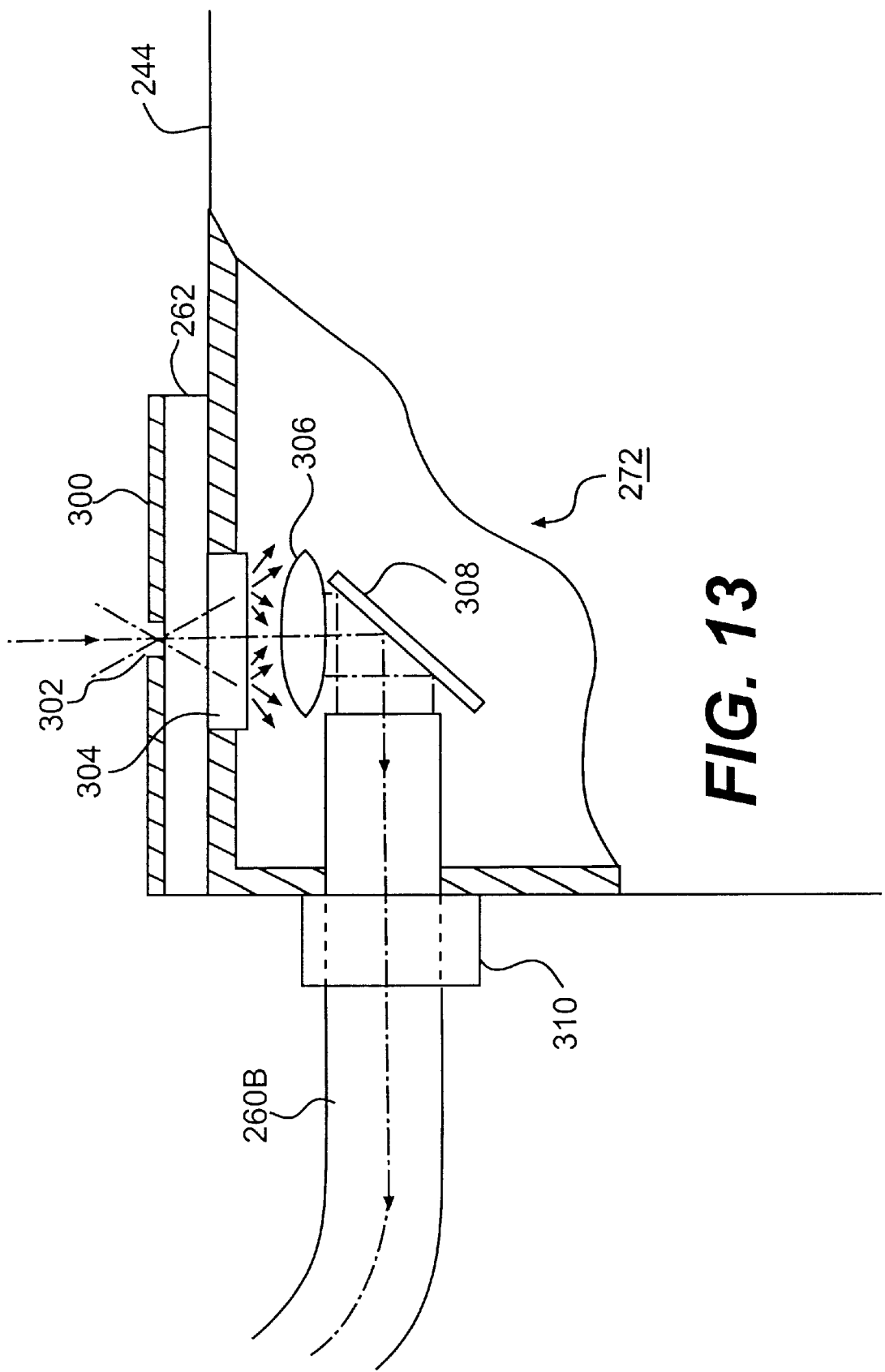
FIG. 13 is a cross-sectional view indicating the structure near a fiducial plate according to the second preferred embodiment.

First, the fiducial plate 262 and the light receiving system 272 are explained in more detail. FIG. 13 shows a cut-out portion of the wafer stage 244 including the fiducial plate 262 and the light receiving system 272. A low-reflective chrome portion 300 and an aperture 302 are formed on the surface of the fiducial plate 262. Light from the projection lens 236 enters the light receiving system 272 through the aperture 302. The light receiving system 272 is composed of a diffusion plate 304, a lens 306, a mirror 308. The light that passes through the receiving system is guided into an optical fiber 260B, which is fixed to the side of the Z-tilt stage 244 through a support 310.

The diffusion plate 304 is installed on the Z tilt stage 244 to guide the incident light to the lens 306 as much as possible. This is preferable because the NA (numerical aperture) of the projection lens 236 has a relatively large value of 0.6 during wafer exposure. The diffusion plate 302 is also effective to receive all the light scattered at aperture 302. If the lens 306 under aperture 302 has curvature and/or diameter large enough to receive all the scattered light and the diameter of the optical fiber can be accordingly increased, there is no need to employ the diffusion plate 304. However, in consideration of the compactness of the apparatus, it is advantageous to employ the diffusion plate 304. Moreover, instead of the optical fiber 260B, the light transmitted through aperture 302 can be guided to the outside of the stage 244 by relaying through optical elements.

As explained above, almost all the light that is coming from the above and passes through the aperture 302 progresses to the light receiving system 272 and optical fibers 260B, 260C, and eventually reaches the photo sensor 274.

Figure 14A:
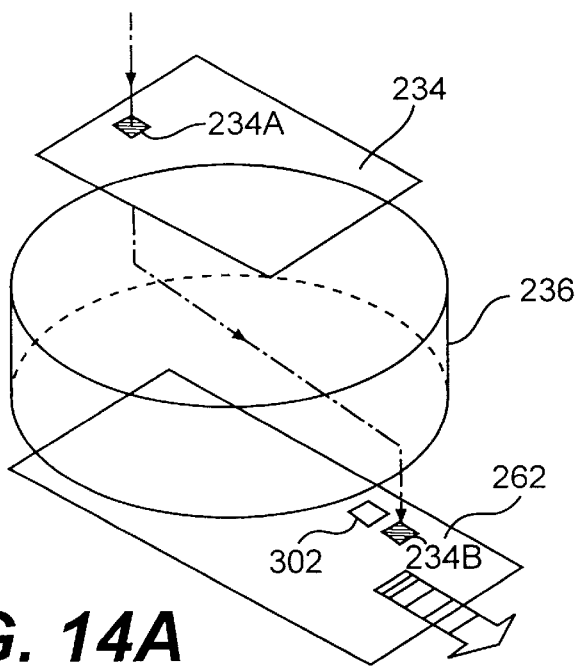
FIGS. 14A, 14B, 14C, and 14D are schematic views showing the alignment operation according to the second preferred embodiment.
Figure 14B:
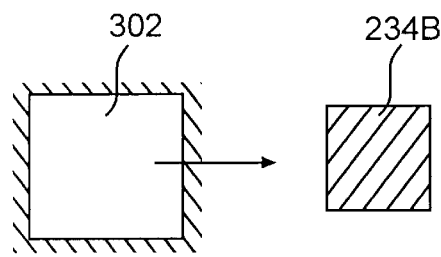
Figure 14C:
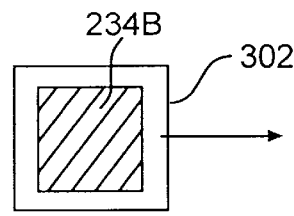
Figure 14D:
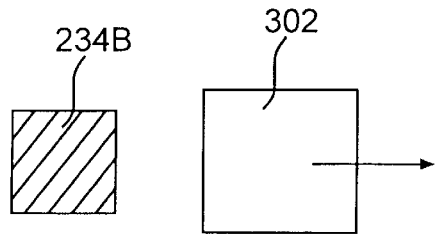

The image of a reticle mark on the reticle is formed on the fiducial plate 262 through the projection lens 236. The relationship between the image of the reticle mark and the aperture on the fiducial plate is described with reference to FIGS. 14A to 14B. FIG. 14A is a schematic perspective view showing the reticle 234, the projection lens 236, and the fiducial plate 262. A reticle mark 234A is illuminated by the light coming from the illumination optical system 232, and an image 234B of the reticle mark 234A is formed on the fiducial plate 262 through the projection lens 236. The aperture 302 is longer than the projected image 234B of the reticle mark 234A in the scanning direction. The aperture need not be wider than the image 234B in the non-scanning direction.

Suppose that the aperture 302 is moved in the direction shown in the arrow in FIG. 14A with respect to the image 234B by driving XY stage 242 (FIG. 11). Then, the position of the aperture 302 relative to the image 234B changes in a manner shown in FIGS. 14B to 14D. As shown in the figures, a portion of the image 234B initially overlaps with the aperture 302, the entire region of the image 234B then enters the aperture 302, and finally, the aperture 302 leaves the image 234B.

With reference to FIG. 12B, the light that defines the image 234B and passes through the aperture 302 is incident on the photo sensor 274 through the light receiving system 272 and optical fibers 260B, 260C, as described above. Signals that went through photoelectric conversion is supplied to the alignment controller 270. At the alignment controller 270, the amount of light received at the photo sensor 274 is sampled in synchronism with the scanning operation of the aperture 302 above. If a pulse laser, such as KrF laser or ArF laser is used as the illumination light source 210 (FIG. 11), the pulse timing of the laser is matched with the sampling timing of the output from photo sensor 274.

A portion of light from the illumination optical system 230 (normally less than 1%) is reflected at a half mirror 230 located in front of the illumination optical system 232. The reflected light is condensed by a lens 276 and is received at an integrator sensor 278. Thus obtained signal of the integrator sensor 278 is supplied to the alignment controller 270. At the alignment controller 270, the output signals go through A/D conversion and are used to normalize the signals obtained at the photo sensor 274 to eliminate fluctuation in the illumination light. In the case of the pulse laser light source, the fluctuation is removed pulse by pulse.

Figure 15A:
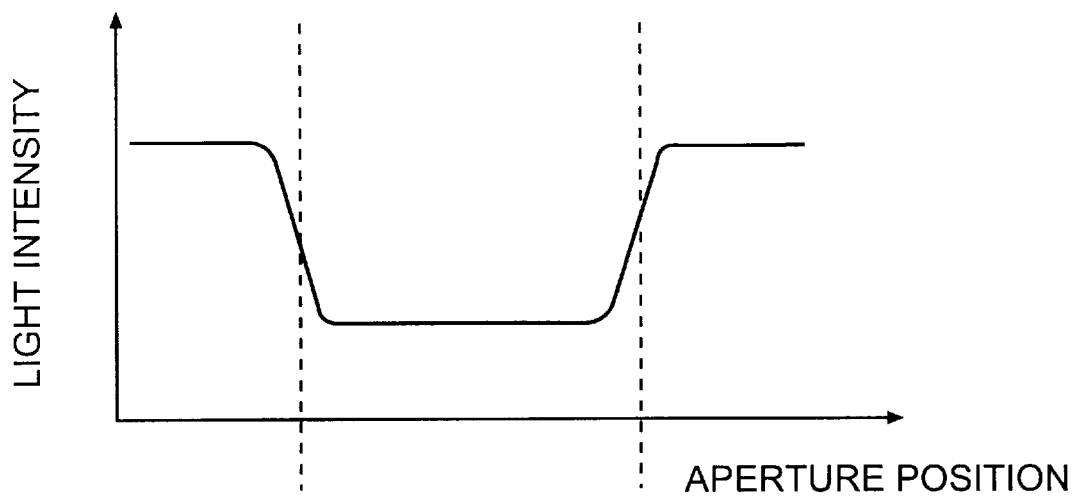
FIGS. 15A and 15B are graphs showing signals detected at a photo detector and a processed signal, respectively, according to the second preferred embodiment.
Figure 15B:
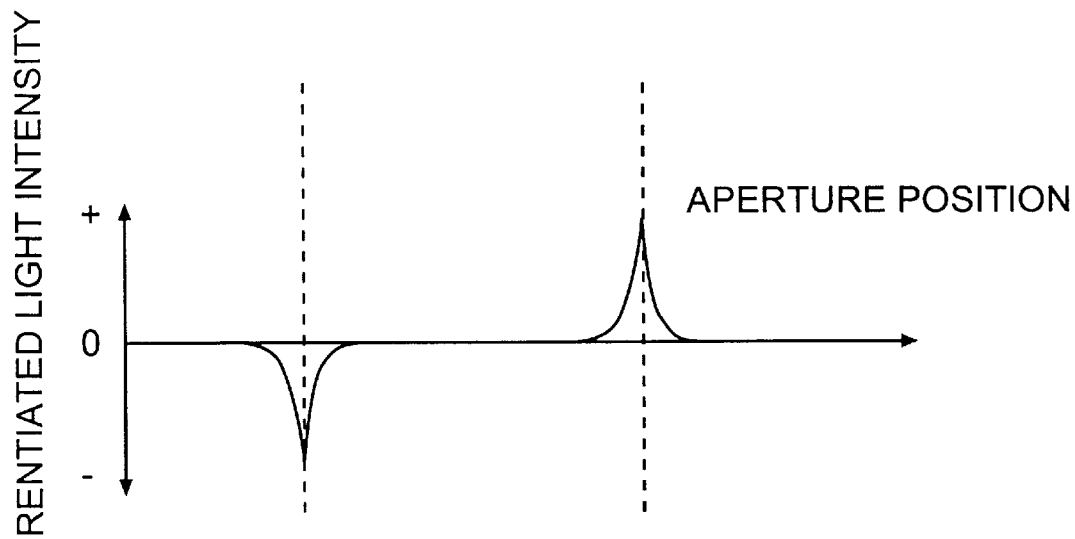

FIG. 15A shows the waveform of the signal received at photo sensor 274 after such normalization. As the aperture 302 moves in a manner shown in FIGS. 14B to 14C, the amount of normalized light detected at the photo sensor 274 decreases when the image 234B starts overlapping with the aperture 302, then reaches its minimum in the situation shown in FIG. 14C, and gradually increases afterwards. The differentiation of this waveform yields a waveform shown in FIG. 15B. Processing this differentiated signal, it is possible to determine the position of the image 234B of the reticle mark 234A relative to the wafer stage.

II. Baseline measurement

Next, baseline measurement (or calibration of the baseline) that uses both of the alignment methods described above is explained. An example of a baseline check is described in Japanese Laid-Open Publications No. 05-21314 and No. 07-176468. FIG. 16 shows a portion of the fiducial plate 262. The fiducial plate 262 has fiducial plate marks 400, 402 and an off-axis sensor mark 404 as well as aperture 302 described above. The fiducial plate marks 400, 402 are crisscross-shaped marks of light-emitting type, and are illuminated from the bellow by the illumination light provided through optical fiber 260D so that the positions thereof can be detected by CCD array sensor 268 together with the reticle mark 234A. A region 406 shows an example of the projected image of reticle 234.

According to a baseline measurement technique disclosed in the Japanese Laid-Open Publication No. 05-21314, when CCD array sensor 268 observes the reticle mark 234A together with the fiducial plate marks 400, 402, the off-axis sensor mark 404 is observed by an off-axis sensor 237 at the same time. This way, baseline measurement is completed at a time.

Recent development in device miniaturization has led to development of a new exposure technique: modified illumination (see Japanese Laid-Open Publication 04-225357, for example). The present embodiment is also equipped with such an option. Referring to FIG. 11, a pupil illumination aperture 228 has a plurality of diaphragms (aperture stops) having various opening diameters, an annular diaphragm having an annular opening, and an oblique diaphragm having a plurality of openings at positions eccentric to the optical axis of the illumination system. By switching the pupil illumination aperture 228 through an aperture controller 227 and an aperture driver 229, it is possible to shape the illumination flux to be suitable for small a illumination, annular illumination, or oblique illumination, etc.

Using this modified illumination, deeper focus depth can be obtained for L/S mark exposure. The same effect can be obtained for contact hole exposure if combined with focus control. The distortion (of the focused image in the illumination light) may, however, change depending on the illumination condition. This means that the detected signal at the CCD array sensor 268 may include errors due to the difference in the optical system for exposure and that for the measurement (alignment). In other words, it is difficult to match the NA of the alignment light receiving system 266 and the illumination condition of fiducial mark 400, 402 with the corresponding quantities of optical systems 232, 236 for exposure when using modified illumination (exposure) or other special illumination technique. Therefore, the changes in the minimum line width caused by the modified illumination technique cannot be detected by the alignment light receiving system 266. (The alignment light receiving system 266 does not have enough resolution because of its small NA.)

In this embodiment, aperture 302 is formed on the fiducial plate 262 to detect the position of the aperture 302 relative to the reticle under the same condition as that for exposure. This is done by observing the image of the reticle mark 234A as described above. Then, the baseline measurement is calibrated.

A. Arrangement of reticle marks

In a batch exposure method, in which the entire pattern of a reticle is projected onto the wafer at a time while both the wafer and the reticle are halted, the fiducial mark 400 is arranged adjacent to the projected image of the reticle mark 234A. Then, mirror 264 (and alignment light receptor 266) or the reticle 234 itself is moved by a small amount so that CCD array sensor 268 can observe the reticle mark 234A in its view.

In the case of scan exposure, in which exposure is performed by scanning the reticle and the wafer in predetermined directions, the reticle 234 moves by a large amount in the scanning direction. Therefore, as long as there are a plurality of reticle marks 234A along the moving direction, they need not be adjacent to the fiducial mark 400.

B. Light emission type measurement (image processing type)

Next, the light emission type detection method introduced above is explained in more detail for the purpose of applying the method to calibration of the baseline measurement. First, reticle mark 234A is moved inside the view of the CCD allay sensor 268, and wafer stages 242 and 244 are moved so that aperture 302 is aligned with the image of the reticle mark 234A. Here, the exposure light (or a laser pulse in the case of a pulse laser light source) output from light source 210 is reflected at a shutter 216, guided along the path shown in FIG. 12A, and is output from the aperture 302 (FIG. 17A). The light coming through the aperture 302 illuminates the reticle pattern 234A and forms an image on CCD array sensor 268. FIG. 18A shows this image. In this figure, the image of the aperture 302 is superimposed onto the image of the reticle mark 234A.

Figure 18B:
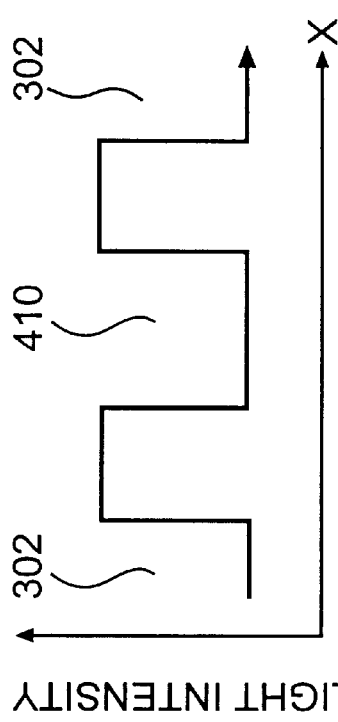
FIGS. 18A, 18B, and 18C are drawings showing operation of a stage emitting type alignment method according to the second preferred embodiment.
Figure 18C:
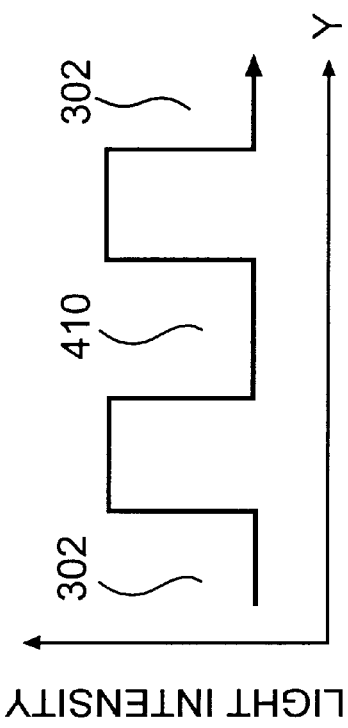
Figure 18A:
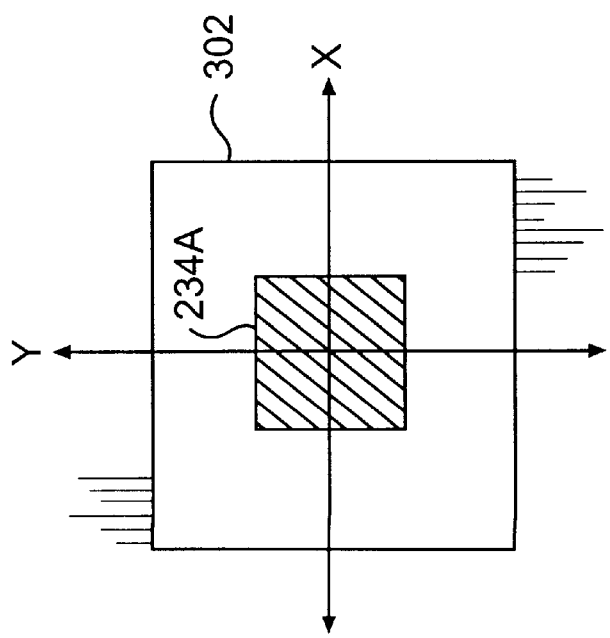

FIGS. 18B and 18C plot the amount of light in the detected image of FIG. 18A taken on the X-axis and Y-axis of FIG. 18A, respectively, as one-dimensional picture information. In the figures, the recessed center portion of the waveform indicates a portion where the reticle mark 234A blocks the incoming light. On both sides of the recessed portion is open areas where the incoming light is not blocked. Detecting the position of the edges in these waveforms, the displacement $\Delta a$ of the reticle mark 234A relative to the aperture 302 is derived and is stored in the alignment controller 270. The displacement $\Delta a$ is obtained for each of the X and Y directions.

C. Light receiving type alignment method (scanning type method)

Next, a measurement method using a light receiving scheme is explained. The basic operation of this alignment method was already given above with reference to FIGS. 14A to 14D and 15A, 15B. As explained above, this method utilizes the light path shown in FIG. 12B, and accordingly, as it is, the entire field of view of the projection lens would be illuminated. Therefore, the illumination field need be limited by an imaging blind (not shown) installed in the illumination optical system 232 so as to illuminate only the aperture 302 and the surrounding chrome portion 300 (FIG. 13) in the vicinity thereof (FIG. 17B).

In the case of a pulse light source, such as an excimer laser, the above method is performed as follows. Initially, light source 210 is turned off, and shutter 216 is opened so that illumination light can pass through the shutter. Subsequently, reticle mark 234A is moved to the position shown in FIG. 19A, and then the light source 210 is turned on to send laser pules. The amount of light detected at photo sensor 274 is sampled at the alignment controller 270 in synchronism with the laser pulse timing and the stage movement timing. The resultant waveforms of signals in the X and Y directions are shown in FIGS. 19B and 19C, respectively.

From the positions of the edges of the aperture 302 and the reticle mark 234A, the relative displacement $\Delta b$ between the aperture and the reticle mark is derived and stored in the alignment controller 270. The displacement $\Delta b$ also has two components: X and Y components.

D. Calibration of the baseline measurement

Next, calibration of baseline measurement using the displacements $\Delta a$ and $\Delta b$ is described. As described above, the displacement $\Delta a$ is detected using the light emission type image processing detection system (FIG. 12A), and the displacement $\Delta b$ is detected using the light-receiving type scanning detection system (FIG. 12B). Since the optical systems differ from each other, $\Delta a$ and $\Delta b$ may also differ from each other. In other words, the difference between $\Delta a$ and $\Delta b$ represents an offset amount by which the light-emission-type image processing detection system need be calibrated. In practice, the value of the baseline detected using the image processing system above need be corrected by an amount $\Delta = \Delta b - \Delta a$ at the alignment controller 270. Accordingly, it becomes possible to perform baseline measurement that is capable of handling the modified illumination scheme described above.

Figure 26:
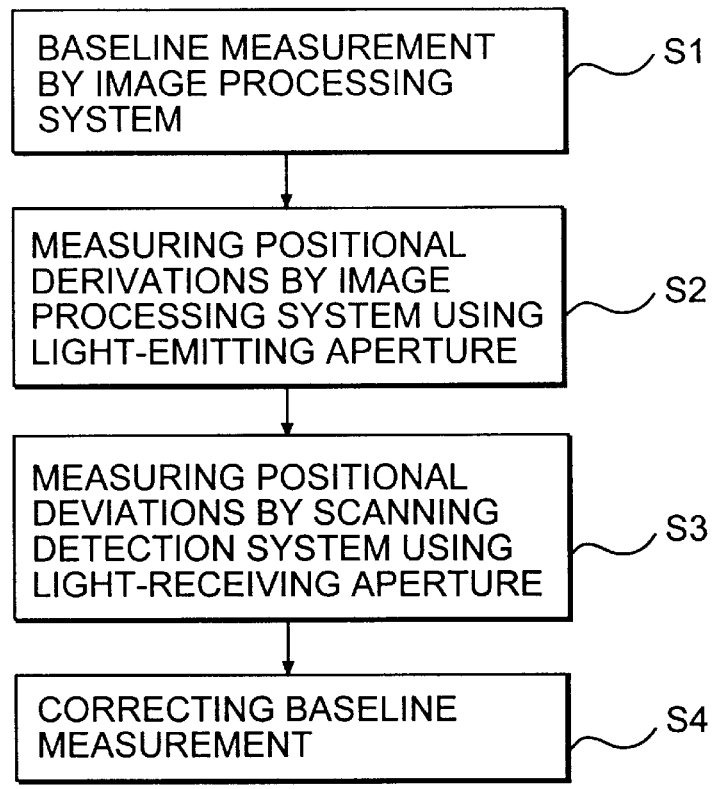
FIG. 26 is a flow chart showing a calibration method of a baseline measurement method according to the second preferred embodiment.

FIG. 26 shows an example of the flow chart according to this embodiment. First, using the image processing detection system, the baseline between the illumination system and the off-axis alignment system is measured under the condition different from that for exposure (step S1). Next, using the image processing detection system again, the amount of misalignment between the wafer stage (or wafer) and the reticle is measured (step S2). Subsequently, using the scanning detection system, the amount of misalignment between the wafer stage (or wafer) and the reticle is measured under the same illumination condition as that for exposure (step S3). Finally, the value of the baseline obtained in the step S1 is calibrated by comparing the amounts of misalignment in the step S1 and the step S3.

According to the present embodiment, it becomes possible to conduct highly accurate, high speed base line measurement that can incorporate deviations in the measurement due to the modified illumination scheme, resolution difference, or the like, while maintaining high reproducibility and high speed processing in the conventional method described in Japanese Laid-Open Publication No. 05-21314 and No. 07-176468.

In addition, since the light incident on the wafer stage is relayed to the outside of the stage through optical fibers and is received at an outside sensor (there is no sensor attached directly to the wafer stage), it is possible to prevent undesirable drift caused by temperature change, which would occur if illumination light directly illuminates the sensor. Also, because a diffusion plate is installed to guide the incident light flux with a high NA into the optical fiber, the fiber diameter can be made small, and the optical system can be simplified.

Furthermore, because the aperture and the fiducial marks are formed on a single fiducial plate and the optical system underneath is so arranged as to be usable for various measurements or detections, space on the wafer sage can be efficiently utilized.

Third Preferred Embodiment

In the second preferred embodiment above, the present invention is applied to calibration of the baseline measurement. Since the present invention utilizes the differentiated signals of processed light under the same condition as that for exposure, as described above, this invention is applicable for observing the minimum pattern or the like with high accuracy and at high speed. The following examples embody such applications.

Figure 20A:
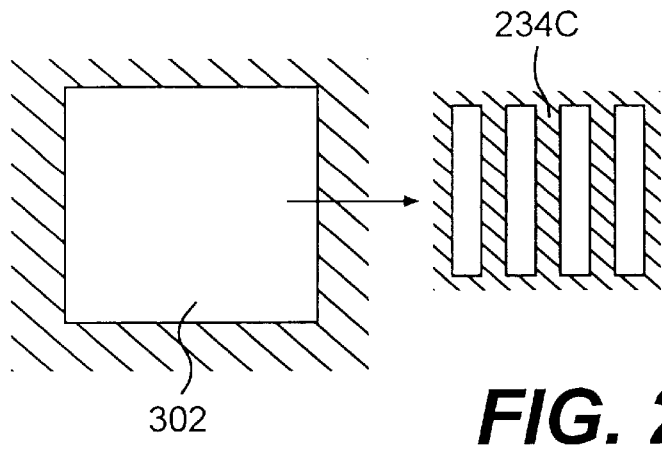
FIGS. 20A, 20B, and 20C are schematic drawings showing operation of a third preferred embodiment of the present invention.
Figure 20B:
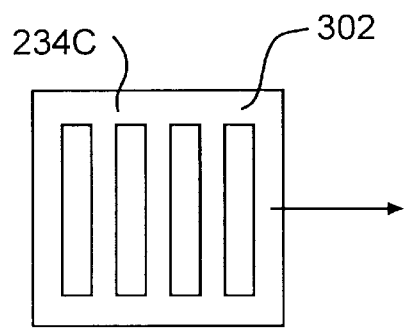
Figure 20C:
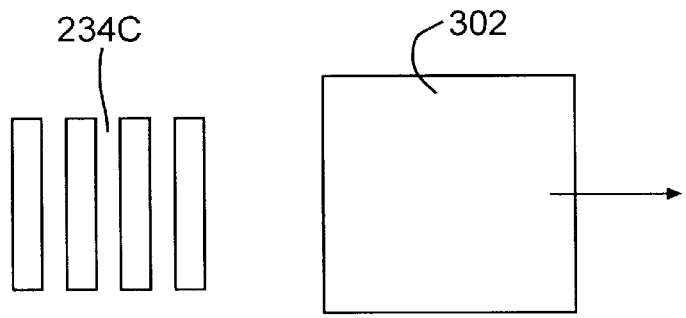

In contrast with the second embodiment, this embodiment utilizes a line-and-space pattern (L/S pattern) as the reticle pattern 234A on the reticle 234. FIGS. 20A to 20C show spatial relationships between the aperture 302 and the projected image 234C of the L/S pattern on the reticle when the aperture 302 scans the projected image 234C. This projected image 234C is an L/S (line and space) mark with 0.15–0.25 μm line width (the finest pattern for this particular exposure apparatus, for example), and the aperture 302 is wider than the projected image 234C in the scanning direction. Although the aperture 302 need not be longer than the projected image 234C in the non-scanning direction (vertical direction), the aperture 302 is preferably long enough or short enough in the non-scanning direction so that the upper and lower edges of the aperture cannot affect the measurement.

Figure 21A:
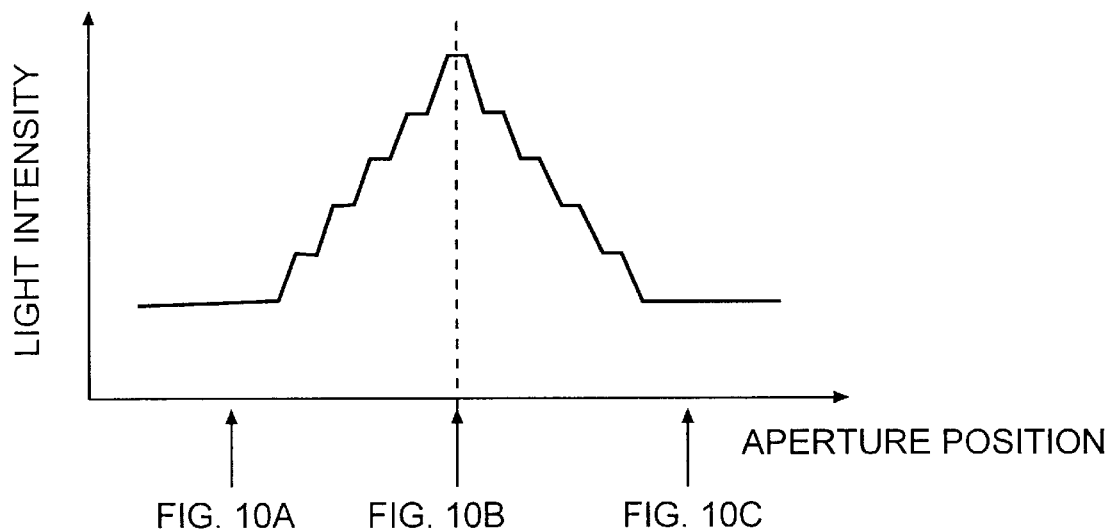
FIGS. 21A and 21B are graphs showing signals detected at a photo detector and a processed signal, respectively, according to the third preferred embodiment.

In this embodiment, the aperture 302 relatively scans the L/S pattern image 234C in the horizontal direction as shown in FIGS. 20A to 20C. As the scan proceeds from the situation of FIG. 20A to that of FIG. 20C, the amount of light that can pass through this superimposed pattern increases stepwise, reaching the maximum at the condition shown in FIG. 20B and then decreases stepwise. This situation is plotted in FIG. 21A. FIG. 21A shows the amount of light that passes through the superimposed pattern versus the position of the aperture 302.

Figure 21B:
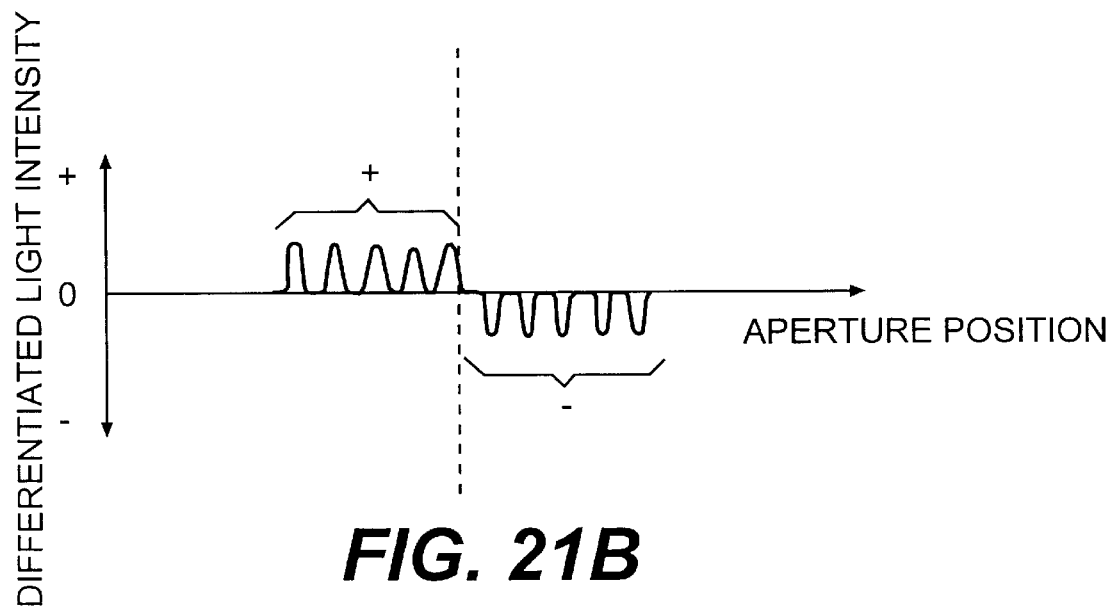

Furthermore, if the wave-like signal S100 of FIG. 21A is differentiated, a differentiated signal as shown in FIG. 21B is obtained. As compared with FIG. 15B, several edges are obtained in this method. Using these edges, it is possible to improve the position measurement accuracy. In general, a down slope and an up slope are obtained for the respective edges of aperture 302 as shown in FIG. 21A. However, since the image aberration may differ for each edge, improvement in accuracy is possible by using both data (averaging the heights of the peaks) in the differentiated signal from the up slope+signal in FIG. 21B and that from the down slope−signal in FIG. 21 B, or obtaining the L/S width (average of the widths of the+signal peaks and−signal peaks). However, when aberration need be obtained by examining the difference of+signal and−signal, these signals are separately handled and processed.

Figure 22A:
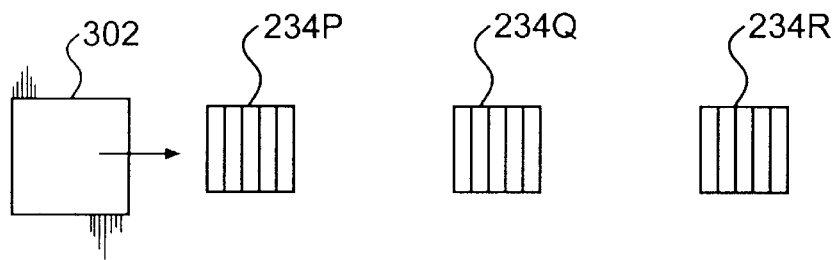
FIG. 22A, 22B, 22C, and 22D are drawings showing the relationship between the images of reticle marks and an aperture the fiducial plate according to the third preferred embodiment.
Figure 22B:
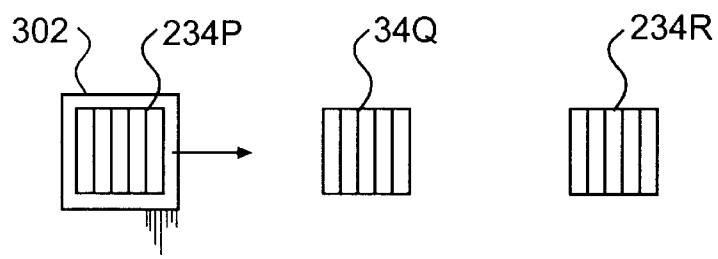
Figure 22C:
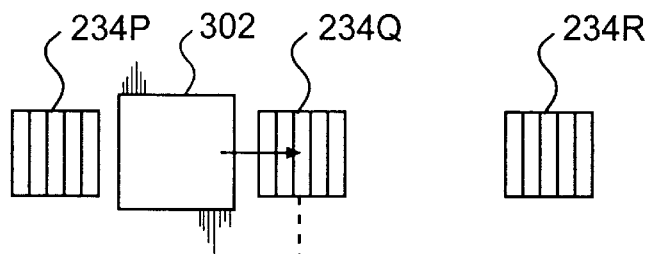
Figure 22D:
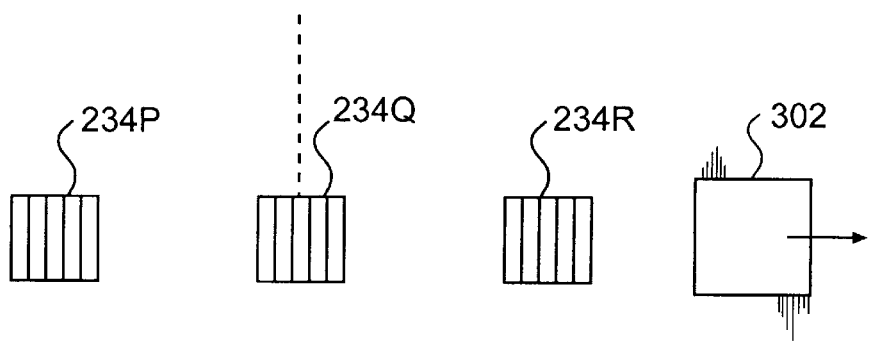

Although there is only one L/S mark on the reticle in FIG. 20, it is possible to dispose multiple L/S marks on the reticle. FIG. 22A to 22D show the spatial relationship between aperture 302 and the multiple images 234P, 234Q, 234R of such multiple L/S marks. In this case, the image 234P, 234Q, 234R are relatively scanned by the aperture 302 as shown in FIGS. 22A to 22D. In FIGS. 22A to 22B, spacing of the images 234P, 234Q, 234R of the L/S marks in the scanning direction (horizontal direction) is wider than the aperture 302 so that the aperture 302 does not overlap with two projected images at a time. Thus, separate waveform signals for each image can be obtained.

Figure 23A:
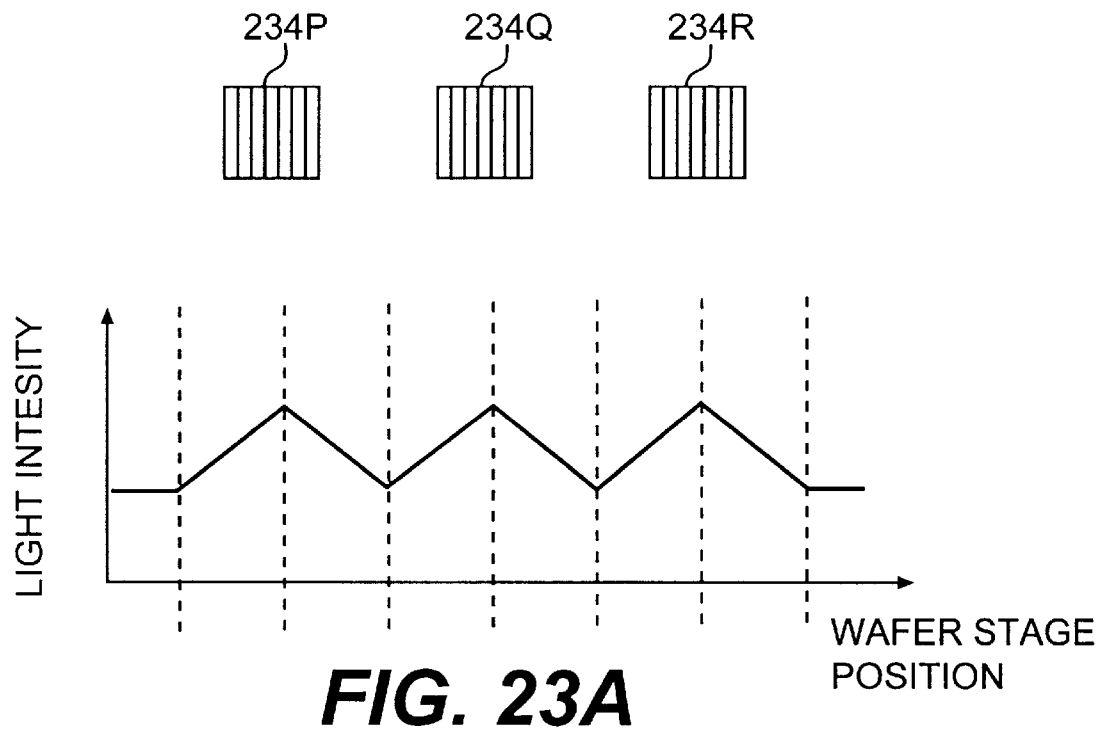
FIGS. 23A and 23B are graphs showing signals detected at a photo detector and a processed signal, respectively, according to the third preferred embodiment.
Figure 23B:
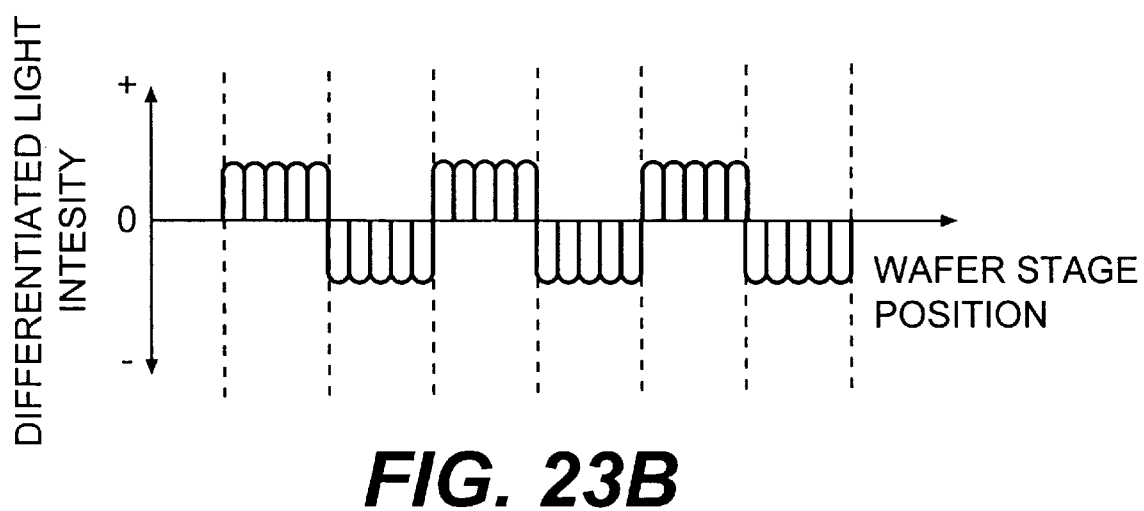

FIG. 23A shows the signal obtained by scanning the images 234P, 234Q, 234R. FIG. 23B indicates the derivative of the waveform in FIG. 23A. Since a plurality of signals are used to determine the position of the edges, alignment accuracy (or position measurement accuracy) can be improved.

In general, a photo multiplier that can receive only a very small amount of light is used as sensor 274. Therefore, if a long L/S mark is scanned by a long aperture, the dynamic range in the measurement becomes small, which may result in an insufficient S/N ratio. This problem does not occur in this example since a plurality of L/S marks are used and scanned at a time. Also, throughput can be improved as compared with the case where a single L/S mark is repeatedly measured to improve the accuracy. This also helps to minimize errors caused by fluctuation in alignment that may occur over time.

Figure 27:
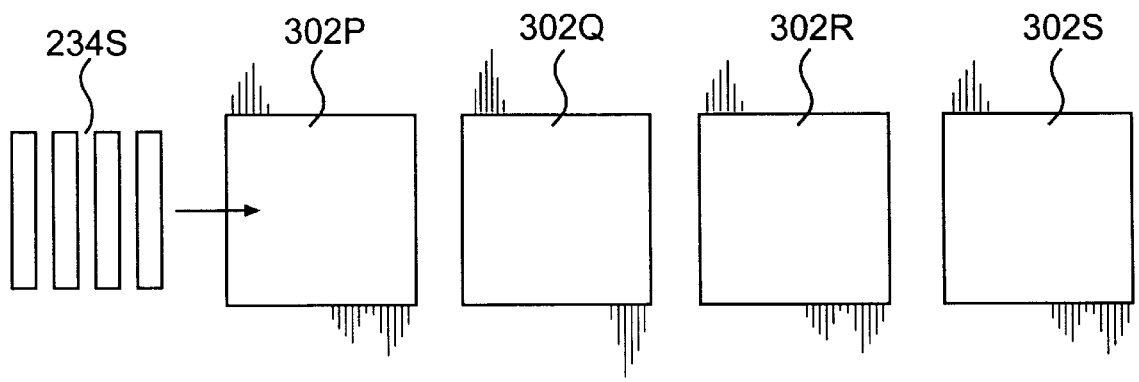
FIG. 27 is a drawing showing an example of arrangement for an aperture and the image of the alignment mark according to the third preferred embodiment.

As described above, the spacings of multiple L/S marks and the size of the aperture are optimized. Thus, by scanning the images of a plurality of the L/S marks by an aperture at a time and averaging the resultant signals, it becomes possible to conduct highly accurate, high speed wafer-and-reticle alignment (or position detection). Also, as shown in FIG. 27, multiple apertures 302P, 302Q, 302R, 302S may be formed on the fiducial plate to scan the image of a single L/S mark 234S. In this case, however, it is necessary to form the image of a L/S mark on the chrome portion and regard this mark as a reticle mark to improve the S/N ratio.

Figure 24A:
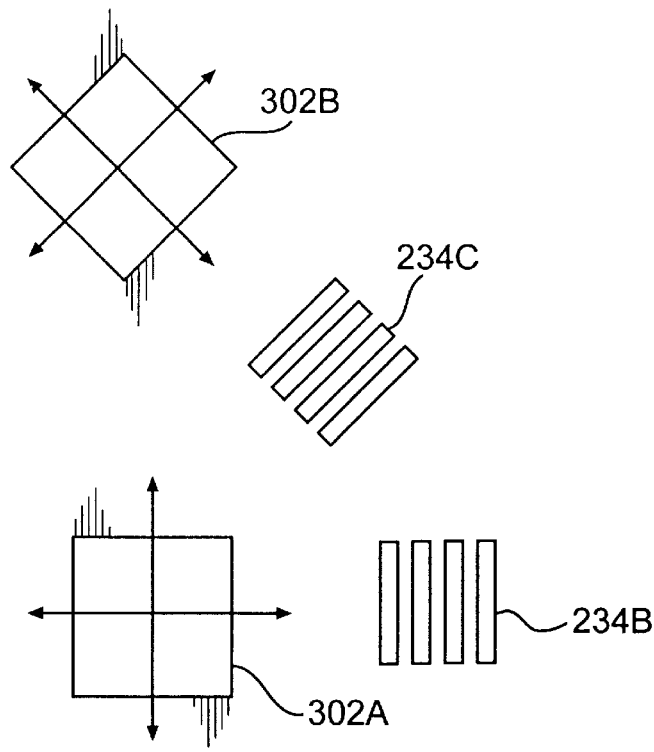
FIGS. 24A, 24B, and 24C are drawings showing examples of different type of apertures according to the third preferred embodiment.

While the aperture on the fiducial plate was rectangular in the above embodiment, it is possible to use other shapes as well. In the example in FIG. 24A, two apertures 302A and 302B are arranged. Aperture 302A corresponds to the above mentioned aperture 302, and aperture 302B has a rectangular shape and inclined by 45 degrees in relation to aperture 302A. Using this type of separated rectangular apertures, the projection images of L/S marks extending in the 0°, 45° and 90° directions can all be measured.

Figure 24B:
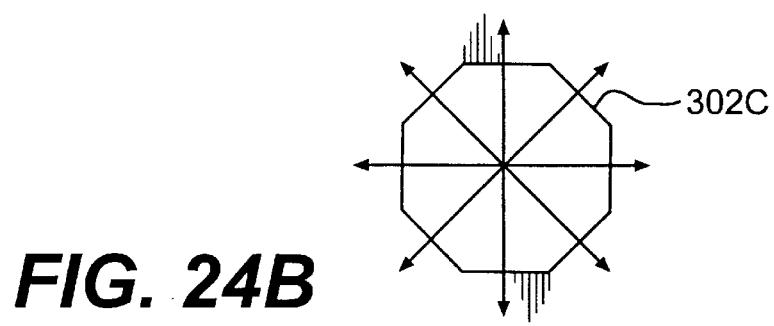
Figure 24C:
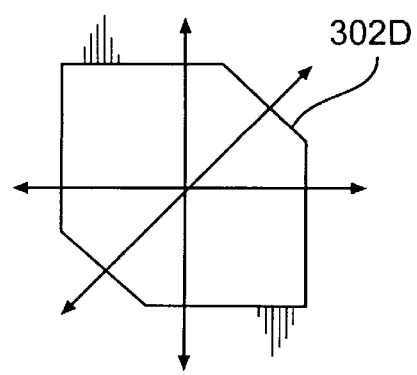
Figure 25:
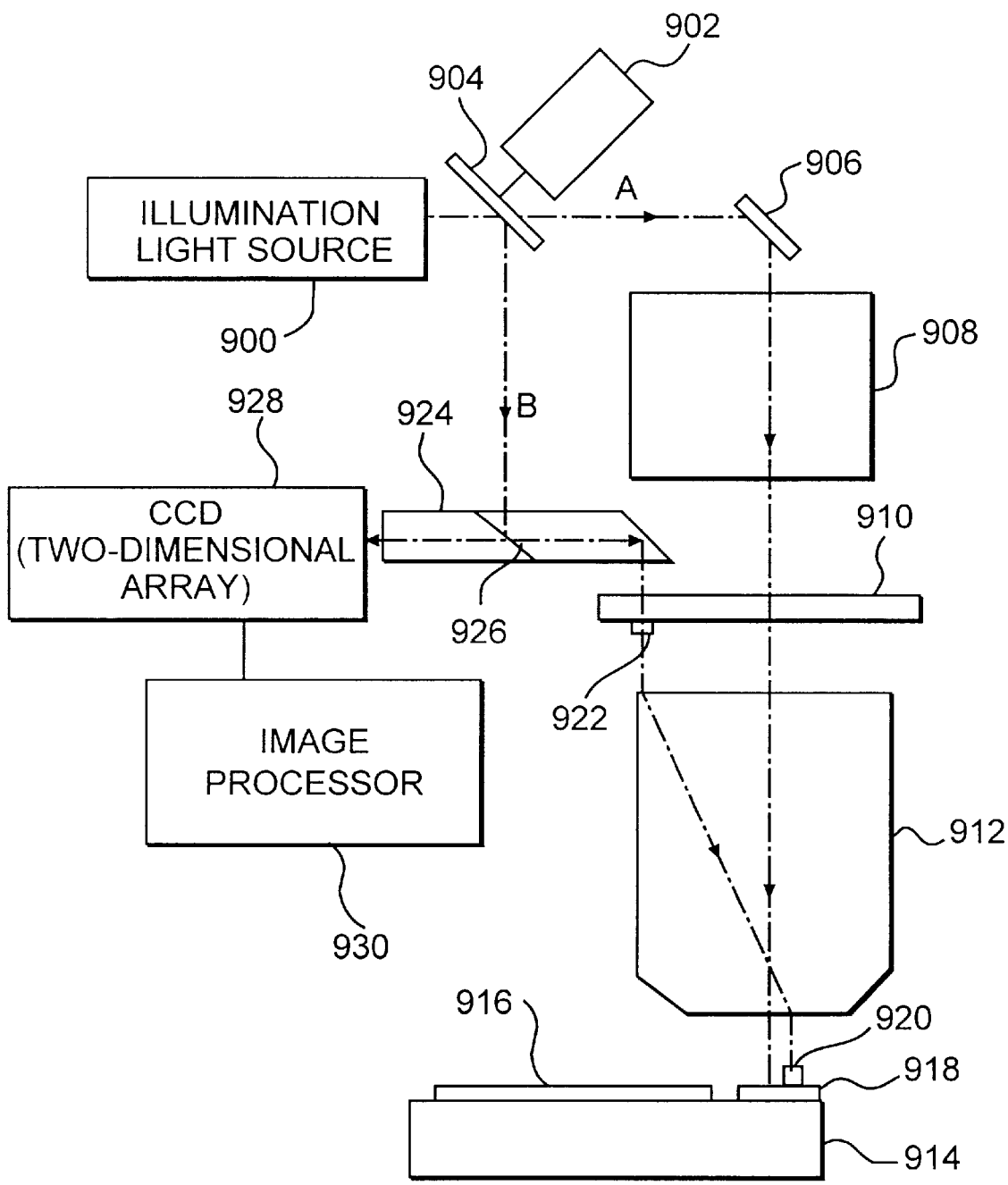
FIG. 25 is a schematic view of a conventional exposure apparatus.

FIGS. 24B and 24C show other examples of aperture. The aperture 302C has a regular octagon shape, and the aperture 302D is a deformed hexagon shape. In a similar manner to above, the projection images of L/S reticle marks extending in various directions corresponding to the edges of the apertures can be measured. Also, by measuring 45° L/S mark 234C using these apertures, the averaged projection image between the X-direction component and the Y-direction component in position measurement can be performed with one time scan. Accordingly, the step of averaging separately measured X and Y components in the previous embodiment can be omitted. Also, this method can reduce the undesirable effect of difference in astigmatism between the X and Y directions Because there are situations where finer patterning is necessary for 20° and/or 30° degree directions, it is preferable to form patters that extend in directions other than 0°, 45°, and 90° patterns and the corresponding apertures.

By optimizing the arrangement of the reticle mark and the shape of the aperture in this way, high speed, highly accurate measurement, i.e., distortion measurement and reticle mark multi-measurement become possible.

This invention can be effected in many forms, and based on the disclosure made above, modification into many different variations is possible. For example, the following possibilities are included 1) In the above mentioned scanning operation, either the reticle is moved with respect to the spatially fixed wafer stage, or the wafer stage is moved with respect to he spatially fixed reticle.

2) If the absolute coordinates of the wafer stage 242, 244 are not reliable due to a time lag between the displacement measurement of light-emitting type shown in FIG. 17A and the displacement measurement of light-receiving type shown in FIG. 17B, the mark 404 is disposed so as to be located below the off-axes alignment system 237 at the position of the opening part 302. Then, wafer-stage servo operation is performed by LIA (laser interferometer alignment), for example, to smoothly stop the wafer stages 242, 244. The rest of driving operations are achieved by driving the reticle mark 234A, which can be stably driven by the amount corresponding to the projection magnification. This way, the time lag problem above is solved.

3) Since the above-mentioned reticle mark 234A is equivalent to the bold isolated line, the distortion of the reticle mark 234A may be different from that of fine isolated lines (or that of L/S) even if the reticle mark 234A is positioned at the same place as fine isolated lines (or L/S). In this case, the CCD array sensor 268 cannot detect the distortion because the position measurement of light-emitting type shown in FIG. 17A does not have enough resolution when using the reticle mark 234A or the like. To avoid this difficulty, the reticle mark 234A is measured at each condition of FIGS. 17A and 17B, and successively, the reticle mark 234A is replaced by the L/S mark corresponding to the projection image 234C. The displacement measurement of light-receiving type shown in FIG. 17B is then conducted for the L/S mark to obtain a displacement amount Ac. On the basis of Δa, Δb, and Δc, the differences in distortion due to line width can be derived.

Reticle marks such as 234A were so far treated as not having high resolution. However, because CCD allay sensor 268 can detect the faint contrast difference near the outer edges of reticle mark 234A, it becomes possible to measure the positional deviations Δa and Ac using these edges.

4) In the above embodiments, the light-relay mechanism for directing the illumination light diffused at diffusion plate 304 toward the outside of the wafer stage, and the light-relay mechanism for guiding the exposure light to the aperture 302 are both composed of optical fiber 260. This can be replaced by a relay optical system having a plurality of lenses.

In this invention, along with the first L/S mark which is arranged on the reticle side, there is a light reception capable aperture, larger than the above mentioned first L/S mark, arranged on the wafer side. By relatively scanning the above mentioned aperture and the projected image created when the exposure illumination light is radiated on the above mentioned L/S mark, the relative positional relationship between the reticle side and the wafer side is measured. Also, by disposing a plurality of projection images of the L/S marks or a plurality of apertures in the scanning direction, or by angularly forming the aperture in relation to the edge of the mark, highly accurate position measurement becomes possible.

Moreover, in this invention, there are provided two detectors for position measurements: a first detector optically measuring the position of the mask relative to the mask stage using a first optical path that is substantially the same as an exposure optical path to be used in exposing the pattern on the mask onto the wafer; and a second detector optically measuring the position of the mask relative to the wafer stage using a second optical path that is different from the exposure optical path. In addition, there is a controller processing signals from the first and second detectors to calibrate the second detector so that the precise position of the mask determined by the signal from the first detector can be derived by the signal from the second detector. Since the second detector does not require complicated optical mechanism, it becomes possible to perform high-accuracy baseline measurement. In addition, even when the exposure illumination condition is changed in the exposure apparatus, the second detector can be properly calibrated by the first detector using the same illumination condition, accommodating such a change in illumination condition or the like. Therefore, according to the present invention, it becomes possible to perform high-speed, highly-accurate baseline measurement and reticle alignment.

Fourth Preferred Embodiment

A fourth embodiment of a projection exposure apparatus of the present invention is described referring to the drawings. In this embodiment, the present invention is applied to a step-and-scan projection exposure apparatus.

Figure 28:
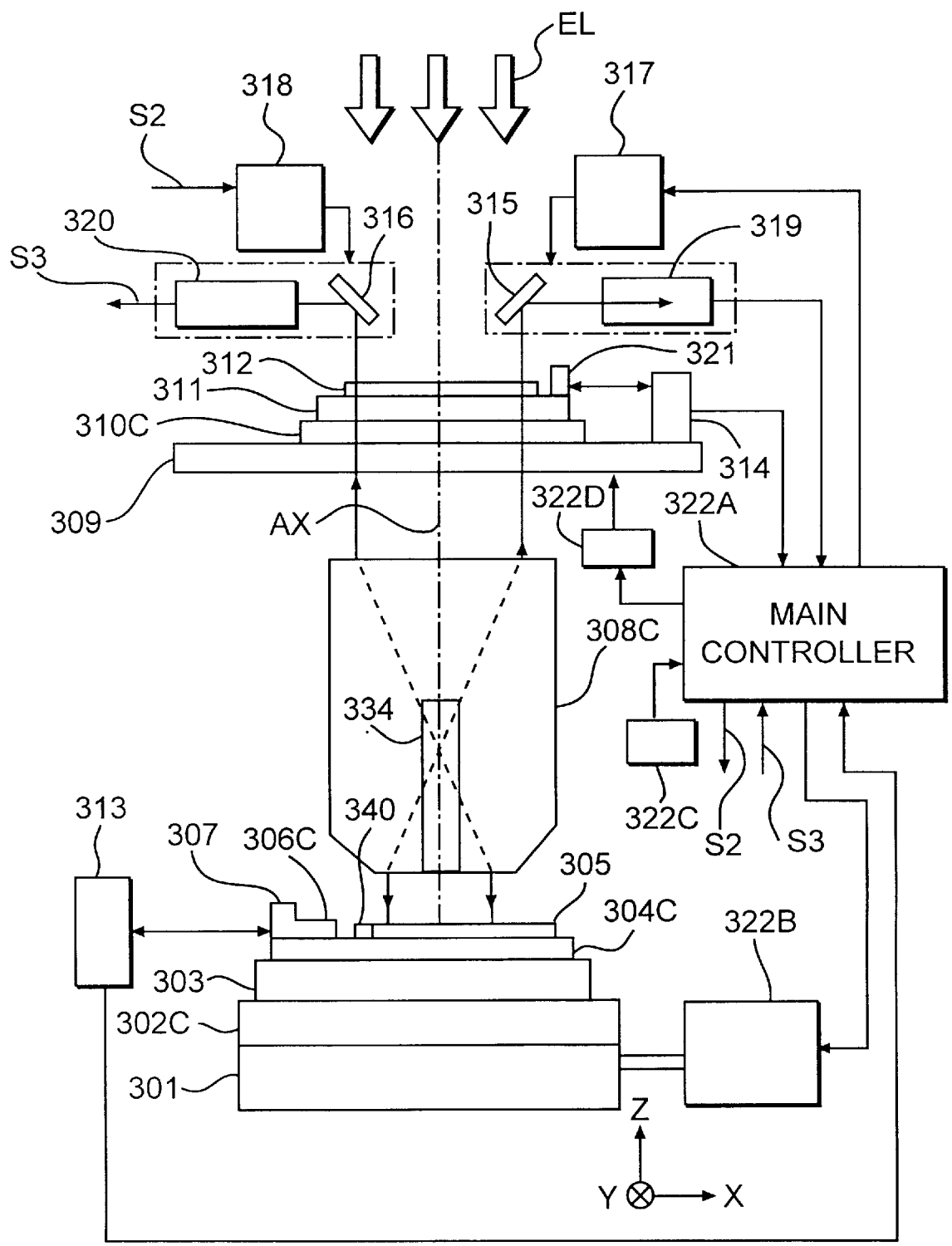
FIG. 28 is a schematic view showing a configuration of a projection exposure apparatus according to a fourth preferred embodiment.

FIG. 28 shows the projection exposure apparatus of the present invention. The exposing light EL from an illumination optical system (not illustrated) illuminates a pattern on the reticle 312 within a rectangular illumination area (hereinafter referred to as the slit-like illumination area) to project the pattern image via the projection optical system 308c onto the wafer 305 coated with photoresist. The exposing light source EL may be the i-line light (365 nm wavelength) of a mercury lamp, a KrF excimer laser (248 nm wavelength), a ArF excimer laser (193 nm wavelength), a metal evaporation laser, or the harmonic component of a YAG laser.

At the same time, the reticle 312 is scanned forwardly in the negative Y direction (or backwardly) to the page as seen in FIG. 28 at a constant speed, V, with respect to the slit-like illumination area for the exposing light EL; the wafer 305 is synchronously scanned backwardly in the positive Y direction (or forwardly) to the page as seen in FIG. 28 at a constant speed, V/M (I/M is a reduction ratio of the projection optical system 8 whose value is for example ¼, ⅕, etc.). The present embodiment is described by referring to the axes defined as follows: the Z-axis, which is parallel to the optical axis AX of the projection optical system 308c; the X axis, which is parallel to the plane perpendicular to the Z axis; and the Y axis, which is perpendicular to the page as seen in FIG. 28.

First, a stage system for the reticle 312 and the wafer 305 is described. The reticle support 309 is loaded with the following: a reticle Y axial driving stage 310c, which is movable in the direction parallel to the Y axis (Y direction); a reticle micro-driving stage 311 on the reticle Y axial driving stage 310c; and a reticle 312, which is held on the reticle micro-driving stage 311 by a vacuum chuck or the like The reticle micro-driving stage 311 controls the alignment of the reticle 312 in the X, Y, and rotational θ direction by driving the reticle Y axial driving stage by a minute amount with high accuracy. The mobile mirror 321 is arranged on the reticle micro-driving stage 311 to constantly monitor the positions in the X, Y, and 0 direction of the reticle micro-driving stage 311 by a laser interferometer 314 installed on the reticle support 309. Note that the mobile mirror 321 represents two mobile mirrors orthogonal to each other; the laser interferometer 314 represents a three axes laser interferometer (FIG. 29B). The positional information obtained by the laser interferometer 314 is supplied to a main controller 322A which governs all the operations of the entire apparatus. The main controller 322A controls the reticle Y axial driving stage 310c and the reticle micro-driving stage 311 via the reticle driving system 322D. The reticle stage is constructed with the reticle support 309, the reticle Y axial driving stage 310c, and the reticle micro-driving stage 311.

On the other hand, the wafer support 301 is loaded with the following: a wafer Y axial driving stage 302c, which is movable in the Y axial direction; a wafer X axial driving stage 303, which is movable in the X axial direction on the stage 302c; a Z-θ axial driving stage 304c on the stage 303; and a wafer, which is held on the stage 304c by a vacuum chuck or the like. A mobile mirror 307 is fixed on the Z-θ axial driving stage 304c also to monitor the positions in the X, Y, and θ directions of the Zθ axial driving stage 304c by a laser interferometer 313 arranged externally. The positional information obtained by the laser interferometer 313 is also supplied to the main controller 322A. The mobile mirror 307 represents two mobile mirrors orthogonal to each other; the laser interferometer 313 represents a four axes laser interferometer (See FIG. 29A). The main controller 322 controls the alignment operation of the wafer Y axial driving stage 302c, the wafer X axial driving stage, and the Zθ axial driving stage 304c via the wafer driving system 322B. The wafer stage is constructed with the wafer support 301, the wafer Y axial driving stage 302c, the wafer X axial driving stage 303, and the Zθ driving stage 304c .

To coincide the wafer coordinate system, which is defined by the coordinate measured by the laser interferometer 313 on the wafer side, with the reticle coordinate system, which is defined by the coordinate measured by the laser interferometer 314 on the reticle side, a fiducial mark plate 306c is fixed in the vicinity of the wafer 305 on the Zθ axial driving stage 304c. The height of the surface of the fiducial mark plate 306c is the same as the that of the wafer 305, and various fiducial marks are formed on the surface as described later. The mobile mirror 307 and the fiducial mark plate 306c of this embodiment are made of glass-ceramics (for example, ZERODUAR: Schott company's trade name) whose linear expansion coefficient is smaller than that of quartz. Note that glass-ceramic has a very small linear expansion coefficient, but has a transmission coefficient with respect to the i-line of a mercury lamp and excimer laser (exposing light normally used), therefore, it is not suitable for transmitting the exposing light. Also, the mobile mirror 307 and fiducial mark plate 306c may be integrated by any of the following techniques; (1) the mobile mirror 307 and the fiducial mark plate 306c may be molded integrally using an identical material; (2) the mobile mirror 307 and the fiducial mark plate 306c may be separately molded and adhesively attached together; (3) the mobile mirror 307 and the fiducial mark plate 306c may be molded separately, and then, for example, the fiducial mark plate 306c may be fixed to the mobile mirror 307 by a vacuum chuck or the like; and (4) the mobile mirror 307 and the fiducial mark plate 306c may be molded separately, and then, for example, the fiducial mark plate 306c can be press-bonded to the mobile mirror 307.

In this embodiment, a pair of reticle alignment systems 319, 320 are arranged above the reticle 312. Each reticle alignment system 319 (or 320) includes a downward emission illumination system for illuminating the mark to be detected using illumination light of the same wavelength as that of the exposing light EL, and an alignment microscope, which captures the image of the mark to be detected. The alignment microscope includes an imaging optical system and an image pick-up device. Guide mirrors 315, 316 are movably arranged for guiding the detection light form the reticle 312 to each of the reticle alignment system 319, 320. When an exposure sequence begins, the main controller 322A commands that the mirror driving devices 317, 318 retract the guide mirrors 315, 316 outside the optical path of the exposing light EL. In addition, an alignment sensor 334(wafer alignment sensor or substrate alignment sensor), which processes images in the off-axial technique for monitoring an alignment mark (wafer mark) on the wafer 305, is arranged at the Y direction side of the projection optical system 308c.

Figure 29A:
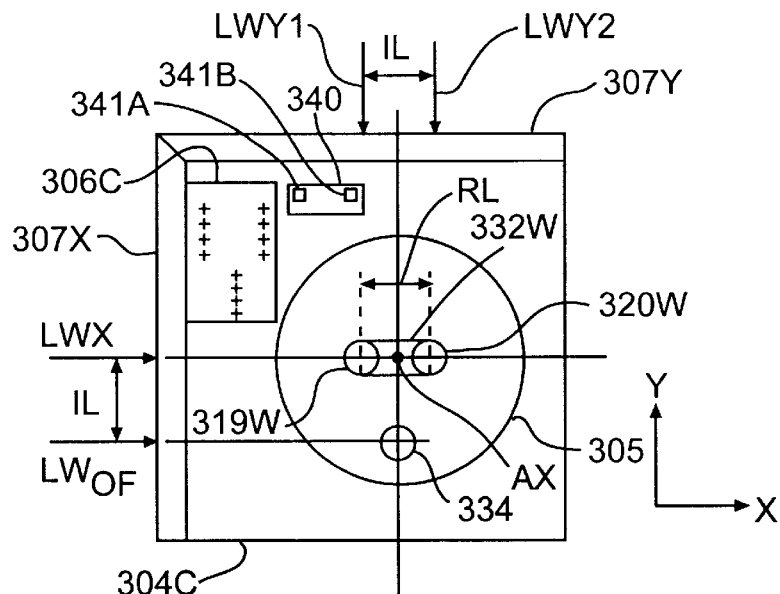
FIG. 29A is a plan view of a wafer stage in FIG. 28.
Figure 29B:
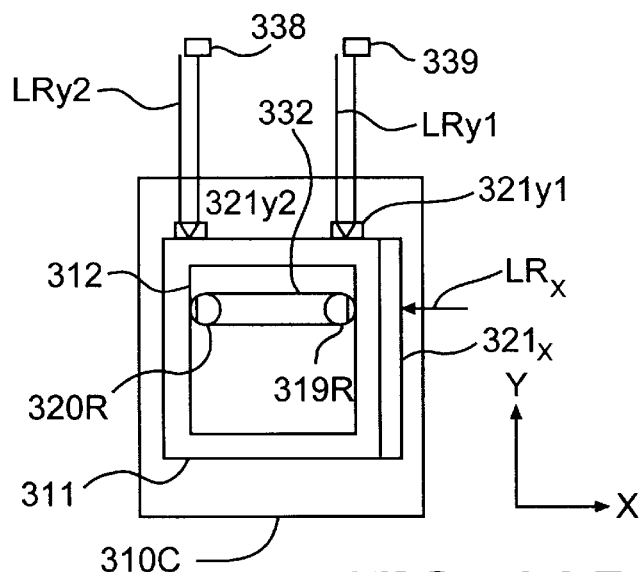
FIG. 29B is a plan view of a reticle stage in FIG. 28.

Next, the laser interferometer on the reticle stage side and that on the wafer stage side are described referring to FIGS. 29A and 29B. FIG. 29A is a plan view of the wafer stage. In FIG. 29A, the fiducial mark plate 306c is fixed in the vicinity of the wafer 305 on the Zθ axial driving stage 304c. Also, mobile mirror 307X extending in the Y direction and a mobile mirror 307Y extending in the X direction are attached at the ends of the negative X direction and the positive Y direction of the Zθ driving stage 304c. The fiducial mark plate 306c is formed integral with the mobile mirror 307X. In addition, a partial image of the pattern of the reticle 312 is projected onto the slit-like exposure area 332W on the wafer 305. Observation areas 319W and 320W at both ends of exposure area 332W also work as the observation areas for the reticle alignment systems 319,320 in FIG. 28.

Two parallel laser beams LWX and $LW_{of}$, which are parallel to the X axis and separated by a distance IL, are emitted to the mobile mirror 307X along the optical axis AX of the projection optical system 308c and an optical path that goes through the detection center (reference point) of the alignment sensor 334. In addition, two laser beams LWY1 and LWY2 are emitted such that each of them is along the optical path parallel to the Y axis. Laser beams LWX, $LW_{of}$, LWY1, and LWY2 are supplied from the interferometer corresponding to the laser interferometer 313 in FIG. 28. For exposure operation, the coordinate value XW, which is obtained from the interferometer using the laser beam LWX, is used for the X coordinate of the Zθ driving stage 304c. The average value of the coordinate values Y1, Y2, YW(= Y1+Y2)/2 is used for the Y coordinate where Y1 and Y2 are obtained from the interferometer using the laser beams LWY1 and LWY2. Also, the rotation angle (deviation amount in the e direction) of the Zθ axial driving stage 304c is calculated, for example, based on the difference between the coordinate values, Y1 and Y2. Based on these coordinates, the position of the XY plane and the rotation angle for the Zθ axial driving stage 304c are controlled.

Using the average value of the measurement results of the two interferometers, measurement errors, which may be caused by the air fluctuation during scanning and exposing, is reduced in the Y direction (scanning direction) by the averaging effect. In addition, when using the off-axis alignment sensor 334, the position in the X direction is controlled to avoid generating so-called "Abbe errors," based on the measurements performed by the interferometer, which specifically uses the laser beam $LW_{of}$. Such a coordinate system (XW, YW), which consists of XW, the X axis, and YW, the Y axis, of the wafer stage measured by the laser interferometer 313, is called a "wafer coordinate system."

FIG. 29B is a plan view of the reticle stage. In FIG. 29B, the reticle micro-driving stage 311 is installed on the reticle Y axial driving stage 310c, and reticle 312 is held on the reticle micro-driving stage 311. At the ends of the positive X direction and the positive Y direction of the reticle micro-driving stage 311 are attached a mobile mirror 321 X, which moves along the X axis and extends in the Y direction, and the two mobile mirrors 321y1 and 321y2, which move along the Y axis. To the mobile mirror 321 X, the laser beam LRx is emitted such that it is parallel to the X axis; to the mobile mirrors 321y1 and 321y2, the laser beams LRy1 and LRy2 are emitted such that each of them is parallel to the Y axis. The laser beams LRx, LRy1, and LRy2 are supplied from the interferometer 314 in FIG. 28. As in the same manner as the wafer stage, the average value of the coordinate values y1 and y2, YR (=(y1+y2)/2 is used for the Y coordinate of the reticle micro-driving stage 311 where y1 and y2 are the values obtained from the two interferometers which use the laser beams LRy1 and LRy2. The coordinate value XR, which is obtained from the interferometer using the laser beam LRx is used for the X coordinate of the reticle micro-driving stage 311. Also, the rotation angle deviation in the θ direction is calculated, for example, based on the difference between the coordinate values y1 and y2. Such coordinate system (XR, YR), which consists of XR, the X axis and YR, the Y axis of the reticle stage measured by the interferometer 314 is called a "reticle coordinate system."

In this case, corner cubic type reflective elements are used for the mobile mirrors 321y1 and 321y2 in the Y direction, which is the scanning direction. The laser beams LRy1 and LRy2 reflected at the mobile mirrors 321y1 and 321y2 are reflected again at reflection mirrors 338 and 339, respectively, and return in their incoming path. The interferometer, which is attached on the Y direction side of the reticle, is a double path interferometer, and the laser beam is not displaced even when the reticle micro-driving stage 311 rotates. Also, the exposing light EL is emitted to the slit-like illumination area on the reticle 312. Observation areas 319R and 320R of the reticle alignment system 319, 320 are placed at both ends of the illumination area 332. The illumination area 332 is also conjugated with the exposure area 332W on the wafer 305 in FIG. 29A. The observation areas 319R and 320R are also conjugated with the observation areas 319W and 320W on the Zθ axial driving stage 304c on the wafer side in FIG. 29A. Therefore, in the present invention, the reticle 312 and the Zθ axial driving stage 304c of FIG. 29A can be observed via the observation areas 319R and 320R.

Figure 29C:
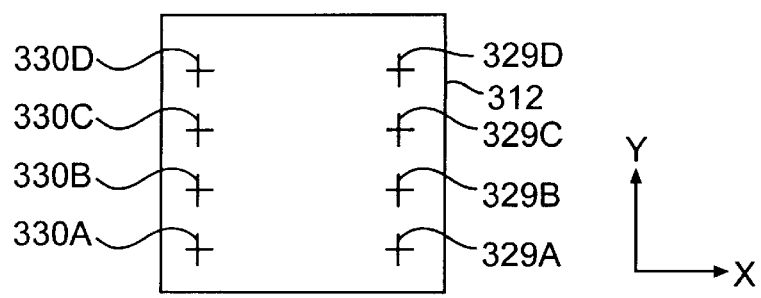
FIG. 29C is a plan view showing the arrangement of alignment marks on a reticle according to the fourth preferred embodiment.
Figure 30A:
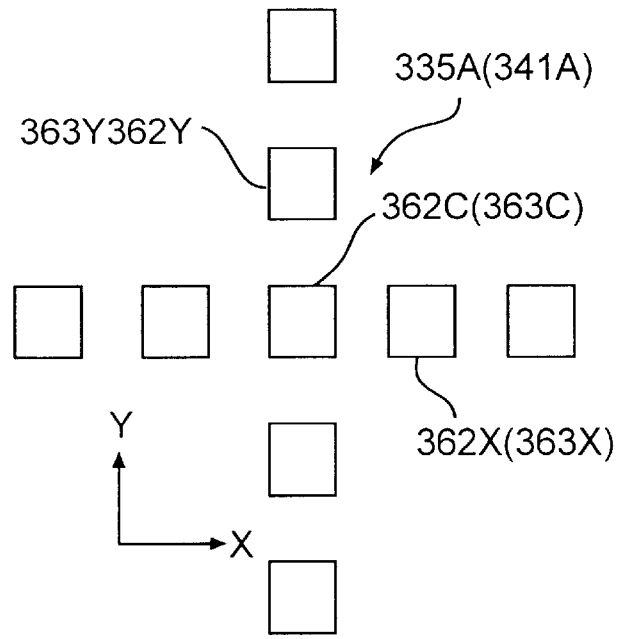
FIG. 30A is a magnified plan view of a fiducial mark 335A and an aperture 341A for a spatial image sensor according to the fourth preferred embodiment.
Figure 30B:
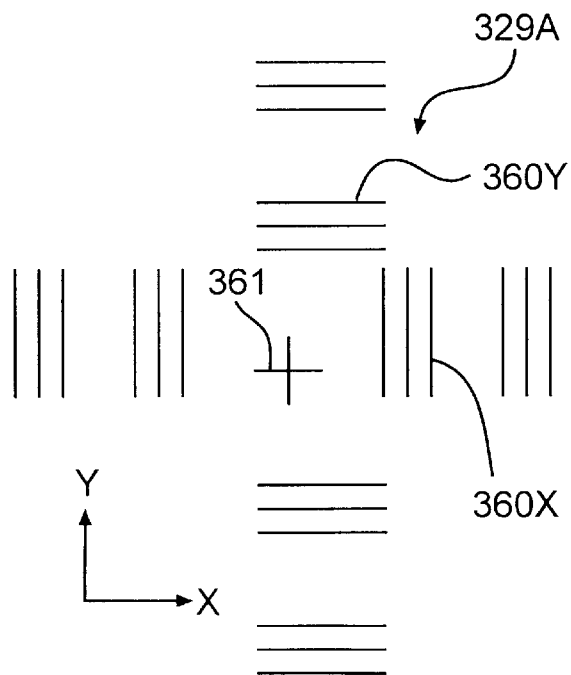
FIG. 30B is a magnified plan view showing the alignment mark 329A on the reticle according to the fourth preferred embodiment.

Next, the alignment marks and fiducial marks used for reticle alignment and base line check in the projection exposure apparatus of this embodiment is described. FIG. 29C shows the arrangement of the alignment marks (reticle marks) formed on the reticle 312. In FIG. 29C, the identical alignment marks 329A through 329D are formed at one end of the reticle 312 at the positive X direction side along the Y direction at a constant pitch. The alignment marks 330A through 330D are formed at the other side of the reticle 312 on the negative X direction side such that they are in symmetry with the alignment marks 329A through 329D. By scanning the reticle 312 in the Y direction, each of the groups of alignment marks 329A through 329D and 330A through 330D are observed within the observation areas 319R and 320R in FIG. 29B. As shown in FIG. 30B, in which this arrangement is magnified, the alignment mark 329A is a multi-mark which includes the reflective (light shielding type as viewed from the wafer stage) crisscross pattern 361 formed on the light transparent background, four base patterns 360X which sandwich the crisscross pattern 361 in the X direction, and four base patterns 360Y which sandwich the crisscross pattern 361 in the Y direction. The base pattern 360X is a line and space pattern in which the line-shaped reflective patterns extending in the Y direction are arranged in the X direction at a constant pitch. The base pattern 360Y is a line and space pattern formed by rotating the base patterns 360X by 90 degree. The crisscross pattern 361 and the base patters 360X, 360Y can be formed, for example, by evaporating chromium layer. The base patterns 360X and 360Y of this embodiment are critical resolution marks formed using the pitch close to the critical resolution (highest resolution) of the projection optical system 308c. Thus, these marks make it possible to align the reticle with the real exposure pattern with high accuracy.

FIG. 31A shows a reticle image 312W obtained by projecting the reticle 312 onto the fiducial mark plate 306c in FIG. 29A. FIG. 31A shows mark images 329AW through 329DW and 330AW through 330DW which is conjugated with the alignment marks 329A through 329D and 330A through 330D, respectively. These mark images 329AW through 329DW and 330AW through 330DW are projected such that they are exposed within both ends of the slit-like exposure area 332W when the reticle 312 is moved in the Y direction.

FIG. 31C shows the arrangement of the fiducial marks on the fiducial mark plate 306c of FIG. 29A. Each of the fiducial marks 335A through 335D and 336A through 336D are formed on the fiducial mark plate 306c in FIG. 31C to correspond to the arrangement of the mark images 329AW through 329DW and 330AW through 330DW. When the reticle is aligned, these fiducial marks are illuminated by the illumination light having the exposing light wavelength via the reticle alignment system 319, 320 located above the reticle 312. The fiducial marks 335A through 335D and 336A through 336D are of the same shape. The fiducial mark 335A is a multi-mark as shown in FIG. 30A, including, for example, the following components: a square aperture 362C formed in a film highly reflective to exposing light such as a chrome film; four square apertures 362X, which sandwich the aperture 362C in the X direction; and four square apertures Y, which sandwich the aperture 362C in the Y direction. In other words, the fiducial mark 335A comprises square apertures 362C, 362X, 362Y having a small reflection coefficient with respect to exposing light arranged in a crisscross pattern. When the crisscross pattern 361 in the alignment mark 329A in FIG. 30B is positioned within the image of the aperture 362C projected to the reticle, the images of other apertures 362X and 362Y overlap with the base patterns 360X and 360Y, respectively.

Figure 32A:
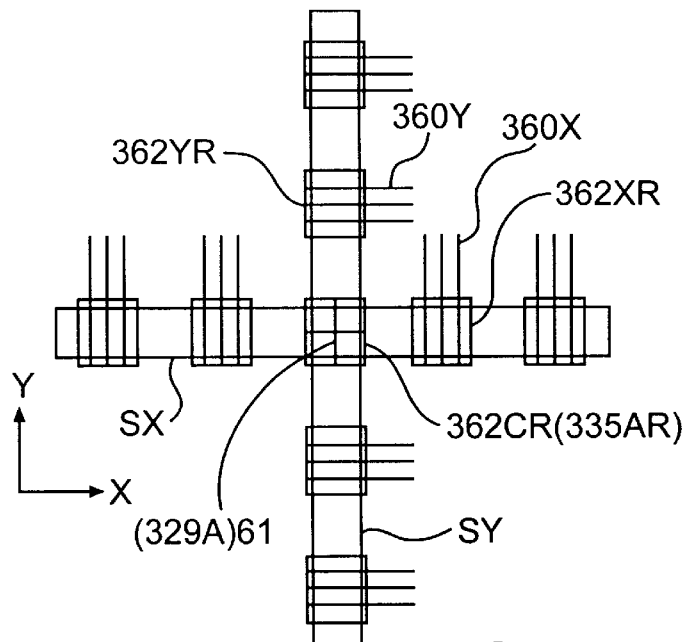
FIG. 32A is a magnification of the state in which the fiducial mark image 335AR and the alignment mark 329A are superimposed according to the fourth preferred embodiment.

For example, an image shown in FIG. 32A is obtained by observing the alignment mark 329A on the reticle 312 in FIG. 29C and the fiducial mark 335A on the fiducial mark plate 306c in FIG. 31C through the reticle alignment system 319 shown in FIG. 28. In FIG. 32A, the aperture image 362CR in the center of the fiducial mark 335 is superimposed on the crisscross pattern 361 in the center of the alignment mark 329A. The aperture images 362XR and 362YR of the fiducial mark 335A are superimposed on the base patterns 360X and 360Y of the alignment mark 329A. The reticle alignment system 319 scans the image in the observation field of view SY, which is longer in the X direction along a plurality of aperture images of the fiducial mark 335A, and scans the image in the observation field of view SY, which is longer in the Y direction along a plurality of aperture images of the fiducial mark 335A. The observation area 319R in FIG. 29B corresponds to the observation fields of views SX and SY.

Figure 32B:
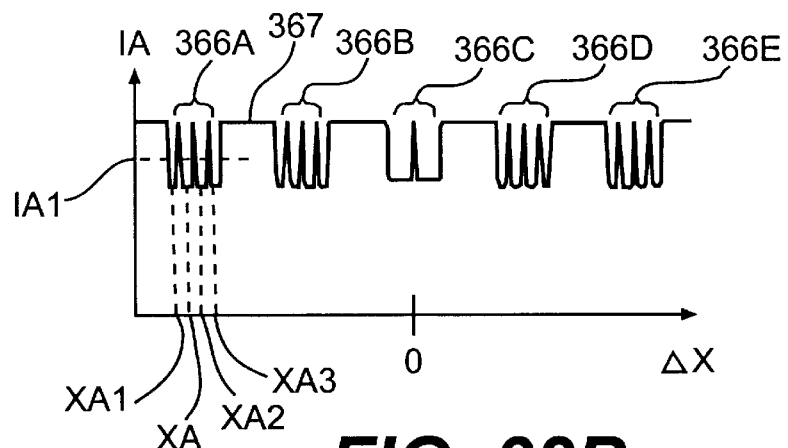
FIG. 32B shows the image pick-up signal of the image of FIG. 32A obtained by a reticle alignment systems according to the fourth preferred embodiment.

In this case, the aperture images 362CR and 362XR of the fiducial mark 335A are reflective light shielding sections; both the crisscross pattern 361 and the base pattern 360X of the alignment mark 329A reflect exposing light. Therefore, the image pick-up signal IA, which is obtained by X directional scanning the image observed in the observation field of view SX shown in FIG. 32B is the result of superposing each of the high level signals 366A through 366E at the low level region of the signal 367 which fluctuates periodically such that it corresponds to the image of the fiducial pattern 335A. Also, the magnification ratio of the pixel pitch on the image pick-up device in the reticle alignment system 319 and the coordinate distance (the distance on the wafer coordinate system) between two points on the corresponding wafer stage is calculated in advance and stored in a memory. A signal processor of the reticle alignment system 319 processes the image pick-up signal IA by analog-to-digital conversion (A/D conversion) and the resulting image pick-up signal IA corresponding to the X coordinate in the wafer coordinate system is stored in the memory. The origin in this case is, for example, the first pixel of the image pick-up device. Then the signal processor slices the image pick-up signal IA, for example, at the predetermined threshold level IAI to digitize the image pick-up signal IA by which the signal processor detects the image of the fiducial mark 335 and the position of the alignment mark 329A.

As an example, for the image 335AR of the fiducial mark 335A, the coordinate of the midpoint of the region, in which digital image signal is at low level, "0", is regarded as the X coordinate for aperture images 362CR and 362XR, respectively. For the alignment mark 329A, the coordinate of the midpoint of the narrow region, in which digital image signal is at high level, "1", is regarded as the X coordinate for each of the linear patterns. As a result, as shown in FIG. 32B, the aperture image position at the left end of the fiducial mark image 335AR is xA. The positions for three linear base patterns at the left end of the alignment mark 329A are xA1 through xA3. The positional deviation ΔXA of the base patterns obtained from an aperture image in the X direction is given by the following equation.

$$\Delta XA = xA - (xA1 + xA2 + xA3)/3 \qquad (1)$$

In the same manner, the positional deviations ΔXB through ΔXE of another base pattern 360X of the alignment mark 329A and the crisscross pattern 361 from other apertures of the base mark image 335AR can be obtained. The average value ΔX (the value converted on the wafer coordinate system of positional deviations ΔXA through ΔXE) is regarded as the X directional positional deviation of the alignment mark 329A from the fiducial mark 335A. By doing so, the multi mark averaging effect in which the positional deviation is calculated with high accuracy can be obtained. Also, the positional deviation ΔX can be regarded as the X directional coordinate of the center of the alignment mark 329A relative to the fiducial mark 335A. As shown in FIG. 35B, the origin of the relative coordinate (positional deviation ΔX) is the center of the fiducial mark 335A. In the same manner, the Y directional positional deviation (relative coordinate) ΔY of the alignment mark 329A from the fiducial mark 335A can be detected. The positional deviations for other fiducial marks and alignment marks can be obtained in the same manner.

Note that recently, for the reticle 312, a so-called "low reflection reticle" made of, for example, low reflection chrome film is used. With such a low reflection reticle, the coefficient of reflection of the alignment mark 329A in FIG. 32A is lowered, decreasing the levels of pulse signals 366A through 366E of the image pick-up signal IA of the image within the observation field of view SX as shown in FIG. 32A. Because of this, when the threshold level IAI is used to digitize the image pick-up signal IA, all of the pulse signals 366A through 366E may be at the low level, "0." In order to avoid encountering this situation, the position of the alignment mark 329A in FIG. 32A can be deviated from the fiducial mark image 335AR by ½ pitch in the X and Y directions.

Figure 37A:
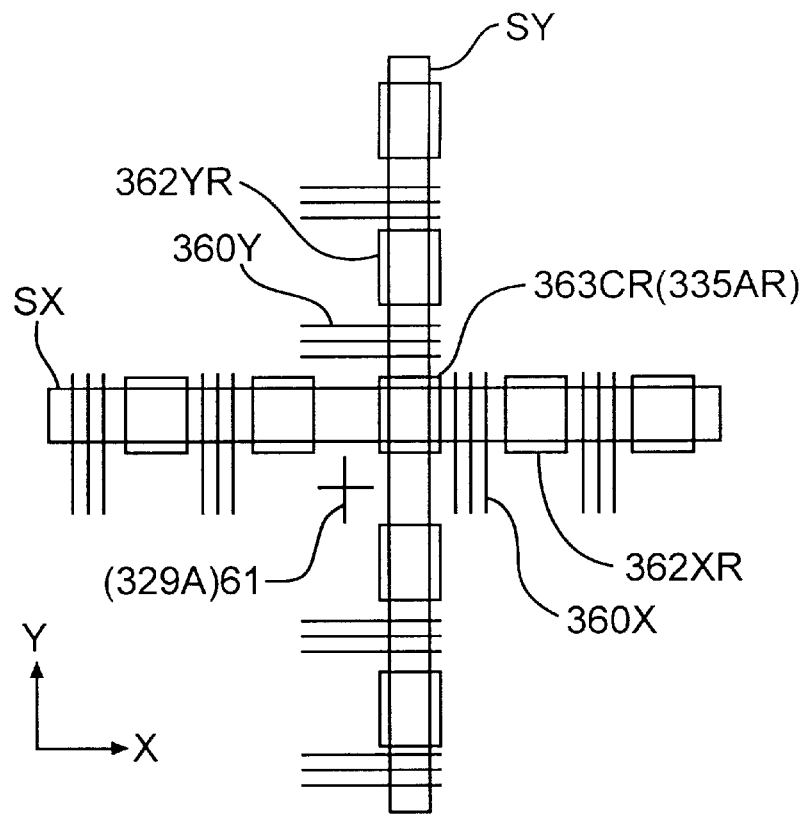
FIG. 37A is a magnified view showing the state in which the fiducial mark image 335AR and the alignment mark 329A are superimposed with the alignment mark 329A being shifted by ½ pitch according to the fourth preferred embodiment.

FIG. 37A shows the status in which the position of the alignment mark 329A is deviated from the fiducial mark image 335AR by ½ pitch in the X and Y directions, in FIG. 37A, the base patterns 360X, 360Y of the alignment mark 329A are positioned between each of the aperture images 362XR, 362YR and the fiducial mark image 335AR.

Figure 37B:
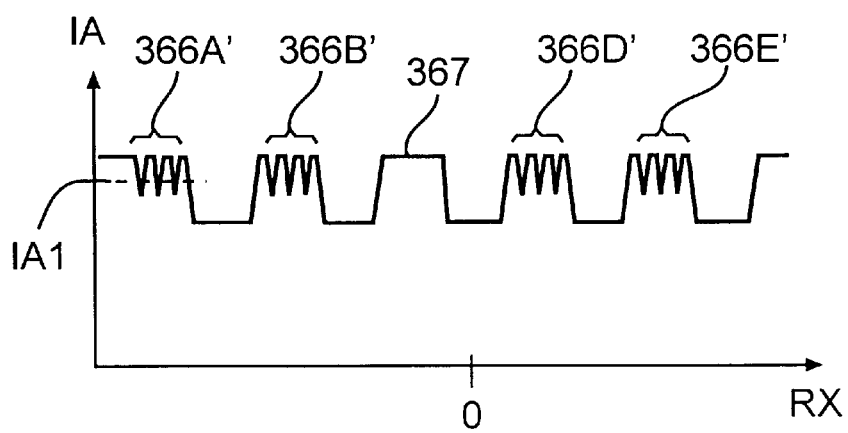
FIG. 37B is a graph showing the image pick-up signal of the image of FIG. 37A obtained by the reticle alignment system according to the fourth preferred embodiment.

FIG. 37B shows the image pick-up signal IA of the image within the observation field of view SX of the reticle alignment system 319 in FIG. 37A. In FIG. 37B, at each of the high level regions of the signal 367 corresponding to the fiducial mark image 335AR, pulse signals 366A' through 366E' corresponding to the alignment mark 329A are superimposed. At this time, because the reflection rate of the alignment mark 329A is small, by digitizing its image pick-up signal IA using the threshold level IAI, pulse signals 366A' through 366E' can be digitized. Therefore, when using the low reflection reticle, the image in the reflection area around each of the apertures of the fiducial pattern 335A is superimposed on the alignment mark 329A such that the positional deviation of the alignment mark 329A from the fiducial mark 335A can be detected highly accurately. In addition, in FIG. 37A, the crisscross pattern 361 of the alignment mark 329A is displaced from the observation field of view SX. When detecting the position in the X direction, the fiducial mark image 335AR can be deviated in the negative Y direction to position its crisscross pattern 361 between the aperture images of the fiducial mark image 335AR. This can further increase the averaging effect.

With reference to FIG. 31C, a fiducial mark 337A is formed on the fiducial mark plate 306c at a distance IL from the midpoint of the fiducial marks 335A and 336A in the Y direction, in which scanning is performed. The distance IL is equal to the base line length, which is the distance between the optical axis ΔX of the projection optical system 308c of FIG. 28 and the reference point (detection center, for example) of the alignment sensor 334 in the off-axis technique. In the same manner, the fiducial marks 337B, 337C, and 337D are formed at a distance IL from the midpoint of the fiducial marks 335B and 336B, 335C and 336C, and 335D and 336D in the Y direction, respectively. The fiducial marks 337A through 337D use cross points of a grid pattern 369 of constant pitches in the X and Y directions, as shown in FIG. 31 D, and are detected by the alignment sensor 334 of FIG. 28. The alignment sensor 334 images the fiducial mark images 337A through 337D on the internal indication mark plate, and relays their images onto the image pick-up device comprising two dimensional charge coupled devices (CCDs). The signal processor, to which the image pick-up device is attached, processes the image signal from this image pick-up device to calculate the two dimensional deviation of the fiducial image from the indication mark to supply the resulting data to the main controller 322A. The alignment sensor 334 detects the position of the alignment mark (wafer mark) on the wafer 305 in the same manner. The main controller 322A adds the deviations to the X and Y coordinates of the Zθ driving stage 304c to calculate matrix coordinates of the mark, the detection target, in the wafer coordinate system (XW, YW).

The reticle alignment systems 319, 320 use the illumination light of the exposing light wavelength. If a reticle having different thickness or tapered in thickness is used, the imaging surfaces of the alignment marks 329A through 329D and 330A through 330D on the reticle and that of the fiducial marks 335A through 335D and 336 through 336D on the fiducial mark plate 306c are defocused with respect to the imaging surface of the image pick-up device of the reticle alignment system 319, 320. This leaves a concern in that the detected value may include errors.

In addition, the illumination optical system of the actual exposing light has a larger coherence factor (a value) than that in the illumination system in the reticle alignment system 319, 320, and also has a mechanism such as modified illumination, annular illumination, etc. to increase resolution of the projection optical system 308c without reducing focal depth very much. For this reason, there is a concern in that under real exposing light, the positional deviation of the fiducial marks 335A–335D, 336A–336D from the alignment marks 329A–329D and 330A–330D include offsets (errors) generated by the difference in distortions and the like. If the positional deviation detected by the reticle alignment system 319, 320 includes offsets from real positional deviation, measurements of the reticle alignment and base line length cannot be performed with accuracy. This causes an alignment error during the aligned exposure operation. To obtain the offsets for the reticle alignment system 319, 320, a transparent fiducial mark plate and spatial image sensors are employed in this embodiment.

In other words, as shown in FIG. 29A, in the vicinity of the fiducial mark plate 306c on the Zθ driving system 304c of the wafer stage of this embodiment, a transparent substrate 340 made of a material which transmits exposing light is attached. The transparent substrate 340 has the same height as the wafer surface. As shown in FIG. 29A and FIG. 31B, two identical apertures 341A and 341B are formed at the same distance as the fiducial marks 335A, 336A (See FIG. 31C) in the X direction within the light-shielding film on the surface of the transparent substrate 340. The mobile mirror 307X, 307Y and the fiducial mark plate 306c of this embodiment do not need to transmit exposing light. Therefore, they can be made of any material such as glass ceramics which has an extremely small linear expansion coefficient and a small coefficient of transmission for exposing light such as light in the ultraviolet band and the like. On the other hand, the transparent substrate 340 needs to transmit exposing light such as the i-line or from excimer lasers and the like in the ultraviolet band, so it is made of quartz which is capable of transmitting exposing light and has a smaller linear expansion coefficient.

In addition, the aperture patterns 341A, 341B on the transparent substrate 340 are shaped in the same manner as fiducial marks 335A through 335D and 336A through 336D. In other words, as shown in FIG. 30A, in the aperture 341A are multi marks including a small square aperture 363C formed in the light-shielding film; four small square apertures 363X which sandwich the small aperture 363C in the X direction; and four small square apertures 363Y which sandwich the small aperture 363C in the Y direction, wherein the sizes and arrangements of the small apertures 363C, 363X, 363Y are identical to those of the apertures 362C, 362X, 362Y constituting the fiducial mark 335A. Therefore, when projecting the image of the alignment mark 329 in FIG. 30B on the transparent substrate 340, and if the image of the crisscross pattern 361 in its center is superimposed on the small aperture 363C in the center of the aperture 341A, the projected images of other base patterns 360X and 360Y are superimposed on the small apertures 363 and 363Y, respectively. In addition, a spatial image sensor is attached at the bottom of the transparent substrate.

Figure 34:
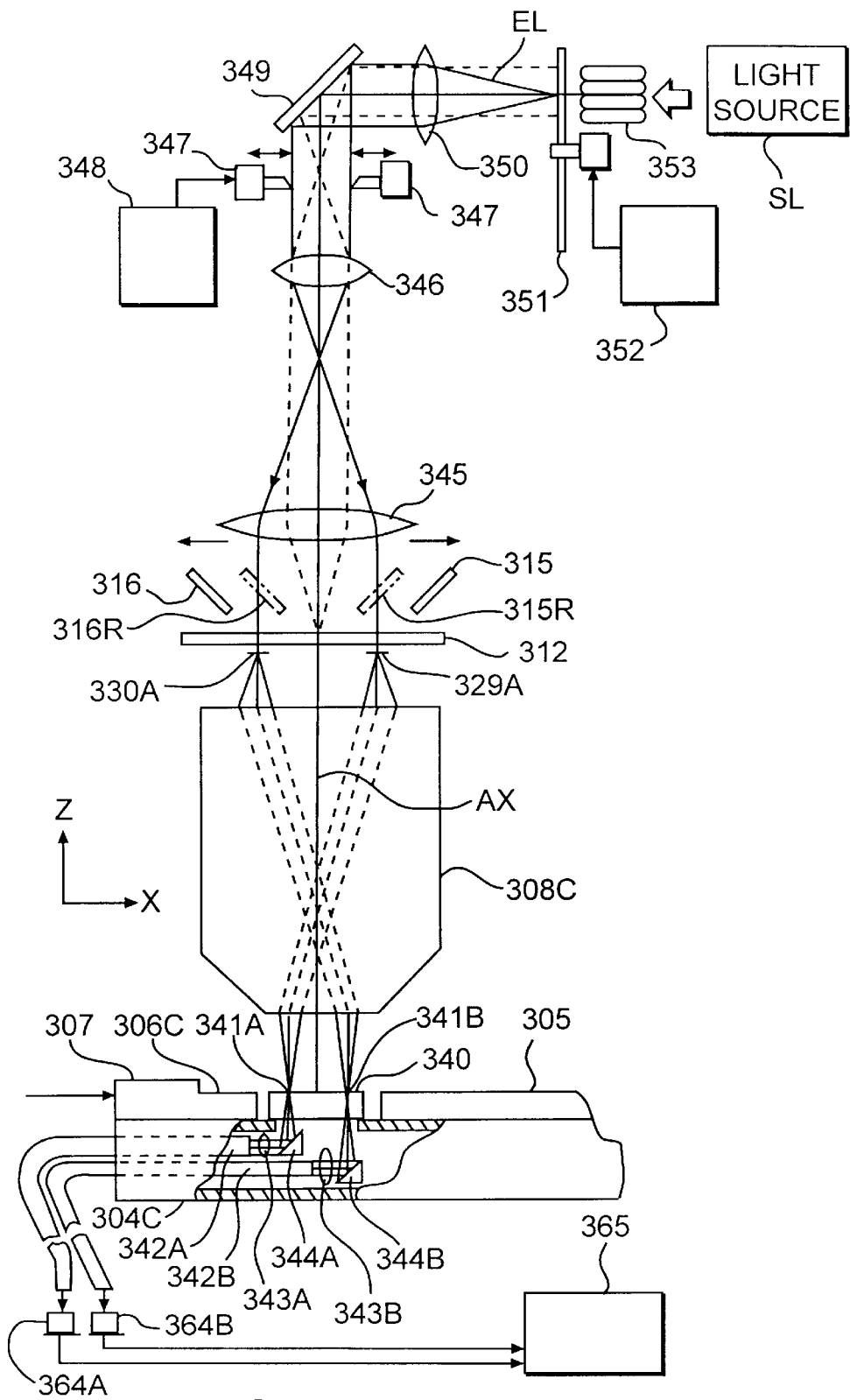
FIG. 34 is a schematic view showing a configuration of the illumination optical system of exposing light in the projection optical apparatus of FIG. 28, including a partial cross section of the spatial image sensor.

FIG. 34 shows the configuration of the illumination optical system and the spatial image sensors in the projection exposure apparatus of this embodiment. In this FIG. 34, exposing light EL which has a predetermined shape and a predetermined illumination distribution setting is emitted from a light source system SL to a fly-eye lens 353 to form a plurality of two dimensional light sources on the emitting surface of the fly-eye lens. The source system SL includes a light source, various optical filters, and a shaping optical system which shapes the cross sectional shape of optical flux, etc. The emitting surface is the Fourier transformation plane (pupil plane) with respect to the patterned surface of the reticle 312. A revolver 351 having an aperture stop is rotatably attached to the emitting surface. The following components are arranged around the revolver 351 at even angles: a normal circular aperture stop; a small circular aperture stop for a small coherence factor (a value); an annular aperture stop; and aperture stops for the modified illumination comprising four eccentric circular apertures, etc. The main controller 322A rotates the revolver 351 via an illumination condition switching unit 352 to set the desired aperture stop (a stop) to the emitting surface of the fly-eye lens 353.

The exposing light EL which went through one of the aperture stops in the revolver 351 goes through, in the following order from the revolver side, a first relay lens 350, a guide mirror 349, a mobile imaging blind 347, a second relay lens 346, and a condenser lens 345 to illuminate the slit-like illumination area of the pattern (bottom) of the reticle 312 with a uniform illumination distribution. The surface, on which the mobile imaging blind 347 is located, is conjugated with the pattern over the reticle 312. The mobile imaging blind 347 is constructed with two movable blades arranged in the X direction and two movable blades (not illustrated) arranged in the Y direction orthogonal to the page in FIG. 34. The illumination area on the reticle 312 is defined by the aperture surrounded by these movable blades. In addition, the illumination optical system is configured such that at the start and end of the scanning and exposing operations, only the necessary circuit pattern on the reticle 312 is transferred onto the wafer 5 by gradually opening and closing the two movable blades in the Y direction of the movable imaging blind 347 via the control unit 348. During scanning exposure, the wafer 305 is aligned in the exposure field of the projection optical system 308c while the pattern image of the reticle 312 is projected onto the slit-like exposure area on the wafer 305 via the projection optical system 308c; the reticle 312 and the wafer 305 are scanned in the Y direction with respect to the projection optical system 308c.

On the other hand, during measuring offsets of the reticle alignment system 319, 320 and using the spatial image sensor, the guide mirrors 315, 316 for the reticle alignment system 319,. 320 may be moved away from the optical path of exposing light EL by the mirror driving apparatus 317, 318 as shown in FIG. 28. Also, as shown in FIG. 34, the alignment marks 329A, 330A on the reticle may be set within the same region as the observation field of view 319R, 320R of the reticle alignment system 319, 320 (See FIG. 29B). Apertures 341A and 341B on the transparent substrate 340 are set in the vicinity of the position on which the images of the alignment marks 329A and 330A are projected with exposing light EL via the projection optical system 308c.

The exposing light EL which went through the aperture patterns 341A and 341B are reflected by the guide mirrors 344A and 344B in the Zθ axial driving stage 304c at the bottom of the transparent substrate 340 and enters one end of each of the optical fibers 342A and 342B via the condenser lenses 343A and 343B. The other end of the optical fibers 342A, 342B are arranged external to the Zθ axial driving stage 341. Exposing light emitted from the other end of the optical fibers 342A and 342B is received by photoelectric sensors comprising a photo diode or a photo multiplier, etc. via a relay optical system (not illustrated). Photoelectric signals from the photoelectric sensor 364A, 364B are supplied to the signal processor 365. A spatial image sensor is constructed with the aforementioned guide mirrors 344A, 344B, condenser lenses 343A, 343B, optical fibers 342A, 342B, and photoelectric sensors 364A, 364B. Although this embodiment uses the optical fibers 342A, 342B, optical flux which goes through apertures may be relayed using optical lens to guide them to the photoelectric sensors 364A, 364B.

The photoelectric sensors 364A, 364B of the spatial image sensor of this embodiment detect light intensity to derive the positional relationship between the apertures 341B, 341B and the alignment marks 329A, 329B, which are scanned relative to each other by driving the reticle stage or wafer stage. This position detection technique is described hereinafter referring to FIGS. 35A to 35C.

Figure 35A:
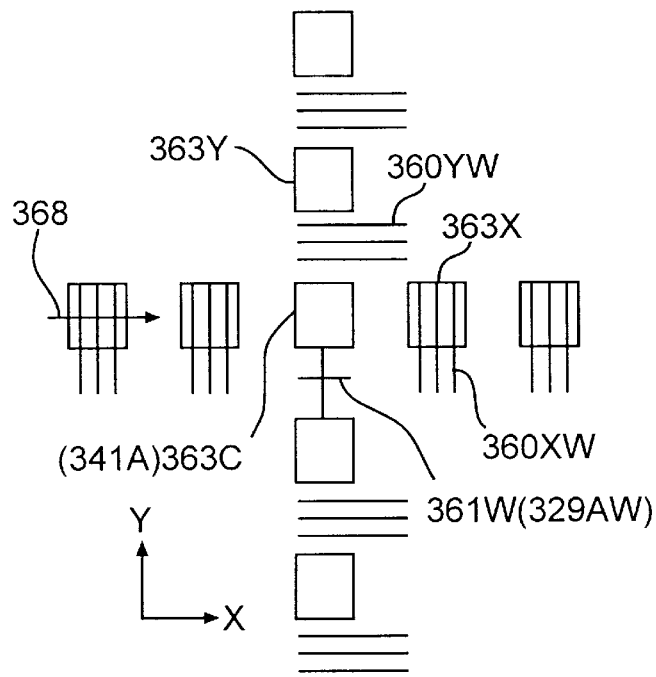
FIG. 35A is a magnified view showing the relative scanning operation of the alignment mark image 329AW and the aperture 341A according to the fourth preferred embodiment.
Figure 35B:
FIG. 35B shows the photoelectric signal IB detected by the spatial image sensor during the relative scanning according to the fourth preferred embodiment.

FIG. 35A shows the status in which the image 329AW of the alignment mark 329A on the reticle 312 is projected onto the aperture 341A on the transparent substrate 340 in FIG. 34. In FIG. 35A, the crisscross pattern image 361W in the mark image 329AW is positioned between the small aperture 363C in the center and the small aperture on the negative Y direction side. The photoelectric signal IB, which is obtained as a result of photoelectric conversion of exposing light that went through the entire aperture 341A, is supplied from the photoelectric sensor 364A to the signal processor 365 in FIG. 34. In this embodiment, by moving the Zθ axial driving stage 304c in FIG. 28 in the positive X direction, for example, the mark image 329AW is scanned in the positive X direction through the aperture 341A.

FIG. 35B shows the profile of the photoelectric signal IB obtained from the photoelectric sensor 364A when the aperture 341A is scanned in the above manner. In FIG. 35B, the horizontal axis denotes the positional deviation of the center of the mark image 329A from the center of the aperture 341A in the X direction, i.e., the relative coordinate RX of the mark image 329AW from the aperture 341A in the X direction. Note that in the step during which the photoelectric signal IB is sampled, the signal processor 365 in FIG. 34 A/D converts the photoelectric signal IB to store the resulting data from the conversion in memory, by simply corresponding the data to the X coordinate of the wafer coordinate system. The mark image 329AW is a group of three line-and-space pattern images. Therefore, the levels of the photoelectric signal IB changes by three steps starting from the high level. After the level reaches the bottom value IB1, the photoelectric signal IB changes by three steps again to reach the high level. Also even if the aperture 341A is scanned relative to the mark image 329AW and the one to three base pattern images 360XW overflow any small apertures 363C, 363X, the photoelectric signal IB changes by steps. However, the bottom value is higher than that of IB1 in FIG. 35B, and therefore, it can be checked easily.

Figure 35C:
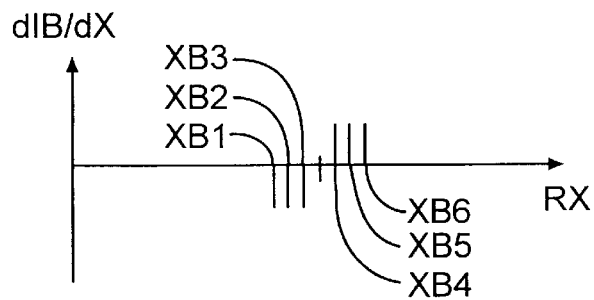
FIG. 35C shows a differentiated signal of the photoelectric signal IB according to the fourth preferred embodiment.

After the scan, the signal processor 365 differentiates the photoelectric signal IB by the X coordinate of the wafer coordinate system to obtain the differentiated signal dIB/dX as shown in FIG. 35C. Then, the X coordinates xB1, xB2, and xB3, at which this differentiated signal has a negative pulse, are obtained. The X coordinates xB4, xB5, and xB6, at which the differentiated signal is a positive pulse, are also obtained. If the average value XB of the X coordinate is calculated using the following equation (2), this average value XB can be regarded as the X coordinate of the wafer coordinate system when the center of the aperture 341A and the center of the mark image 329AW coincide with each other in the X direction.

$$XB=(xB1+xB2+\ldots+xB5+xB6)/6 \qquad (2)$$

Suppose in this case, the X coordinate value XR in the reticle coordinate system, which defines the position of the reticle 12 is XRo. Then, using the X coordinate XW in the wafer coordinate system and the reduction ratio I/M of the projection optical system 308c, the following relative coordinate RX in the horizontal axis in FIG. 37B can be obtained:

$$RX=(XW-XB)+(XR-XR_0)/M \qquad (3)$$

Note that the equation (3) takes into account that a reversed image is projected via the projection optical system 308c. The relative coordinate RX can be regarded as the positional deviation of the center of the alignment mark 329A from the center of the aperture pattern 341A in the X direction. At this time, the aperture 341A is a plurality of marks. The photoelectric signal IB in FIG. 35B is a sum of four line-and-space patterns. As a result, the SN ratio (signal per noise ratio) of the photoelectric signal IB is high. This makes it possible to obtain the relative coordinate RX with high accuracy. In the same manner, in FIG. 35A, by scanning the mark image 329AW through the aperture 341A in the negative Y direction to take in the photoelectric signal IB from the photoelectric sensor 364A, the relative coordinate RY, the positional deviation of the alignment mark 329A in the Y direction from the aperture 341A, can be detected. In the same manner, using the photoelectric signal of the photoelectric sensor 364B in FIG. 34, the relative coordinates (RX, RY) of the alignment mark 330A from the fiducial mark 341B, the other mark on the transparent substrate 340, can be detected. Note that the relative coordinates can be obtained by scanning the reticle 312 in stead of the transparent substrate 340.

Figure 32C:
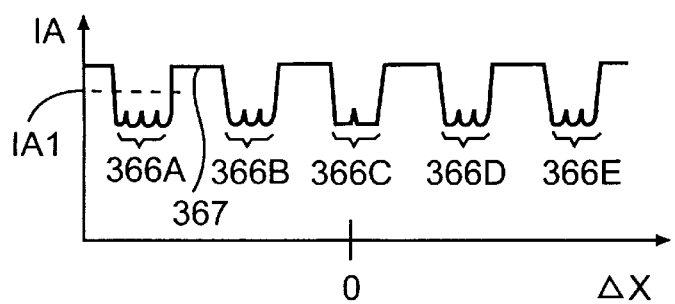
FIG. 32C shows the image pick-up signal when the reticle reflection coefficient is low according to the fourth preferred embodiment.

After the measurement by the spatial image sensor is completed in this embodiment, in FIG. 34, the guide mirrors 315, 316 are returned to the optical path of exposing light EL to operate the reticle alignment system 319, 320 in FIG. 28 to measure the relative coordinate (positional deviation) of the alignment marks 329A, 330A from the aperture patterns 341A, 341B using the aperture patterns 341A, 341B on the transparent substrate 340 in place of the fiducial marks 335A, 336A on the fiducial mark plate 306c in FIG. 31C. This measurement technique is the same as the technique described referring to FIGS. 32A to 32C. With this relative coordinate and a relative coordinate detected by the spatial image sensor, offset amounts for the reticle alignment system 319, 320 can be obtained. Note that instead of the alignment marks 329A, 330A, other alignment marks 329B, 330B through 329D, and 330D on the reticle 312 in FIG. 29C may be used. In doing so, because the two apertures 341A, 341B for the spatial image sensor of this embodiment are separately arranged in non-scanning directions, by moving the reticle 312 in the Y direction, the positional deviations of an arbitrary pair of alignment marks from apertures 341 A, 341 B can be measured simultaneously and quickly.

FIG. 36 is a flow chart showing an example of the method for determining the offsets of the reticle alignment system 319, 320 and for performing the reticle alignment and base line check.

First, step 401 in FIG. 36 is described. As shown in FIG. 34, the alignment marks 329A, 330A on the reticle 332 are moved within the same area as the observation field of view of the reticle alignment system 319, 320 in the state in which the guide mirrors 315, 316 of the reticle alignment system 319, 320 are moved away from the optical path of exposing light EL. Then, the apertures 341A, 341B on the transparent substrate 340 are moved near areas, at which the alignment marks 329A, 330A are projected. The light source begins to emit exposing light EL. The mark image 29AW is scanned through the aperture 341A by driving the Zθ axial driving stage 4 on the side of the wafer stage, for example, as shown in FIG. 35A. At this time, the image 330AW of the alignment mark 330A is also scanned through the aperture 341B. Here, the alignment mark 329A, 330A may be moved by driving the reticle stage. Then, the photoelectric signal from the photoelectric sensors 364A, 364B within the spatial image sensor is sampled via the signal processor 365 to detect the X coordinate of the wafer coordinate system when the center of the aperture pattern 341A, 341B and the center of the mark image 329AW, 330AW coincide with each other, as expressed in the equation (2). Similarly, the mark image may be scanned through the apertures 341A, 341B in the Y direction to detect the Y coordinate of the wafer coordinate system when the center of the aperture pattern 341A, 341B and the center of the mark image 329AW, 330AW coincide with each other.

Then, the Zθ axial driving stage 304c on the wafer stage is driven in the X and Y directions until it reaches a condition that the centers of the aperture 341A, 341B is adjacent to the centers of the mark image 329AW, 330AW. In this state, the reticule 312 is also at rest. The main controller 322A calculates coordinates $(x_{11}, y_{11})$ of the center of the image of the alignment mark 329A relative to the center of the aperture 341A and coordinates $(x_{12}, y_{12})$ of the center of the image of the alignment mark 29B relative to the center of the aperture 41B. The resulting data of these relative coordinates $(x_{1i}, y_{1i})$ (i=1,2) are stored in an internal memory.

Next, step 402 is described: the guide mirrors 315, 316 of the reticle alignment system 319, 320 are returned to the optical path of exposing light EL. After the light source stops emitting exposing light EL, the reticle alignment system 319, 320 begins to emit illumination light having the exposing light wavelength. Then, the images of the apertures 341A, 341B projected onto the reticle and the images of the alignment marks 329A, 330A are picked up by the image pick up device of the reticle alignment system 319, 320. The thus picked up image is sampled and processed to derive the relative coordinates (positional deviation) $(x_{21}, y_{21})$ of the alignment mark 329A relative to the center of the fiducial mark 341A in the wafer coordinate system, and the relative coordinates (positional deviation) $(x_{22}, y_{22})$ of the alignment mark 330A relative to the center of the fiducial mark 341B in the wafer coordinate system. The detected relative coordinate data $(x_{2i}, y_{2i})$ (i=1,2) is supplied to the main controller 322A. In this case, the same detection technique can be used as in the case when the image of the aperture 341A exists as shown in FIG. 35A rather than the real image 335AR of the fiducial mark 335A existing as shown in FIG. 32A. Therefore, the image pick-up signal IA as shown in FIG. 32B can be processed in this case. In this embodiment, the aperture patterns 341A, 341B on the transparent substrate 340 are in the same shape as the fiducial marks 335A through 335D, 336A through 336D. Therefore, the relative coordinates to the aperture 341A, 341B can be detected using the same technique as used for the detection of the fiducial marks 335A through 335D and 336A through 336D.

When the contrast and the like of the image pick-up signal IA as shown in FIG. 32B is poor, the alignment marks 329A, 330A may be moved minutely in the direction different from the measurement direction (the Y direction when measuring the positional deviation in the X direction) to look for the position at which an optimal image pick-up signal IA can be obtained. When adjusting the position of the reticle 312 or transparent substrate 340, the relative coordinates $(x_{1i}, y_{1i})$ obtained in step 401 will need to be replaced with the relative coordinates calculated such that they corresponds to the position after adjustment using the equation (3). In addition, when a low reflection reticle is used as the reticle 312, as described referring to FIG. 37, the position can be detected by offsetting the apertures 341A, 341B from the alignment marks 329A, 330A by ½ pitch. In this case also, the relative coordinates $(x_{1i}, y_{1i})$ obtained in step 401 will need be replaced.

In step 403, the main controller 322A calculates the relative coordinate difference S, which is the difference between the relative coordinates $(x_{2i}, y_{2i})$ obtained using the reticle alignment system 319, 320 and the relative coordinates $(x_{1i}, y_{1i})$ obtained using the spatial image sensor: $(x_{2i}-x_{1i}, y_{2i}-y_{1i})$ (i=1, 2), and stores the result in a memory. This relative coordinate difference S corresponds to the difference between the relative coordinate detected by the reticle alignment system 319, 320 and the relative coordinates detected under exposing light EL during real exposure. That is, S corresponds to the positional deviation offsets detected by the reticle alignment system 319, 320. Alteratively, other alignment marks 329B, 339B through 329D, 330D may be used in place of the alignment marks 329A, 330A to obtain the relative coordinate difference S.

In step 404, by maintaining the alignment marks 329A, 330A on the reticle 312 within the observation areas 319R, 320R of the reticle alignment system 319, 320, respectively in FIG. 29B, the fiducial marks 335A, 336A on the fiducial mark plate 306c in FIG. 31C are moved to the observation areas 319W, 320W (See FIG. 29A) on the stage, which is conjugated with the observation areas 319R, 320R.

Figure 33C:
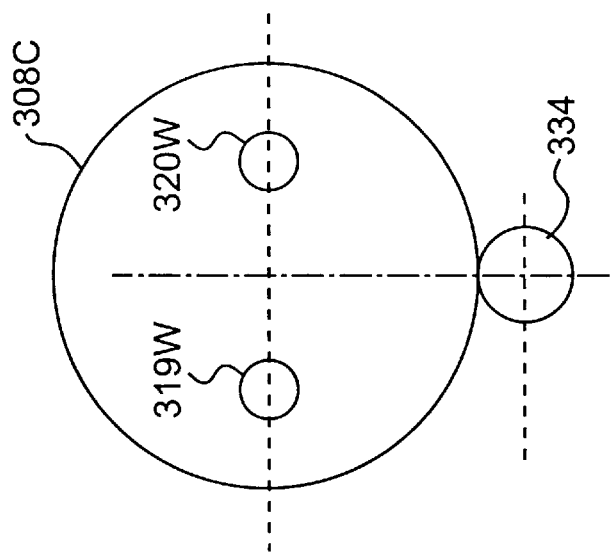
FIG. 33A, 33B, and 33C are descriptive drawings showing the relative scanning operation of the reticle 312 and the fiducial mark plate 306 according to the fourth preferred embodiment.
Figure 33B:
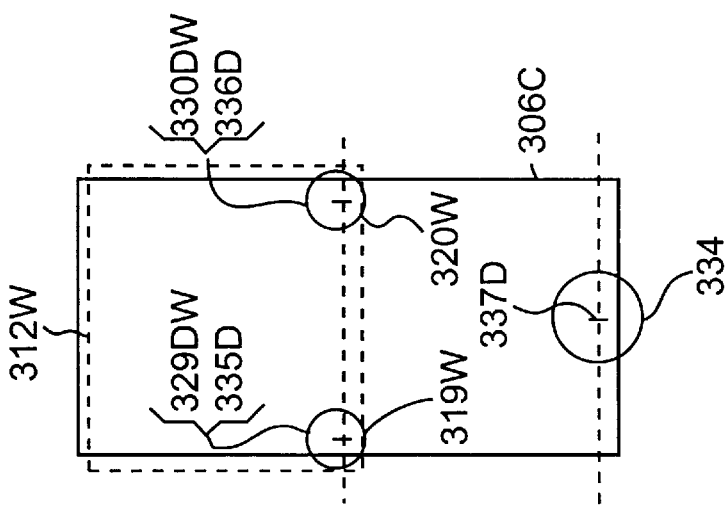
Figure 33A:
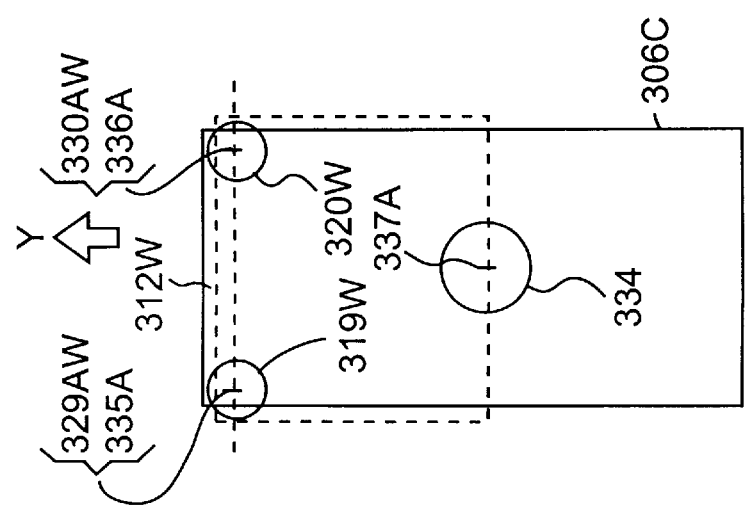

FIG. 33A shows the status in which the alignment mark image of the reticle 312 and the fiducial mark on the fiducial mark plate 306c are moved to the inside of the corresponding observation areas. As shown in FIG. 33a, the mark image 329AW and the fiducial mark 335A can be observed simultaneously within the observation area 319W, and the mark image 330AW and the fiducial mark 336A can be observed simultaneously in the observation area 320W. Also as shown in FIG. 33C, both the observation areas 319W and 320W cross the optical axis in the exposure field of the projection optical system 308c. The fiducial mark 337A is kept in the observation area of the off-axial alignment sensor 334. Then, in Step 405, the reticle alignment system 319, 320 process the image pick-up signal of the observed image (the image as shown in FIG. 32A) to calculate the positional deviation of the mark image 329AW from the fiducial mark 335A and that of the mark image 330AW from the fiducial 336A. Then, the resulted deviation data are supplied to the main controller 322A in FIG. 28. At the same time, the off-axial alignment sensor 334 picks up the image of the corresponding fiducial mark 337A, and the data indicating the positional deviation of the fiducial mark 337A from the center of detection (e.g. the center of the indication mark, etc.) obtained from the processed signal are supplied to the main controller 322A.

In step 406, the same technique used during scanning exposure is used as follows. The Z-θ axial driving stage 304c is shifted in the positive Y direction, in a synchronous manner, as the reticle micro-driving stage 311 in FIG. 29B is shifted to the negative Y direction. By doing so, as shown in FIG. 33B, the fiducial mark plate 306c and the reticle image 312W together are shifted in the positive Y direction. Because the observation areas 319W, 320W of the reticle alignment system 319, 320 and that of the off-axial alignment sensor 334 are fixed, mark groups of marks coded with A (the mark images 329AW, 330AW and the fiducial marks 335A, 336A and 337A) through D (the mark images 329DW, 330DW and the fiducial marks 335D,, 336D, and 337D) are shifted. Each time the mark groups of marks coded with B, C, and D enter the observation areas 319W, 320W and the observation area of the alignment sensor 334, the Zθ axial driving stage 304c and the reticle micro-driving stage 311 are stopped for detecting the position of each mark.

If the state shown in FIG. 33A defines the first still state position, the second still state position is defined as a state where the mark group that exists in the observation areas 319W, 320W and the observation area of the alignment sensor 334 is coded with B, i.e., 329BW, 330BW in FIG. 31A and the fiducial marks 335B, 336B, 337B in FIG. 3IC. The reticle alignment systems 319, 320 detect the positional deviation of the mark image 329BW, 330BW form the fiducial mark 335B, 336B, supply the resulting data to the main controller 322A. The alignment sensor 334 calculates the positional deviation of the corresponding fiducial mark 337B, and supplies the resulting data to the main controller 322A. The above sequence is repeated during the third and fourth still state positions (the fourth state is shown in FIG. 33B). The mark group coded with C (the mark images 329CW, 330CW and the fiducial marks 335C, 336C, 337C) and the mark group coded with D are measured by the reticle alignment system 319, 320 and the alignment sensor 334. The positional deviations of eight mark images 329AW through 330DW in the wafer coordinate system, which are measured by the reticle alignment system 319, 320, are indicated by (ΔXn, ΔYn) where (n=1 to 8). The positional deviations of four fiducial marks from the center of detection (detection center) in the wafer coordinate system which is measured by the alignment sensor 334 are indicated as follows: (AΔXi, ΔAYi) where (i=1 to 4).

In Step 407, the main controller 322A subtracts the relative coordinate difference S obtained in Step 403 from the positional deviation (ΔXn, ΔYn) (n=1 to 8) detected by the reticle alignment system 319, 320 to store the deviation data after subtraction (ΔXn', ΔYn'). Accordingly, the offsets that exist in the measurement performed by the reticle alignment system 319, 320 can be corrected. In the following step 408, the main controller 322A computes the positional deviation after the correction and the positional deviation detected by the alignment sensor 334 to perform a dynamic reticle alignment. At this point in this embodiment, to improve the alignment accuracy, the reticle alignment is performed using a coordinate system defined by the orientation of the fiducial marks on the fiducial mark plate 306c (hereinafter referred to as the fiducial mark plate coordinate system) shown in FIG. 31C as a basic reference coordinate system. The coordinate system of the fiducial mark plate has the coordinate system (XS, YS) constructed with a straight horizontal axis (XS axis) that goes through the fiducial marks 335A, 336A on the fiducial mark member 306, and a straight vertical axis (YS axis) that goes through the fiducial marks 335A, 335D. Also, with respect to the coordinate system (XS, YS) of the fiducial mark plate, scaling factors (linear expansion and retraction) of a coordinate system that is the projected image of the reticle coordinate system (XR, YR), are indicated as Rx, Ry; rotation of the projected coordinate system is indicated by θ, an orthogonality error is indicated by w; and offsets in the XS and YS directions are indicated by Ox, Oy, respectively. The orthogonality error (a) is the rotational angle of a projected image of the Y axis of the reticle coordinate system with respect to the YS axis, i.e., a rotational error in the scanning direction of the reticle stage.

Suppose that the design coordinates of the mark images 329AW through 330DW, which are projected onto the fiducial mark plate 306c, are denoted as (Dxn, Dyn) (n=1 to 8) in the reticle coordinate system, and that the coordinates of the corresponding fiducial marks 335A through 336D in the coordinate system (XS, YS) are denoted by (Exn, Eyn). Then, using the positional deviation (ΔXn', ΔYn') after correction, which is measured by the reticle alignment system 319, 320, the real coordinates (Dxn', Dyn') of the mark images 329AW through 330DW measured in the coordinate system (XS, YS) of the fiducial mark plate 306c can be approximated as follows:

$$Dxn'=Exn+\Delta Xn' \tag{4A}$$

$$Dyn'=Eyn+\Delta Yn' \tag{4B}$$

At this time, based on the aforementioned six conversion parameters (Rx, Ry, θ, ω, Ox, Oy) and the design coordinates (Dxn, Dyn) of the mark images 329AW through 330DW, the calculated coordinates (Fxn, Fyn) of the mark images 329AW through 330DW in the coordinate system (XS, YS) on the fiducial mark plate can be expressed as follows:

$$Fxn=Rx \times Dxn - Rx(w+0) \times Dyn + Ox \tag{5A}$$

$$Fyn=Ry \times \theta \times Dxn + Ry \times Dyn + Oy \tag{5B}$$

Also, a difference (εxn, εyn) between the calculated coordinates (Fxn, Fyn) of the mark images 329AW through 330DW in the XS and YS directions and the real coordinates (Dxn', Dyn') (a non-linear error) can be expressed as follows:

$$\epsilon xn=Fxn-Dxn' \tag{6A}$$

$$\epsilon yn=Fyn-Dyn' \tag{6B}$$

The main controller 322A in FIG. 28 calculates the aforementioned six conversion parameters Rx, Ry, θ, A, Ω, Ox, Oy using the least square technique to minimize the square sum of the non-linear error (εxn, εyn) for the eight mark images 329AW through 330DW.

In step 409, a new reticle coordinate system (XR, YR) is created in which the coordinate obtained by multiplying the reticle coordinates (XR, YR) by given scaling factors Rx, Ry and at the same time the coordinates are rotated to make the given theta, the rotation angle, zero. Then, the reticle micro-driving stage 311 (reticle 312) is scanned according to this new coordinate system. This means that the reticle 312 is scanned such that the alignment marks 329A through 329D in FIG. 29C move along the matrix orientation of the fiducial marks 335A through 335D on the fiducial mark plate 306c in FIG. 31C. Note that because offsets (0x, 0y correction) is provided during wafer alignment, the coordinate system does not require correction.

As a result, the reticle pattern 312 is scanned along the fiducial marks 335A through 336D arranged rectangularly on the fiducial mark plate 306c; with this, the shot region can be shaped in an accurate rectangle. In addition, even when the inclined angle between the mobile mirror 307X attached on the side of the wafer stage and the fiducial mark plate 306c is changed, the process is not affected by the changed inclined angle because measurements are taken based on the fiducial marks on the fiducial mark plate 306c.

In step 410, the main controller 322A computes the base line length (BEX, BEY) in the X and Y directions of the alignment sensor by computing the positional deviation after correction ($\Delta Xn'$, $\Delta Yn'$) where (n=1 to 8), measured by the reticle alignment system 319, 320 and the positional deviation (A$\Delta Xi$, $\Delta AYi$) where (i=1 to 4), measured by the alignment sensor 334. In other words, the base line length (BEX1, BEY1) for a group of marks coded with A is expressed as follows, when the positional deviations of the mark images 329AW, 330AW from the fiducial mark 335A, 336A are ($\Delta BX1$, $\Delta BY1$), ($\Delta BX2$, $\Delta BY2$) and the positional deviation of the corresponding fiducial mark 337A measured by the alignment sensor 334, is ($\Delta AX1$, $\Delta AY1$):

$$BEX1 = (\Delta BX1 + \Delta BX2)/2 - \Delta AX1 \quad (7A)$$

$$BEY1 = IL + (\Delta BY1 + \Delta BY2)/2 - \Delta AY1 \quad (7B)$$

In the same manner, the base line lengths (BEX2, BEY2) through (BEX4, BEY4) for three other mark groups can also be calculated. By averaging these four base line lengths, the base line length (BEX, BEY) of the alignment sensor 334 in the X and Y direction can be calculated. As described, the base line length is the average of the measurements taken for the four mark groups, resulting in averaging effects in which a highly accurate base line length can be obtained.

In addition, because the positional deviation measured by the reticle alignment system 319, 320 in Step 407 is corrected by the relative coordinate difference S obtained in Step 403, a highly accurate base line length under real exposing light EL can be obtained. Therefore, when the reticle 312 on the reitcle stage is changed to a reticle of different thickness, or when the illumination optical system in FIG. 34 rotates the revolver 351 to switch its mode to a modified illumination or annular illumination, etc., Steps 401 through 403 in FIG. 36 which obtain the relative coordinate difference S can be executed and Step 407 which corrects measurements taken by the reticle alignment system 319, 320 can be performed; this provides highly accurate reticle alignment method and a highly accurate base line length measurement method.

During these sequences, the "stage emission" technique is not used, and the spatial image sensor only receives illumination light which passed through an aperture in the wafer stage; this makes the configuration of the wafer stage simple and compact.

Note that when a reticle is changed, it is normally sufficient that Steps 401 through 403 in FIG. 36, in which the relative coordinate difference S is obtained, are executed for an arbitrary pair of alignment marks (e.g. the alignment marks 329A, 330A in FIG. 29C). This is because the identical alignment mark on the reticle and the identical aperture 34 1A, 341B on the transparent substrate 340 are used during measurements performed by the spatial image sensor, in FIG. 34, and the reticle alignment system 319, 320; as a result, the marking error does not affect any measurements; and the averaging effect from the multi mark measurement technique provides highly accurate relative coordinate difference S measurements.

Note that when the thickness of the reticle is uneven, i.e., when the reticle 312 is tapered creating uneven thickness, it is sufficient that one measures the relative coordinate difference SA and SD for the two pairs of alignment marks, 329A, 330A and 329D, 330D at both ends of the reticle 312 in FIG. 29C in the scanning direction. Regarding the relative coordinate difference SB, SC of the two groups of alignment mark 329B, 330B and 329C, 330C in the midpoint of scanning direction, they can be obtained by proportionally distributing their relative coordinate differences SA, SD. When correcting the positional deviation in Step 407 in FIG. 36, the alignment marks 329A, 330A through 329D, 330D can be corrected individually using the relative coordinate differences SA through SD. By doing so, even if the reticle 312 is tapered, its positional deviation obtained by the reticle alignment system 319, 320 can be corrected.

As shown in FIG. 32A, when observing the image 335AR of the fiducial mark 335A and the alignment mark 329A under downward illumination in the reticle alignment system 319, the image pick-up signal from the image pick-up device in the reticle alignment system 319 is normally provided with the "auto gain control" (AGC). For this reason, the coefficient of reflection of the film surrounding the fiducial mark 335A is low on the fiducial mark plate 306c; the coefficient of reflection of the alignment mark 329A is high on the reticle 312, and the image pick-up signal IA in FIG. 32B is amplified in an averaged manner. This may affect the detection accuracy of the positional deviation due to saturation which may occur in the portion covering pulse signals 366A through 366E. To prevent this problem, it is preferable that a variable light intensity mechanism is provided in the downward illumination system within the reticle alignment system 319, 320, to control light intensity of illumination light, to prevent saturated signals from the alignment mark on the reticle 312.

In this embodiment, the reticle alignment system 319, 320 have an illumination system independently: however, for example, in FIG. 34, the guide mirrors 315, 316 can be made in a half mirror form such that the illumination optical system for exposing light which comprises the light source system SL through the condenser lens 315, may be conjugated with the downward illumination system for the reticle alignment system 319, 320 as well. In this case, the illumination optical system of exposing light EL can be conjugated and the configuration of the reticle alignment system 319, 320 can be simplified in the following manner. If the reticle alignment system 319, 320 are used, the guide mirrors 315, 316 are arranged in the optical path of the exposing light EL; if the spatial image sensor is used, the guide mirrors 315, 316 are moved away from the optical path of exposing light EL.

In this embodiment, the present invention was applied to a step-and-scan projection exposure apparatus; however, the present invention can be applied to a batch projection exposure apparatus.

The projection exposure apparatus of the present invention can detect the relative position between the alignment mark on a mask and a fiducial mark using a spatial image sensor and using an alignment sensor on the mask side, and can store the two types of positional deviation data as an offset. When aligning the mask, the positional deviation from the fiducial mark detected by the alignment sensor is corrected using the offset. This technique provides highly accurate mask alignment (reticle alignment) without illuminating the first or second fiducial marks on the side of the wafer stage using the "stage emission" technique. This invention also provides a highly accurate mask alignment even when the illumination condition of exposing light is changed, when the mask thickness is changed (or tapered), or when defocusing is generated in the alignment sensor on the mask side. This configuration allows reducing the size and weight of the wafer stage.

The present invention also has an advantage that if light detecting type spatial image sensor, the aperture type fiducial mark, and the image processing type alignment sensor are equipped, the fiducial mark can be used by both the spatial image sensor and the alignment sensor.

The projection exposure apparatus of the present invention can measure the base line length of the alignment sensor on the substrate side highly accurately even when the illumination condition of exposing light is changed. This becomes possible by obtaining the calibration value for the measurements of the mask performed by the alignment sensor using the spatial image sensor in advance.

If exposing light is used for illumination light for the alignment sensor (mask side) and for the spatial image sensor and a move-away mechanism is installed for moving the alignment sensor on the mask side away form the optical path of the exposing light, the same illumination light system of exposing light can be used for both of the sensors, thus simplifying the optical system.

In addition, when adjusting the first or second fiducial mark position according to their coefficients of reflection of the mark via the projection optical system, the alignment sensor on the mask side is used. Then, the positional deviation of the alignment mark on the mask from the first or second fiducial mark on the wafer stage is measured. The present invention provides highly accurate detection of the alignment mark on the mask even if a mask is made of a reticle of low coefficient of reflection.

By forming the second transparent fiducial mark with a plurality of transparent marks, a highly accurate measurement can be obtained for both the mask alignment and base line length because the S/N ratio is improved when the relative scanning takes place, and because the averaging effect can be obtained when image processing is performed.

It will be apparent to those skilled in the art that various modifications and variations can be made in the a method of detecting a focal point in a exposure apparatus of the present invention without departing from the spirit or scope of the invention. Thus, it is intended that the present invention cover the modifications and variations of this invention provided they come within the scope of the appended claims and their equivalents.

What is claimed is:

1. A position detector for use in a projection exposure apparatus to detect a position of a focused image plane at which a focused image of a mask pattern is formed by a radiation flux through a projection optical system having an optical axis, the position detector comprising:

a plurality of reference marks disposed in a first direction with predetermined spacings at a position at which the mask pattern is to be placed, the radiation flux illuminating the plurality of reference marks, and thereafter entering the projection optical system to form images of the plurality of reference marks in the focused image plane, the images being arranged in a second direction substantially perpendicular to the optical axis of the projection optical system, and spacings of the images being determined by the predetermined spacings of the reference marks;

a radiation receiver having a receiving area movable relative to the images of the reference marks to scan the plurality of images successively, the radiation receiver outputting a reception signal indicating the amount of the radiation flux received at the receiving area, the receiving area being smaller than the spacings separating the images of the reference marks adjacent in the second direction and being larger than each of the images of the reference marks in the second direction;

a position detector outputting a position signal indicating the position of the receiving area; and a calculation unit processing the reception signal and the position signal to derive the positions of the images of the reference marks.

2. The position detector according to claim 1, wherein the receiving area is movable in the second direction and a direction substantially parallel to the optical axis of the projection optical system.

3. The position detector according to claim 3, wherein the calculation unit derives the position of the focused image plane in a direction substantially parallel to the optical axis of the projection optical system.

4. The position detector according to claim 1, further including a translation unit to move the receiving area in a direction angularly offset from the second direction toward the optical axis of the projection optical system.

5. The position detector according to claim 4, wherein the calculation unit derives the position of the focused image plane in a direction substantially parallel to the optical axis of the projection optical system.

6. The position detector according to claim 1, further including a translation unit to move the receiving area in the second direction to cause the calculation unit to derive the position of the images of reference marks in a plane substantially perpendicular to the optical axis of the projection optical system.

7. The position detector according to claim 1, wherein each of the reference mark includes a line-and-space pattern in which a plurality of lines are disposed in the first direction with predetermined spacings, and the image of each of the lines formed by the projection optical system extends in a third direction.

8. The position detector according to claim 7, wherein the receiving area has a straight edge extending in the third direction.

9. The position detector according to claim 8, wherein the third direction is substantially perpendicular to the second direction.

10. The position detector according to claim 7, wherein the radiation receiver includes a fiducial plate having an aperture that defines the receiving area, and a photo detector detecting the amount of the radiation flux passing through the aperture, the aperture having a straight edge extending in the third direction.

11. The position detector according to claim 10, wherein the third direction is substantially perpendicular to the second direction.

12. The position detector according to claim 7, wherein each of the plurality of lines is transparent with respect to the exposing radiation.

13. The position detector according to claim 1, wherein the radiation receiver includes a fiducial plate having an aperture that defines the receiving area, and a photo detector detecting the amount of the radiation flux passing through the aperture.

14. A projection exposure apparatus for exposing a pattern on a mask onto a substrate, the projection exposure apparatus comprising:

a movable mask stage for holding the mask;

an illumination optical system directing an exposing radiation flux toward the mask on the movable mask stage to illuminate a plurality of reference marks formed on the mask, the plurality of reference marks being disposed in a first direction with predetermined spacings;

an projection optical system receiving the radiation flux that passes through the reference marks to form images of the plurality of reference marks in a focused image plane of the projection optical system, the images being arranged in a second direction substantially perpendicular to an optical axis of the projection optical system, and spacings of the images being determined by the predetermined spacings of the reference marks;

a movable substrate stage adjacent the focused image plane, the movable substrate stage being movable in a plane substantially perpendicular to the optical axis and in a direction substantially parallel to the optical axis;

a plate fixed to the movable substrate, the plate having an aperture smaller than the spacings separating the images of the reference marks adjacent in the second direction, the aperture being larger than each of the images of the reference marks;

a driving unit moving the movable mask stage and the movable substrate stage relative to each other so that the images of the reference marks are scanned by the aperture;

a photo detector outputting a reception signal indicating the amount of the radiation flux that passes through the aperture;

a position detector outputting a position signal indicating a position of the plate; and a calculation unit processing the reception signal and the position signal to derive the positions of the focused image plane of the projection optical system.

15. The projection exposure apparatus according to claim 14, further including a surface detector outputting a surface position signal indicating the position of a surface of a substrate to be held on the substrate stage in a direction substantially parallel to the optical axis, the surface detector being calibrated in accordance with the derived position of the focused image plane so as to output a predetermined signal when the surface of the substrate is matched with the focused image plane.

16. A method for detecting the position of a focused image plane at which a focused image of a mask pattern on a mask is formed by a radiation flux through a projection optical system in an exposure apparatus, the method comprising the steps of:

directing the radiation flux toward the mask to illuminate a plurality of reference marks formed on the mask, the plurality of reference marks being disposed on the mask in a first direction with predetermined spacings;

guiding the radiation flux that passes through the reference marks to the projection optical system to form images of the plurality of reference marks in the focused image plane, the images being arranged in a second direction substantially perpendicular to an optical axis of the projection optical system, and spacings of the images being determined by the predetermined spacings of the reference marks;

moving a radiation receiving area adjacent the focused image plane relative to the mask to scan the images of the reference marks, the radiation receiving area being smaller than the spacings separating the images of the reference marks adjacent in the second direction and being larger than each of the images of the reference marks;

outputting a reception signal indicating the amount of the radiation flux received at the radiation receiving area;

outputting a position signal indicating a position of the radiation receiving area; and processing the reception signal and the position signal to derive the positions of the images of the reference marks.

17. The method according to claim 16, wherein the step of moving includes the steps of moving the radiation receiving area in the second direction and moving the radiation receiving area in a direction substantially parallel to the optical axis of the projection optical system.

18. The method according to claim 17, wherein the step of processing includes the step of deriving the position of the focused image plane in accordance with the derived positions of the images of the reference marks.

19. The method according to claim 18, further comprising the step of moving a substrate having a photosensitive surface to align the photosensitive surface with the focused image plane.

20. The method according to claim 16, wherein the step of moving includes the steps of moving the radiation receiving area in a direction angularly offset from the second direction toward the optical axis of the projection optical system.

21. The method according to claim 20, wherein the step of processing includes the step of deriving the position of the focused image plane in accordance with the derived positions of the images of the reference marks.

22. The method according to claim 21, further comprising the step of moving a substrate having a photosensitive surface to align the photosensitive surface with the focused image plane.

23. The method according to claim 16, wherein the step of directing includes the step of illuminating the plurality of reference marks each including a line-and-space pattern in which a plurality of lines are disposed in the first direction with predetermined spacings.

24. The method according to claim 23, wherein the image of each of the plurality of lines formed by the projection optical system extends in a third direction, and the receiving area has a straight edge extending in the third direction.

25. The method according to claim 24, wherein the third direction is substantially perpendicular to the second direction.

26. The method according to claim 24, wherein the step of moving includes the step of moving a fiducial plate having an aperture that defines the radiation receiving area, the aperture having a straight edge extending in the third direction, and wherein the step of outputting the reception signal includes the step of the detecting the amount of the radiation flux that passes through the aperture.

27. The method according to claim 26, wherein the third direction is substantially perpendicular to the second direction.

28. The method according to claim 16, wherein the step of moving includes the step of moving a fiducial plate having an aperture that defines the radiation receiving area, and wherein the step of outputting the reception signal includes the step of the detecting the amount of the radiation flux that passes through the aperture.

29. A method for detecting the position of a focused image plane at which a focused image of a mask pattern on a mask is formed by a radiation flux through a projection system in an exposure apparatus, the method comprising the steps of:

forming images of a plurality of reference marks using the radiation flux through the projection system, the images of the plurality of reference remarks being arranged in a predetermined direction;

detecting the reference marks by moving a receiving area adjacent the focused image plane relative to the mask to scan the images of the plurality of reference marks in a predetermined direction, wherein the receiving area is smaller than the spacings between the images of the reference marks adjacent in the predetermined direction, and is larger than each of the images of the reference marks in the predetermined direction.

30. The method according to claim 29, wherein each of the reference marks includes a line-and-space pattern.

31. The method according to claim 29, wherein the detecting step is repeated many times at various positions of the receiving area in the direction of an optical axis of the projection system.

32. The method according to claim 29, wherein the receiving area has a straight edge extending in a direction inclined from the predetermined direction.

33. The method according to claim 29, wherein the detecting step includes the steps of moving the receiving area in the predetermined direction and moving the receiving area in a direction substantially parallel to an optical axis of the projection system.

34. A method for manufacturing a semiconductor device comprising the steps of:

detecting the position of a focused image plane at which a focused image of a mask pattern on a mask is formed by a radiation flux through a projection system in an exposure apparatus using the method of claim 29; and exposing a substrate using the mask pattern through the projection system in the exposure apparatus.

* * * * *